(12) United States Patent
Fukushima et al.

(10) Patent No.: US 8,513,877 B2
(45) Date of Patent: Aug. 20, 2013

(54) ANTHRACENE POLYMER COMPOUND AND LIGHT EMITTING DEVICE USING THE SAME

(75) Inventors: Daisuke Fukushima, Ushiku (JP); Yoshiaki Tsubata, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 795 days.

(21) Appl. No.: 12/600,113

(22) PCT Filed: May 14, 2008

(86) PCT No.: PCT/JP2008/059299
§ 371 (c)(1),
(2), (4) Date: Jan. 22, 2010

(87) PCT Pub. No.: WO2008/143272
PCT Pub. Date: Nov. 27, 2008

(65) Prior Publication Data
US 2010/0156284 A1 Jun. 24, 2010

(30) Foreign Application Priority Data

May 17, 2007 (JP) .................. 2007-131381

(51) Int. Cl.
*H01J 1/62* (2006.01)
*H01J 63/04* (2006.01)
*C09K 11/02* (2006.01)
*H01B 1/00* (2006.01)
*H01B 1/12* (2006.01)
*C08G 73/00* (2006.01)
*C08F 28/06* (2006.01)

(52) U.S. Cl.
USPC ........ 313/504; 252/301.35; 252/500; 257/40; 257/E51.001; 257/E51.027; 427/256; 524/610; 526/257; 526/259; 528/8; 528/422

(58) Field of Classification Search
USPC .............. 252/301.35, 500; 257/40, E51.001, 257/E51.027; 313/504; 427/256; 524/610; 526/257, 259; 528/8, 422
See application file for complete search history.

(56) References Cited

U.S. PATENT DOCUMENTS

2007/0126345 A1 6/2007 Hudack et al.
2007/0205714 A1 9/2007 Busing et al.
2010/0176377 A1* 7/2010 Fukushima et al. ............ 257/40

FOREIGN PATENT DOCUMENTS

WO 2005/049546 A1 6/2005
WO 2005/104264 A1 11/2005
WO 2007/058368 A1 5/2007

OTHER PUBLICATIONS

Database CA [Online] Chemical Abstracts Service, Columbus, OH, May 25, 2007, XP-002581520.

* cited by examiner

*Primary Examiner* — Bijan Ahvazi
(74) *Attorney, Agent, or Firm* — Sughrue Mion, PLLC

(57) ABSTRACT

A polymer compound comprising a constitutional unit of the following formula (1):

$$\left[ \begin{array}{c} (R^X)_P \\ \\ -Ar^1-N \underset{Ar^2}{\overset{}{\mid}} \phantom{xx} N-Ar^1- \\ \phantom{xx} Ar^2 \\ (R^Y)_Q \end{array} \right] \quad (1)$$

(wherein, P represents an integer of 1 to 4, Q represents an integer of 0 to 4. $R^X$ and $R^Y$ represent each independently an alkyl group, alkoxy group, alkylthio group, aryloxy group, arylthio group, arylalkyl group, arylalkoxy group or arylalkylthio group, when there exist a plurality of $R^X$'s, these may be the same or different, and when there exist a plurality of $R^Y$'s, these may be the same or different. $Ar^1$ represents an unsubstituted or substituted arylene group or an unsubstituted or substituted di-valent heterocyclic group, and $Ar^2$ represents an unsubstituted or substituted aryl group or an unsubstituted or substituted mono-valent heterocyclic group. A plurality of $Ar^1$'s and $Ar^2$'s may each be the same or different.).

28 Claims, No Drawings

ANTHRACENE POLYMER COMPOUND AND LIGHT EMITTING DEVICE USING THE SAME

CROSS REFERENCE TO RELATED APPLICATION

This application is a National Stage of International Application No. PCT/JP2008/059299 filed May 14, 2008, claiming priority based on Japanese Patent Application No. 2007-131381, filed May 17, 2007, the contents of all of which are incorporated herein by reference in their entirety.

TECHNICAL FIELD

The present invention relates to an anthracene polymer compound and a light emitting device using the same.

BACKGROUND ART

Light emitting devices, such as an organic electroluminescence device and the like are suitable for applications such as displays and the like because of properties, such as driving at low voltage, high luminance and the like, thus recently paid to attention. Then, for production of this light emitting device, there are used light emitting materials and charge transporting materials.

As the light emitting materials and charge transporting materials, polymer compounds which are dissolved in a solvent and subjected to an application method to form an organic layer are investigated, and as such polymer compounds, suggested are polymer compounds containing a constitutional unit derived from diphenylaminoanthracene having no substituent on the anthracene ring (International Publication WO 2005/49546).

DISCLOSURE OF THE INVENTION

However, when the above-described polymer compounds are used as a green light emitting material, the color purity of its green light emission is not necessarily sufficient.

An object of the present invention is to provide a polymer compound which when used in fabrication of a light emitting device, the color purity of green light emission of the resultant light emitting device is excellent.

In a first aspect, the present invention provides a polymer compound containing a constitutional unit of the following formula (1):

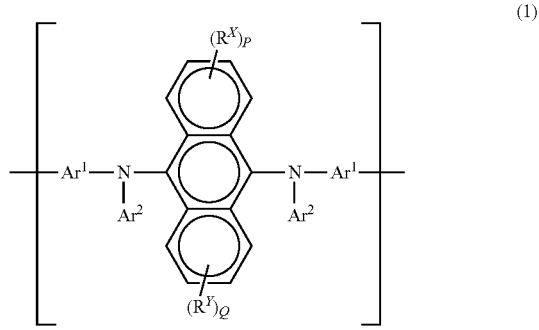

(1)

(wherein, P represents an integer of 1 to 4, Q represents an integer of 0 to 4. $R^X$ and $R^Y$ represent each independently an alkyl group, alkoxy group, alkylthio group, aryloxy group, arylthio group, arylalkyl group, arylalkoxy group or arylalkylthio group, when there exist a plurality of $R^X$'s, these may be the same or different, and when there exist a plurality of $R^Y$'s, these may be the same or different. $Ar^1$ represents an unsubstituted or substituted arylene group or an unsubstituted or substituted di-valent heterocyclic group, and $Ar^2$ represents an unsubstituted or substituted aryl group or an unsubstituted or substituted mono-valent heterocyclic group. A plurality of $Ar^1$'s and $Ar^2$'s may each be the same or different.).

In a second aspect, the present invention provides a composition comprising at least one material selected from the group consisting of hole transporting materials, electron transporting materials and light emitting materials, and the above-described polymer compound.

In a third aspect, the present invention provides a solution comprising the above-described polymer compound, and a solvent.

In a fourth aspect, the present invention provides a thin film comprising the above-described polymer compound.

In a fifth aspect, the present invention provides a light emitting device having electrodes composed of an anode and a cathode, and an organic layer disposed between the electrodes and containing the above-described polymer compound.

MODES FOR CARRYING OUT THE INVENTION

The present invention will be illustrated in detail below.

In the present specification, "constitutional unit" denotes one or more units present in a polymer compound. "n-valent heterocyclic group" (n is 1 or 2) means a group obtained by removing n hydrogen atoms from a heterocyclic compound (preferably, a heterocyclic compound having an aromatic property). "heterocyclic compound" includes organic compounds having a cyclic structure in which elements constituting the ring include not only a carbon atom, but also hetero atoms, such as oxygen, sulfur, nitrogen, phosphorus, boron and the like contained in the ring.

<Polymer Compound>

—Constitutional Unit of the Formula (1)—

The polymer compound of the present invention comprises one or two or more constitutional units of the formula (1).

In the above-described formula (1), $Ar^1$ represents an unsubstituted or substituted arylene group or an unsubstituted or substituted di-valent heterocyclic group, preferably an unsubstituted or substituted arylene group, more preferably an unsubstituted or substituted phenylene group. It is preferable that at least one of a plurality of $Ar^1$'s is an unsubstituted or substituted arylene group.

The above-described arylene group means an atomic group obtained by removing two hydrogen atoms from an aromatic hydrocarbon, and includes those having an independent benzene ring or condensed ring. The above-described arylene group has a carbon number of usually about 6 to 60, preferably 6 to 48, more preferably 6 to 30, further preferably 6 to 18, especially preferably 6 to 10, particularly preferably 6. This carbon number does not include the carbon number of the substituent. Examples of the above-described arylene group include a 1,4-phenylene group, 1,3-phenylene group, 1,2-phenylene group, 1,4-naphthalenediyl group, 1,5-naphthalenediyl group, 2,6-naphthalenediyl group, 1,4-anthracenediyl group, 1,5-anthracenediyl group, 2,6-anthracenediyl group, 9,10-anthracenediyl group, 2,7-phenanthrenediyl group, 1,7-naphthacenediyl group, 2,8-naphthacenediyl group, 2,7-fluorenediyl group and the like, preferably a 1,4-phenylene group, 1,3-phenylene group, 1,2-phenylene group, 1,4-naphthalenediyl group, 2,6-naphthalenediyl group, 1,4-anthranediyl group, 1,5-anthranediyl group, 2,6-anthranediyl group, 9,10-anthranediyl group, more preferably a 1,4-phenylene group, 1,3-phenylene group, 1,2-phenylene group, 1,4-naphthalenediyl group, 2,6-naphthalenediyl group, further preferably a 1,4-phenylene group, 1,3-phenylene group, 1,4-naphthalenediyl group, particularly preferably a 1,4-phenylene group.

The above-described di-valent heterocyclic group has a carbon number of usually about 4 to 60, preferably 4 to 20, more preferably 4 to 9, further preferably 4 to 5. Examples of the above-described di-valent heterocyclic group include a 2,5-thiophenediyl group, N-methyl-2,5-pyrrolediyl group, 2,5-furanediyl group, 2,5-pyridinediyl group, 2,6-pyridinediyl group, 2,4-quinolinediyl group, 2,6-quinolinediyl group, 1,4-isoquinolinediyl group, 1,5-isoquinolinediyl group, 5,8-quinoxalinediyl group and the like, preferably a 2,5-thiophenediyl group, 2,5-pyridinediyl group, 2,6-pyridinediyl group, 2,4-quinolinediyl group, 2,6-quinolinediyl group, 1,4-isoquinolinediyl group, 1,5-isoquinolinediyl group, more preferably a 2,5-pyridinediyl group, 2,6-pyridinediyl group, 1,4-isoquinolinediyl group, further preferably a 2,5-pyridinediyl group, 2,6-pyridinediyl group.

When $Ar^1$ has a substituent, examples thereof include preferably those selected from an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group, nitro group and cyano group, more preferably those selected from an alkyl group, alkoxy group, aryl group, aryloxy group, arylalkyl group, arylalkoxy group, substituted amino group, substituted silyl group, acyl group, substituted carboxyl group and cyano group, further preferably those selected from an alkyl group, alkoxy group, aryl group, aryloxy group, arylalkyl group, arylalkoxy group and substituted carboxyl group, especially preferably those selected from an alkyl group, alkoxy group and aryl group, and particularly preferably an alkyl group.

The above-described alkyl group may be any of linear, branched or cyclic and has a carbon number of usually about 1 to 20, preferably 1 to 15, more preferably 1 to 10. Examples of the above-described alkyl group include unsubstituted alkyl groups such as a methyl group, ethyl group, propyl group, i-propyl group, butyl group, i-butyl group, t-butyl group, pentyl group, isoamyl group, hexyl group, cyclohexyl group, heptyl group, octyl group, 2-ethylhexyl group, nonyl group, decyl group, 3,7-dimethyloctyl group, lauryl group and the like; substituted alkyl groups such as a trifluoromethyl group, pentafluoroethyl group, perfluorobutyl group, perfluorohexyl group, perfluorooctyl group and the like, and preferable from the standpoint of a balance between the solubility of the resultant polymer compound in an organic solvent and heat resistance thereof, and the like are a methyl group, ethyl group, propyl group, i-propyl group, butyl group, i-butyl group, t-butyl group, pentyl group, isoamyl group, hexyl group, octyl group, 2-ethylhexyl group, decyl group, 3,7-dimethyloctyl group.

The above-described alkoxy group may be any of linear, branched or cyclic and has a carbon number of usually about 1 to 20, preferably 1 to 15. Examples of the above-described alkoxy group include a methoxy group, ethoxy group, propyloxy group, i-propyloxy group, butoxy group, i-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group, trifluoromethoxy group, pentafluoroethoxy group, perfluorobutoxy group, perfluorohexyl group, perfluorooctyl group, methoxymethyloxy group, 2-methoxyethyloxy group, 2-ethoxyethyloxy group and the like, and preferable from the standpoint of a balance between the solubility of the resultant polymer compound in an organic solvent and heat resistance thereof, and the like are a butyloxy group, pentyloxy group, hexyloxy group, octyloxy group, 2-ethylhexyloxy group, decyloxy group, 3,7-dimethyloctyloxy group.

The above-described alkylthio group may be any of linear, branched or cyclic and has a carbon number of usually about 1 to 20, preferably 3 to 20. Examples of the above-described alkylthio group include a methylthio group, ethylthio group, propylthio group, i-propylthio group, butylthio group, i-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group, trifluoromethylthio group and the like, and preferable from the standpoint of a balance between the solubility of the resultant polymer compound in an organic solvent and heat resistance thereof, and the like are a pentylthio group, hexylthio group, octylthio group, 2-ethylhexylthio group, decylthio group, 3,7-dimethyloctylthio group.

The above-described aryl group is an atomic group obtained by removing one hydrogen atom from an aromatic hydrocarbon, and includes those having a condensed ring, and those having two or more independent benzene rings or condensed rings connected directly or via a group such as vinylene and the like. The above-described aryl group has a carbon number of usually about 6 to 60, preferably 6 to 48, more preferably 6 to 20, further preferably 6 to 10. This carbon number does not include the carbon number of the substituent. Examples of the above-described aryl group include a phenyl group, 1-naphthyl group, 2-naphthyl group, 1-anthracenyl group, 2-anthracenyl group, 9-anthracenyl group, 1-tetracenyl group, 2-tetracenyl group, 5-tetracenyl group, 1-pyrenyl group, 2-pyrenyl group, 4-pyrenyl group, 2-perylenyl group, 3-perylenyl group, 2-fluorenyl group, 3-fluorenyl group, 4-fluorenyl group, 1-biphenylenyl group, 2-biphenylenyl group, 2-phenanthryl group, 9-phenanthryl group, 6-chrysenyl group, 1-coronenyl group, 2-phenylphenyl group, 3-phenylphenyl group, 4-phenylphenyl group, 4-(anthran-9-yl)phenyl group, [1,1']binaphthalen-4-yl group, 10-phenylanthracen-9-yl group, [9,9']bianthracen-10-yl group and the like, and these may be further substituted by an alkyl group, alkoxy group, alkyloxycarbonyl group, acyl group, N,N-dialkylamino group, N,N-diarylamino group, cyano group, nitro group, chlorine atom, fluorine atom and the like.

The above-described aryloxy group has a carbon number of usually about 6 to 60, preferably 7 to 48. Examples of the above-described aryloxy group include a phenoxy group, $C_1$ to $C_{12}$ alkoxyphenoxy groups ("$C_1$ to $C_{12}$ alkoxy" means that the carbon number of the alkoxy portion is 1 to 12, being applicable also in the following descriptions), $C_1$ to $C_{12}$ alkylphenoxy groups ("$C_1$ to $C_{12}$ alkyl" means that the carbon number of the alkyl portion is 1 to 12, being applicable also in the following descriptions), 1-naphthyloxy group, 2-naphthyloxy group, pentafluorophenyloxy group and the like, and preferable from the standpoint of a balance between the solubility of the resultant polymer compound in an organic solvent and heat resistance thereof, and the like are $C_1$ to $C_{12}$ alkoxyphenoxy groups, $C_1$ to $C_{12}$ alkylphenoxy groups. Examples of the above-described $C_1$ to $C_{12}$ alkoxyphenoxy group include a methoxyphenoxy group, ethoxyphenoxy group, propyloxyphenoxy group, i-propyloxyphenoxy group, butoxyphenoxy group, i-butoxyphenoxy group, t-butoxyphenoxy group, pentyloxyphenoxy group, hexyloxyphenoxy group, cyclohexyloxyphenoxy group, heptyloxyphenoxy group, octyloxyphenoxy group, 2-ethylhexyloxyphenoxy group, nonyloxyphenoxy group, decyloxyphenoxy group, 3,7-dimethyloctyloxyphenoxy group, lauryloxyphenoxy group and the like. Examples of the above-described $C_1$ to $C_{12}$ alkylphenoxy group include a methylphenoxy group, ethylphenoxy group, dimethylphenoxy group, propylphenoxy group, 1,3,5-trimethylphenoxy group, methylethylphenoxy group, i-propylphenoxy group, butylphenoxy group, i-butylphenoxy group, t-butylphenoxy group, pentylphenoxy group, isoamylphenoxy group, hexylphenoxy group, heptylphenoxy group, octylphenoxy group, nonylphenoxy group, decylphenoxy group, laurylphenoxy group and the like.

The above-described arylthio group has a carbon number of usually about 3 to 60. Examples of the above-described arylthio group include a phenylthio group, $C_1$ to $C_{12}$ alkoxyphenylthio groups, $C_1$ to $C_{12}$ alkylphenylthio groups, 1-naphthylthio group, 2-naphthylthio group, pentafluorophenylthio group and the like, and preferable from the standpoint of a balance between the solubility of the resultant polymer compound in an organic solvent and heat resistance thereof, and the like are $C_1$ to $C_{12}$ alkoxyphenylthio groups, $C_1$ to $C_{12}$ alkylphenylthio groups.

The above-described arylalkyl group has a carbon number of usually about 7 to 60, preferably 7 to 48. Examples of the above-described arylalkyl group include phenyl $C_1$ to $C_{12}$ alkyl groups, $C_1$ to $C_{12}$ alkoxyphenyl $C_1$ to $C_{12}$ alkyl groups, $C_1$ to $C_{12}$ alkylphenyl $C_1$ to $C_{12}$ alkyl groups, 1-naphthyl $C_1$ to $C_{12}$ alkyl groups, 2-naphthyl $C_1$ to $C_{12}$ alkyl groups and the like, and mentioned from the standpoint of a balance between the solubility of the resultant polymer compound in an organic solvent and heat resistance thereof, and the like are $C_1$ to $C_{12}$ alkoxyphenyl $C_1$ to $C_{12}$ alkyl groups, $C_1$ to $C_{12}$ alkylphenyl $C_1$ to $C_{12}$ alkyl groups.

The above-described arylalkoxy group has a carbon number of usually about 7 to 60, preferably 7 to 48. Examples of the above-described arylalkoxy group include phenyl $C_1$ to $C_{12}$ alkoxy groups such as a phenylmethoxy group, phenylethoxy group, phenylbutoxy group, phenylpentyloxy group, phenylhexyloxy group, phenylheptyloxy group, phenyloctyloxy group and the like, $C_1$ to $C_{12}$ alkoxyphenyl $C_1$ to $C_{12}$ alkoxy groups, $C_1$ to $C_{12}$ alkylphenyl $C_1$ to $C_{12}$ alkoxy groups, 1-naphthyl $C_1$ to $C_{12}$ alkoxy groups, 2-naphthyl $C_1$ to $C_{12}$ alkoxy groups and the like, and mentioned from the standpoint of a balance between the solubility of the resultant polymer compound in an organic solvent and heat resistance thereof, and the like are $C_1$ to $C_{12}$ alkoxyphenyl $C_1$ to $C_{12}$ alkoxy groups, $C_1$ to $C_{12}$ alkylphenyl $C_1$ to $C_{12}$ alkoxy groups.

The above-described arylalkylthio group has a carbon number of usually about 7 to 60, preferably 7 to 48. Examples of the above-described arylalkylthio group include phenyl $C_1$ to $C_{12}$ alkylthio groups, $C_1$ to $C_{12}$ alkoxyphenyl $C_1$ to $C_{12}$ alkylthio groups, $C_1$ to $C_{12}$ alkylphenyl $C_1$ to $C_{12}$ alkylthio groups, 1-naphthyl $C_1$ to $C_{12}$ alkylthio groups, 2-naphthyl $C_1$ to $C_{12}$ alkylthio groups and the like, and mentioned from the standpoint of a balance between the solubility of the resultant polymer compound in an organic solvent and heat resistance thereof, and the like are $C_1$ to $C_{12}$ alkoxyphenyl $C_1$ to $C_{12}$ alkylthio groups, $C_1$ to $C_{12}$ alkylphenyl $C_1$ to $C_{12}$ alkylthio groups.

The above-described arylalkenyl group has a carbon number of usually about 8 to 60. Examples of the above-described arylalkenyl group include phenyl $C_2$ to $C_{12}$ alkenyl groups ("$C_2$ to $C_{12}$ alkenyl" means that the carbon number of the alkenyl portion is 2 to 12, being applicable also in the following descriptions), $C_1$ to $C_{12}$ alkoxyphenyl $C_2$ to $C_{12}$ alkenyl groups, $C_1$ to $C_{12}$ alkylphenyl $C_2$ to $C_{12}$ alkenyl groups, 1-naphthyl-$C_2$ to $C_{12}$ alkenyl groups, 2-naphthyl $C_2$ to $C_{12}$ alkenyl groups and the like, and preferable from the standpoint of a balance between the solubility of the resultant polymer compound in an organic solvent and heat resistance thereof, and the like are $C_1$ to $C_{12}$ alkoxyphenyl $C_2$ to $C_{12}$ alkenyl groups, $C_2$ to $C_{12}$ alkylphenyl $C_1$ to $C_{12}$ alkenyl groups.

The above-described arylalkynyl group has a carbon number of usually about 8 to 60. Examples of the above-described arylalkynyl group include phenyl $C_2$ to $C_{12}$ alkynyl groups ("$C_2$ to $C_{12}$ alkynyl" means that the carbon number of the alkynyl portion is 2 to 12, being applicable also in the following descriptions), $C_1$ to $C_{12}$ alkoxyphenyl $C_2$ to $C_{12}$ alkynyl groups, $C_1$ to $C_{12}$ alkylphenyl $C_2$ to $C_{12}$ alkynyl groups, 1-naphthyl $C_2$ to $C_{12}$ alkynyl groups, 2-naphthyl $C_2$ to $C_{12}$ alkynyl groups and the like, and preferable from the standpoint of a balance between the solubility of the resultant polymer compound in an organic solvent and heat resistance thereof, and the like are $C_1$ to $C_{12}$ alkoxyphenyl $C_2$ to $C_{12}$ alkynyl groups, $C_1$ to $C_{12}$ alkylphenyl $C_2$ to $C_{12}$ alkynyl groups.

The above-described substituted amino group includes amino groups obtained by substitution with one or two groups selected from alkyl groups, aryl groups, arylalkyl groups or mono-valent heterocyclic groups, and the definitions and examples of the alkyl group, aryl group, arylalkyl group or mono-valent heterocyclic group are the same as the definitions and examples explained in the section of a substituent when $Ar^1$ in the above-described formula (1) has a substituent (those for the mono-valent heterocyclic group are described later). The above-described substituted amino group has a carbon number of usually about 1 to 200, preferably 2 to 150, more preferably 2 to 100, further preferably 12 to 72. This carbon number does not include the carbon number of the substituent. Examples of the above-described substituted amino group include a methylamino group, dimethylamino group, ethylamino group, diethylamino group, propylamino group, dipropylamino group, i-propylamino group, diisopropylamino group, dibutylamino group, di-i-butylamino group, di-t-butylamino group, dipentylamino group, dihexylamino group, dicyclohexylamino group, dioctylamino group, di-2-ethylhexylamino group, didecylamino group, di-3,7-dimethyloctylamino group, dipyrrolidylamino group, dipiperidylamino group, ditrifluoromethylamino group, phenylamino group, diphenylamino group, di-1-naphthylamino group, di-2-naphthylamino group, N-9-anthracenyl-9-anthraceneamine group, di-1-pyrenylamino group, dipyridylamino group, dipyridazinylamino group, dipyrimidylamino group, dipyrazylamino group, di(triazyl)amino group, di-4-phenylphenyl group and the like, and these may be further substituted by an alkyl group, alkoxy group, aryl group, alkyloxycarbonyl group, acyl group, N,N-dialkylamino group, N,N-diarylamino group, cyano group, nitro group, chlorine atom, fluorine atom and the like.

The above-described substituted silyl group includes silyl groups obtained by substitution with one, two or three groups selected from alkyl groups, aryl groups, arylalkyl groups and mono-valent heterocyclic groups. The above-described substituted silyl group has a carbon number of usually about 1 to 60, preferably 3 to 48. The alkyl group, aryl group, arylalkyl group or mono-valent heterocyclic group may have a substituent. Examples of the above-described substituted silyl group include a trimethylsilyl group, triethylsilyl group, tripropylsilyl group, tri-i-propylsilyl group, dimethyl-i-propylisilyl group, diethyl-i-propylsilyl group, t-butyldimethylsilyl group, pentyldimethylsilyl group, hexyldimethylsilyl group, heptyldimethylsilyl group, octyldimethylsilyl group, 2-ethylhexyldimethylsilyl group, nonyldimethylsilyl group, decyldimethylsilyl group, 3,7-dimethyloctyldimethylsilyl group, lauryldimethylsilyl group, phenyl $C_1$ to $C_{12}$ alkylsilyl groups, $C_1$ to $C_{12}$ alkoxyphenyl $C_1$ to $C_{12}$ alkylsilyl groups, $C_1$ to $C_{12}$ alkylphenyl $C_1$ to $C_{12}$ alkylsilyl groups, 1-naphthyl $C_1$ to $C_{12}$ alkylsilyl groups, 2-naphthyl $C_1$ to $C_{12}$ alkylsilyl groups, phenyl $C_1$ to $C_{12}$ alkyldimethylsilyl groups, triphenylsilyl group, tri-p-xylylsilyl group, tribenzylsilyl group, diphenylmethylsilyl group, t-butyldiphenylsilyl group, dimethylphenylsilyl group and the like.

Examples of the above-described halogen atom include a fluorine atom, chlorine atom, bromine atom, iodine atom.

The above-described acyl group has a carbon number of usually about 2 to 20, preferably 2 to 18. Examples of the above-described acyl group include an acetyl group, propionyl group, butylyl group, isobutylyl group, pivaloyl group, benzoyl group, trifluoroacetyl group, pentafluorobenzoyl group and the like.

The above-described acyloxy group has a carbon number of usually about 2 to 20, preferably 2 to 18. Examples of the above-described acyloxy group include an acetoxy group, propionyloxy group, butylyloxy group, isobutylyloxy group, pivaloyloxy group, benzoyloxy group, trifluoroacetyloxy group, pentafluorobenzoyloxy group and the like.

The above-described imine residue has a carbon number of about 2 to 20, preferably 2 to 18. Examples of the above-described imine residue include groups of the following structural formulae and the like.

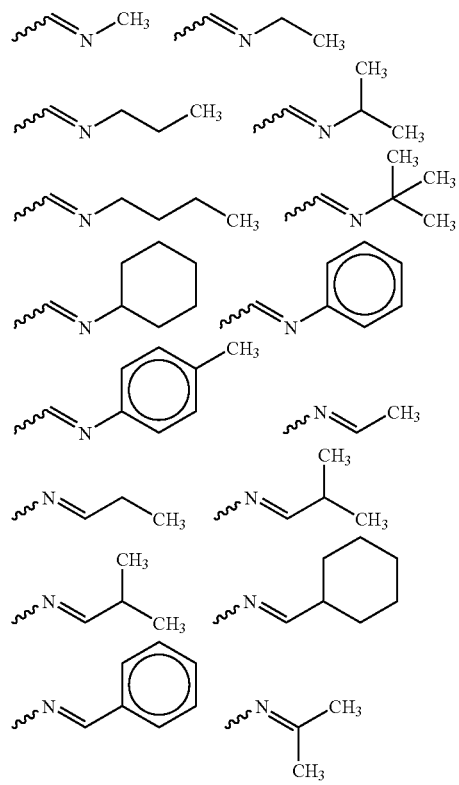

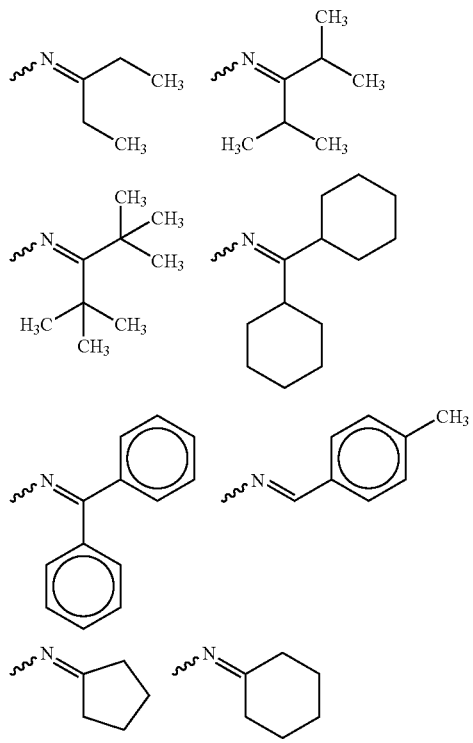

(in the formulae, the wavy line represents a free bond, and means a possibility of a geometric isomer such as a cis body, trans body or the like depending on the kind of the imine residue.).

The above-described amide group has a carbon number of usually about 2 to 20, preferably 2 to 18. Examples of the above-described amide group include a formamide group, acetamide group, propioamide group, butyroamide group, benzamide group, trifluoroacetamide group, pentafluorobenzamide group, diformamide group, diacetamide group, dipropioamide group, dibutyroamide group, dibenzamide group, ditrifluoroacetamide group, dipentafluorobenzamide group, and the like.

The above-described acid imide group means a residue obtained by removing from an acid imide a hydrogen atom connected to its nitrogen atom, and has a carbon number of about 4 to 20, examples thereof, for example, include groups shown below.

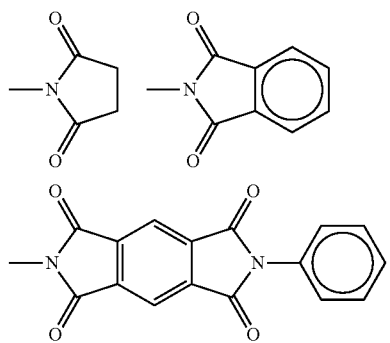

-continued

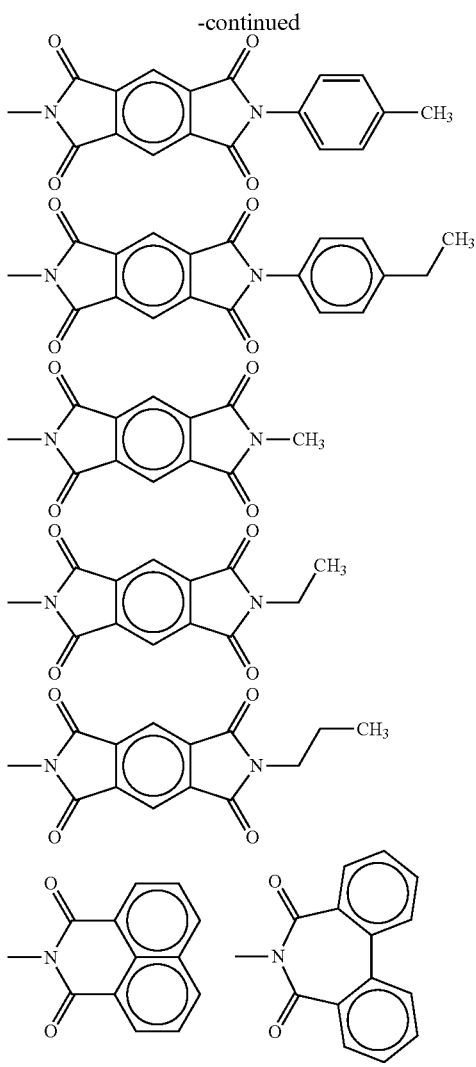

The above-described mono-valent heterocyclic group has a carbon number of usually about 4 to 60, preferably 4 to 20. The carbon number of the mono-valent heterocyclic group does not include the carbon number of the substituent. Examples of the above-described mono-valent heterocyclic group include a thienyl group, pyrrolyl group, furyl group, pyridyl group, piperidyl group, quinolyl group, isoquinolyl group, pyrimidyl group, triazinyl group and the like, and preferable are a thienyl group, pyridyl group, quinolyl group, isoquinolyl group, pyrimidyl group, triazinyl group, more preferable are a thienyl group, pyridyl group, pyrimidyl group, triazinyl group. The above-described mono-valent heterocyclic group may further has a substituent such as an alkyl group, alkoxy group and the like.

The above-described substituted carboxyl group includes carboxyl groups substituted with an alkyl group, aryl group, arylalkyl group or mono-valent heterocyclic group, and the carbon number thereof is usually about 2 to 60, preferably 2 to 48. Examples of the above-described substituted carboxyl group include a methoxycarbonyl group, ethoxycarbonyl group, propoxycarbonyl group, i-propoxycarbonyl group, butoxycarbonyl group, i-butoxycarbonyl group, t-butoxycarbonyl group, pentyloxycarbonyl group, hexyloxycarbonyl group, cyclohexyloxycarbonyl group, heptyloxycarbonyl group, octyloxycarbonyl group, 2-ethylhexyloxycarbonyl group, nonyloxycarbonyl group, decyloxycarbonyl group, 3,7-dimethyloctyloxycarbonyl group, lauryloxycarbonyl group, trifluoromethoxycarbonyl group, pentafluoroethoxycarbonyl group, perfluorobutoxycarbonyl group, perfluorohexyloxycarbonyl group, perfluorooctyloxycarbonyl group, phenoxycarbonyl group, naphthoxycarbonyl group, pyridyloxycarbonyl group, and the like. The alkyl group, aryl group, arylalkyl group or mono-valent heterocyclic group may have a substituent. The carbon number of the substituted carboxyl group does not include the carbon number of the substituent.

In the above-described formula (1), $Ar^2$ represents an unsubstituted or substituted aryl group or an unsubstituted or substituted mono-valent heterocyclic group, and preferably an unsubstituted or substituted aryl group. It is preferable that at least one of a plurality of $Ar^2$'s is an unsubstituted or substituted aryl group.

The above-described aryl group means an atomic group obtained by removing one hydrogen atom from an aromatic hydrocarbon, and includes those having a condensed ring, and those having two or more independent benzene rings or condensed rings connected directly or via a group such as vinylene and the like. The above-described aryl group has a carbon number of usually about 6 to 60, preferably 6 to 48, more preferably 6 to 30, further preferably 6 to 18, especially preferably 6 to 10, particularly preferably 6. This carbon number does not include the carbon number of the substituent. Examples of the above-described aryl group include a phenyl group, 1-naphthyl group, 2-naphthyl group, 1-anthracenyl group, 2-anthracenyl group, 9-anthracenyl group, 1-phenanthryl group, 9-phenanthryl group, 1-naphthacenyl group, 5-naphthacenyl group, 1-pyrenyl group, 3-perylenyl group, 2-fluorenyl group and the like, preferably a phenyl group, 1-naphthyl group, 2-naphthyl group, 1-anthracenyl group, 2-anthracenyl group, 9-anthracenyl group, 2-fluorenyl group, more preferably a phenyl group, 1-naphthyl group, 2-naphthyl group, further preferably a phenyl group.

The above-described mono-valent heterocyclic group has a carbon number of usually about 4 to 60, preferably 4 to 20, more preferably 4 to 9, further preferably 4 to 5. The carbon number of the mono-valent heterocyclic group does not include the carbon number of the substituent. Examples of the above-described mono-valent heterocyclic group include a 2-thienyl group, 3-thienyl group, 2-pyrrolyl group, 3-pyrrolyl group, N-methyl-2-pyrrolyl group, 2-furyl group, 3-furyl group, 2-pyridyl group, 3-pyridyl group, 4-pyridyl group, 2-quinolyl group, 4-quinolyl group, 5-quinolyl group, 1-isoquinolyl group, 3-isoquinolyl group, 6-isoquinolyl group, 5-quinoxalyl group and the like, preferably a 2-thienyl group, 3-thienyl group, 2-pyridyl group, 3-pyridyl group, 4-pyridyl group, 2-quinolyl group, 4-quinolyl group, 5-quinolyl group, 1-isoquinolyl group, 3-isoquinolyl group, 6-isoquinolyl group, more preferably a 2-thienyl group, 3-thienyl group, 2-pyridyl group, 3-pyridyl group, 4-pyridyl group, further preferably a 2-pyridyl group, 3-pyridyl group, 4-pyridyl group.

When $Ar^2$ has a substituent, examples thereof include preferably those selected from an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group, nitro group and cyano group, more preferably those selected from an alkyl group, alkoxy group, aryl group, aryloxy group, arylalkyl group, arylalkoxy group, substituted amino group, substituted silyl group, acyl group, substituted carboxyl group and cyano group, further preferably those selected from an alkyl group, alkoxy group, aryl group, aryloxy group, arylalkyl group, arylalkoxy group and substituted carboxyl group, especially preferably those selected from an alkyl group, alkoxy group, aryl group, particularly preferably an alkyl group. The definitions and examples of the above-described alkyl group, alkoxy group, alkylthio group, aryl group, aryloxy group, arylthio group, arylalkyl group, arylalkoxy group, arylalkylthio group, arylalkenyl group, arylalkynyl group, substituted amino group, substituted silyl group, halogen atom, acyl group, acyloxy group, imine residue, amide group, acid imide group, mono-valent heterocyclic group and substituted carboxyl group are the same as the definitions and examples explained in the section of a substituent when the above-described $Ar^1$ has a substituent.

In the above-described formula (1), $R^X$ and $R^Y$ represent each independently an alkyl group, alkoxy group, alkylthio group, aryloxy group, arylthio group, arylalkyl group, arylalkoxy group or arylalkylthio group. From the standpoint of a balance between easiness of synthesis of the resultant polymer compound and the color purity of green light emission obtained when the polymer compound is used in a light emitting device, and the like, $R^X$ and $R^Y$ represent preferably an alkyl group, alkoxy group, aryloxy group, arylalkyl group or arylalkoxy group, more preferably an alkyl group, alkoxy group, arylalkyl group or arylalkoxy group, further preferably an alkyl group or arylalkyl group, particularly preferably an alkyl group. It is preferable that both $R^X$ and $R^Y$ represent an alkyl group.

When there exist a plurality of $R^X$'s and $R^Y$'s, these $R^X$'s and $R^Y$'s may be the same or different.

The above-described alkyl group may be any of linear, branched or cyclic and has a carbon number of usually about 1 to 20, preferably 1 to 15, more preferably 1 to 10. Examples of the above-described alkyl group include a methyl group, ethyl group, propyl group, i-propyl group, butyl group, i-butyl group, sec-butyl group, t-butyl group, pentyl group, isoamyl group, 1,1-dimethylpropyl group, hexyl group, cyclohexyl group, heptyl group, octyl group, 2-ethylhexyl group, nonyl group, decyl group, 3,7-dimethyloctyl group, lauryl group, 1-adamantyl group, 2-adamantyl group and the like. From the standpoint of easiness of synthesis of the resultant polymer compound and the like, preferable are a methyl group, i-propyl group, i-butyl group, sec-butyl group, t-butyl group, 1,1-dimethylpropyl group, cyclohexyl group, 1-adamantyl group, 2-adamantyl group, more preferable are a methyl group, t-butyl group, 1,1-dimethylpropyl group, 1-adamantyl group, further preferable are a methyl group, t-butyl group, particularly preferable is a t-butyl group. From the standpoint of the solubility of the resultant polymer compound in an organic solvent, preferable are a butyl group, i-butyl group, sec-butyl group, pentyl group, isoamyl group, 1,1-dimethylpropyl group, hexyl group, heptyl group, octyl group, 2-ethylhexyl group, nonyl group, decyl group, 3,7-dimethyloctyl group, lauryl group, more preferable are a butyl group, pentyl group, isoamyl group, hexyl group, heptyl group, octyl group, 2-ethylhexyl group, nonyl group, decyl group, 3,7-dimethyloctyl group, lauryl group, further preferable are a hexyl group, heptyl group, octyl group, 2-ethylhexyl group, nonyl group, decyl group, 3,7-dimethyloctyl group, lauryl group.

The above-described alkoxy group may be any of linear, branched or cyclic and has a carbon number of usually about 1 to 20, preferably 1 to 15. The above-described alkoxy group include a methoxy group, ethoxy group, propyloxy group, i-propyloxy group, butoxy group, i-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group, methoxymethyloxy group, 2-methoxyethyloxy group, 2-ethoxyethyloxy group and the like, and from the standpoint of easiness of synthesis of the resultant polymer compound and the like, preferable are a methoxy group, ethoxy group, propyloxy group, butoxy group, pentyloxy group, hexyloxy group, heptyloxy group, octyloxy group, 2-ethylhexyloxy group, nonyloxy group, decyloxy group, 3,7-dimethyloctyloxy group, lauryloxy group, methoxymethyloxy group, 2-methoxyethyloxy group, 2-ethoxyethyloxy group, more preferably are a methoxy group, ethoxy group, propyloxy group, butoxy group, pentyloxy group, hexyloxy group, heptyloxy group, octyloxy group, 2-ethylhexyloxy group.

The above-described alkylthio group may be any of linear, branched or cyclic and has a carbon number of usually about 1 to 20, preferably 3 to 20. Examples of the above-described alkylthio group include a methylthio group, ethylthio group, propylthio group, i-propylthio group, butylthio group, i-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group and the like, and preferable from the standpoint of a balance between the solubility of the resultant polymer compound in an organic solvent and heat resistance thereof, and the like are a pentylthio group, hexylthio group, octylthio group, 2-ethylhexylthio group, decylthio group, 3,7-dimethyloctylthio group.

The above-described aryloxy group has a carbon number of usually about 6 to 60, preferably 7 to 48. Examples of the above-described aryloxy group include a phenoxy group, $C_1$ to $C_{12}$ alkoxyphenoxy groups ("$C_1$ to $C_{12}$ alkoxy" means that the carbon number of the alkoxy portion is 1 to 12, being applicable also in the following descriptions), $C_1$ to $C_{12}$ alkylphenoxy groups ("$C_1$ to $C_{12}$ alkyl" means that the carbon number of the alkyl portion is 1 to 12, being applicable also in the following descriptions), 1-naphthyloxy group, 2-naphthyloxy group and the like, and preferable from the standpoint of a balance between the solubility of the resultant polymer compound in an organic solvent and heat resistance thereof, and the like are $C_1$ to $C_{12}$ alkoxyphenoxy groups, $C_1$ to $C_{12}$ alkylphenoxy groups. Examples of the above-described $C_1$ to $C_{12}$ alkoxyphenoxy group include a methoxyphenoxy group, ethoxyphenoxy group, propyloxyphenoxy group, i-propyloxyphenoxy group, butoxyphenoxy group, i-butoxyphenoxy group, t-butoxyphenoxy group, pentyloxyphenoxy group, hexyloxyphenoxy group, cyclohexyloxyphenoxy group, heptyloxyphenoxy group, octyloxyphenoxy group, 2-ethylhexyloxyphenoxy group, nonyloxyphenoxy group, decyloxyphenoxy group, 3,7-dimethyloctyloxyphenoxy group, lauryloxyphenoxy group and the like. Examples of the above-described $C_1$ to $C_{12}$ alkylphenoxy group include a methylphenoxy group, ethylphenoxy group, dimethylphenoxy group, propylphenoxy group, 1,3,5-trimethylphenoxy group, methylethylphenoxy group, i-propylphenoxy group, butylphenoxy group, i-butylphenoxy group, t-butylphenoxy group, pentylphenoxy group, isoamylphenoxy group, hexylphenoxy group, heptylphenoxy group, octylphenoxy group, nonylphenoxy group, decylphenoxy group, laurylphenoxy group and the like.

The above-described arylthio group has a carbon number of usually about 3 to 60. The above-described arylthio group includes a phenylthio group, $C_1$ to $C_{12}$ alkoxyphenylthio groups, $C_1$ to $C_{12}$ alkylphenylthio groups, 1-naphthylthio group, 2-naphthylthio group, pentafluorophenylthio group and the like, and preferable from the standpoint of a balance between the solubility of the resultant polymer compound in an organic solvent and heat resistance thereof, and the like are $C_1$ to $C_{12}$ alkoxyphenylthio groups, $C_1$ to $C_{12}$ alkylphenylthio groups.

The above-described arylalkyl group has a carbon number of usually about 7 to 60, preferably 7 to 48. The above-described arylalkyl group includes phenyl $C_1$ to $C_{12}$ alkyl groups, $C_1$ to $C_{12}$ alkoxyphenyl $C_1$ to $C_{12}$ alkyl groups, $C_1$ to $C_{12}$ alkylphenyl $C_1$ to $C_{12}$ alkyl groups, 1-naphthyl $C_1$ to $C_{12}$ alkyl groups, 2-naphthyl $C_1$ to $C_{12}$ alkyl groups and the like, and mentioned from the standpoint of a balance between the solubility of the resultant polymer compound in an organic solvent and heat resistance thereof, and the like are $C_1$ to $C_{12}$ alkoxyphenyl $C_1$ to $C_{12}$ alkyl groups, $C_1$ to $C_{12}$ alkylphenyl $C_1$ to $C_{12}$ alkyl groups.

The above-described arylalkoxy group has a carbon number of usually about 7 to 60, preferably 7 to 48. The above-described arylalkoxy group includes phenyl $C_1$ to $C_{12}$ alkoxy groups such as a phenylmethoxy group, phenylethoxy group, phenylbutoxy group, phenylpentyloxy group, phenylhexyloxy group, phenylheptyloxy group, phenyloctyloxy group and the like, $C_1$ to $C_{12}$ alkoxyphenyl $C_1$ to $C_{12}$ alkoxy groups, $C_1$ to $C_{12}$ alkylphenyl $C_1$ to $C_{12}$ alkoxy groups, 1-naphthyl $C_1$ to $C_{12}$ alkoxy groups, 2-naphthyl $C_1$ to $C_{12}$ alkoxy groups and the like, and mentioned from the standpoint of a balance between the solubility of the resultant polymer compound in an organic solvent and heat resistance thereof, and the like are $C_1$ to $C_{12}$ alkoxyphenyl $C_1$ to $C_{12}$ alkoxy groups, $C_1$ to $C_{12}$ alkylphenyl $C_1$ to $C_{12}$ alkoxy groups.

The above-described arylalkylthio group has a carbon number of usually about 7 to 60, preferably 7 to 48. The above-described arylalkylthio group includes phenyl $C_1$ to $C_{12}$ alkylthio groups, $C_1$ to $C_{12}$ alkoxyphenyl $C_1$ to $C_{12}$ alkylthio groups, $C_1$ to $C_{12}$ alkylphenyl $C_1$ to $C_{12}$ alkylthio groups, 1-naphthyl $C_1$ to $C_{12}$ alkylthio groups, 2-naphthyl $C_1$ to $C_{12}$ alkylthio groups and the like, and mentioned from the standpoint of a balance between the solubility of the resultant polymer compound in an organic solvent and heat resistance thereof, and the like are $C_1$ to $C_{12}$ alkoxyphenyl $C_1$ to $C_{12}$ alkylthio groups, $C_1$ to $C_{12}$ alkylphenyl $C_1$ to $C_{12}$ alkylthio groups.

In the above-described formula (1), P represents an integer of 1 to 4, and from the standpoint of easiness of synthesis of the resultant polymer compound and the like, P represents preferably 1 or 2, more preferably 1.

In the above-described formula (1), Q represents an integer of 0 to 4, and from the standpoint of easiness of synthesis of the resultant polymer compound and the like, Q represents preferably an integer of 0 to 2, more preferably 0 or 1, further preferably 1.

In the above-described formula (1), it is preferable that P is 1 and Q is 0 or 1, and it is more preferable that P is 1 and Q is 1.

Examples of the above-described constitutional unit of the formula (1) include constitutional units of the following formulae (A-1) to (A-6), (B-1) to (B-6), (C-1) to (C-7), and constitutional units of the following formulae (A-1) to (A-6), (B-1) to (B-6), (C-1) to (C-7) in which $Ar^1$ and/or $Ar^2$ has a substituent such as an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group, nitro group, cyano group or the like.

Here, the definitions and examples of $Ar^1$, $Ar^2$, $R^X$ and $R^Y$ are as described above.

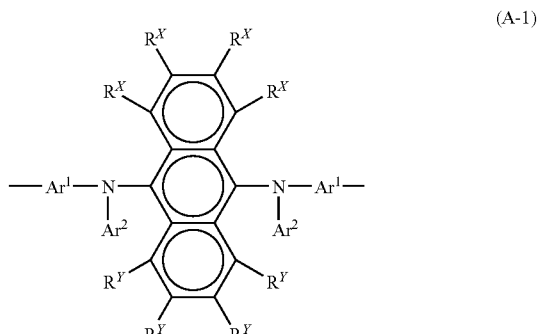

(A-1)

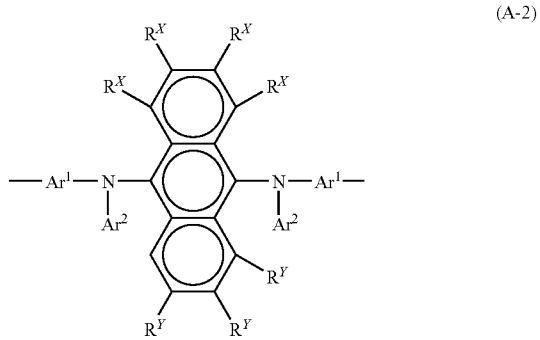

(A-2)

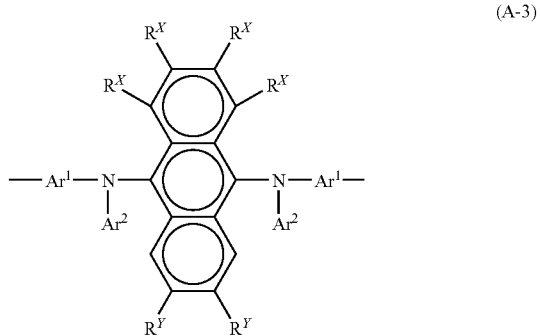

(A-3)

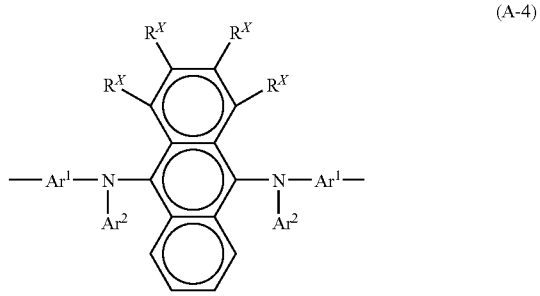

(A-4)

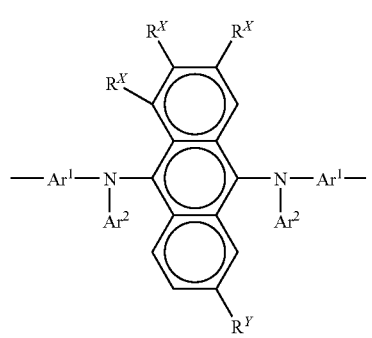 (A-5)
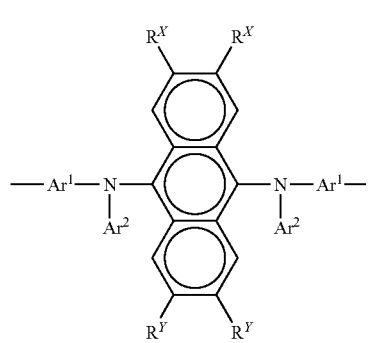 (A-6)
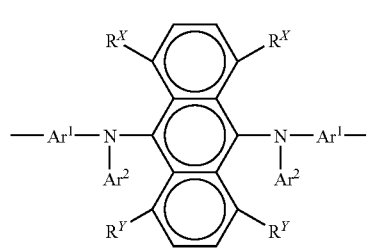 (B-1)
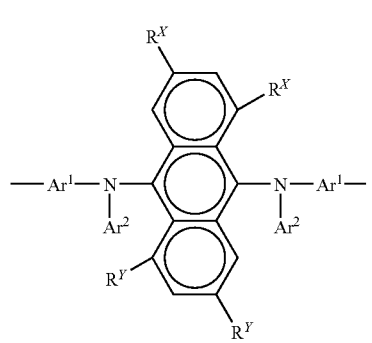 (B-2)
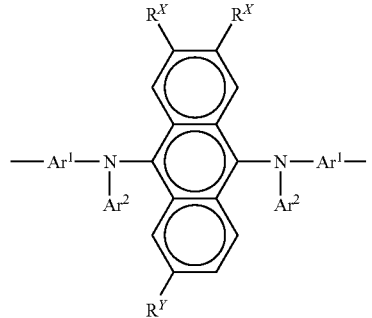 (B-3)
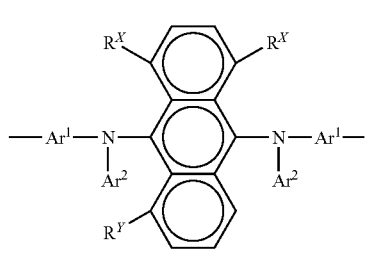 (B-4)
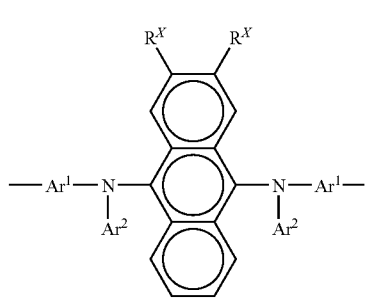 (B-5)
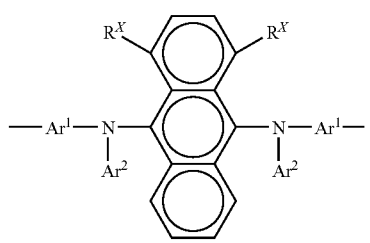 (B-6)
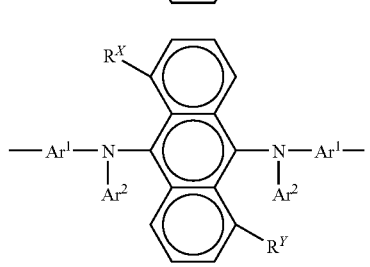 (C-1)
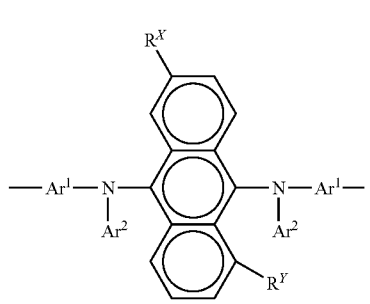 (C-2)
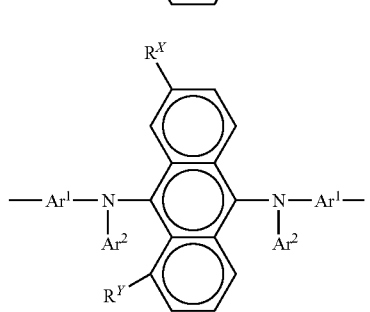 (C-3)

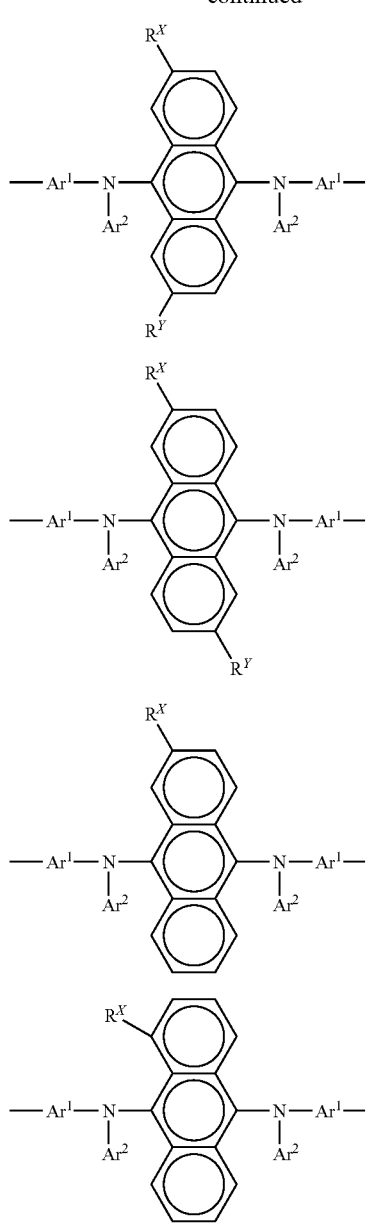

(C-4)

(C-5)

(C-6)

(C-7)

The above-described constitutional unit of the formula (1) includes, from the standpoint of easiness of synthesis of the polymer compound and the like, preferably those of the formulae (A-6), (B-1) to (B-2), (B-5) to (B-6), (C-1) to (C-7) and (A-6), (B-1) to (B-2), (B-5) to (B-6), (C-1) to (C-7) in which each $Ar^1$ and/or $Ar^2$ has a substituent such as an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group, nitro group, cyano group or the like, more preferably those of the formulae (A-6), (B-5), (C-4) to (C-7) and (A-6), (B-5), (C-4) to (C-7) in which each $Ar^1$ and/or $Ar^2$ has a substituent such as an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group, nitro group, cyano group or the like.

Further preferable are those of the formulae (C-4) to (C-6) and (C-4) to (C-6) in which each $Ar^1$ and/or $Ar^2$ has a substituent such as an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group, nitro group, cyano group or the like, and particularly preferable are constitutional units of the following formula (1A).

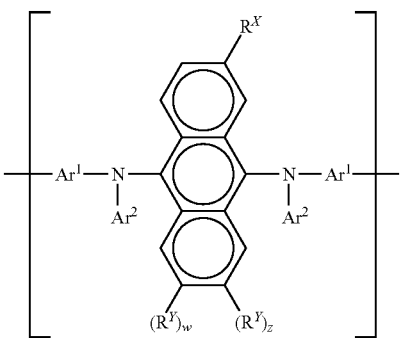

(1A)

(wherein, $Ar^1$, $Ar^2$, $R^X$ and $R^Y$ represent the same meanings as described above. w represents 0 or 1, z represents 0 or 1, and w+z is 0 or 1. A plurality of $Ar^1$'s and $Ar^2$'s may each be the same or different.).

In the above-described formula (1A), w represents 0 or 1, preferably 1. z represents 0 or 1, preferably 0. w+z is 0 or 1, preferably 1.

Examples of the above-described formula (1A) include those of the following formulae (D-1) to (D-12), (E-1) to (E-15), (F-1) to (F-3), (G-1) to (G-6), (H-1) to (H-9), (J-1) to (J-9) (K-1) to (K-9), (L-1) to (L-9); and those of the following formulae (D-1) to (D-12), (E-1) to (E-15), (F-1) to (F-3), (G-1) to (G-6), (H-1) to (H-9), (J-1) to (J-9) (K-1) to (K-9), (L-1) to (L-9) each carrying a substituent such as an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group, nitro group, cyano group or the like (here, the anthracene ring to which $R^X$ is connected has only substituents $R^X$ and $R^Y$). Here, the definitions and examples of $R^X$ and $R^Y$ are as described above. In the following formulae (D-1) to (D-12), (E-1) to (E-15), (F-1) to (F-3), (G-1) to (G-6), (H-1) to (H-9), (J-1) to (J-9) (K-1) to (K-9), (L-1) to (L-9), a free bond in the aromatic ring may take any position, and $R^X$, $R^Y$, w and z are as described above.

(D-1)
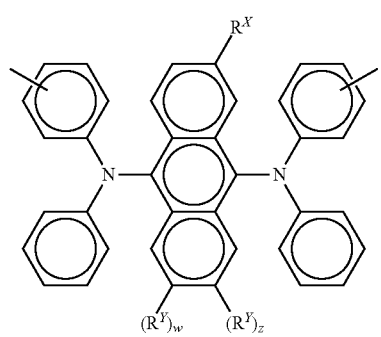
(D-5)
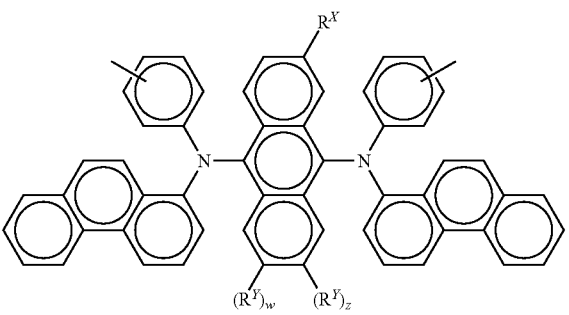
(D-2)
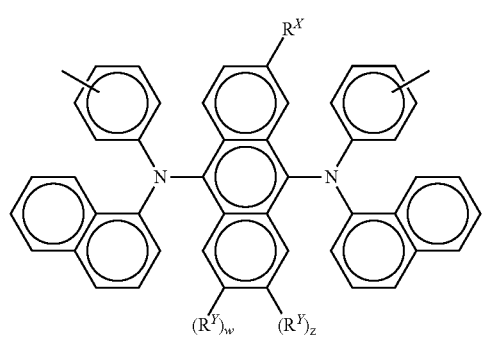
(D-6)
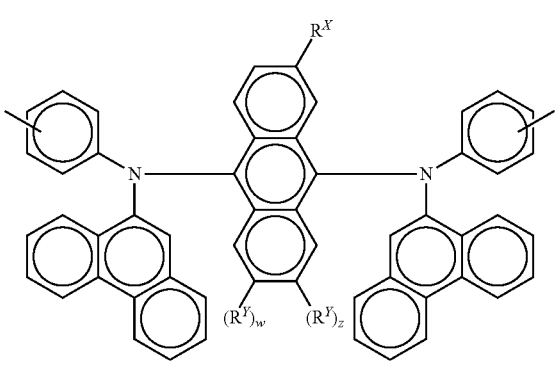
(D-3)
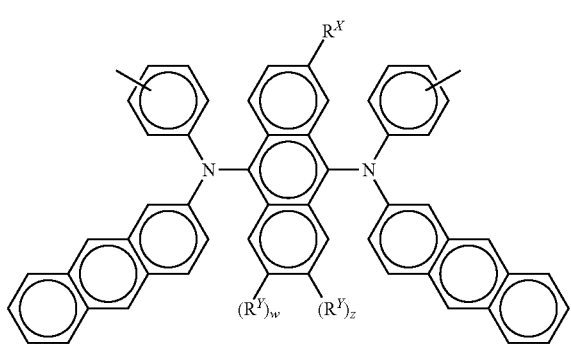
(D-7)
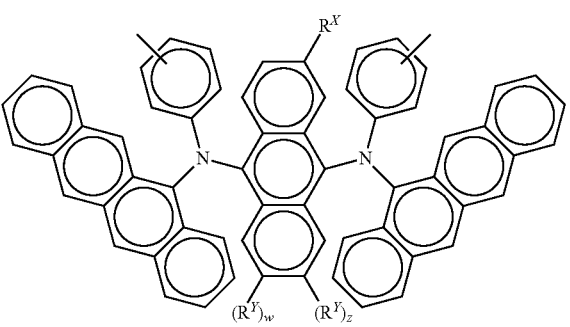
(D-4)
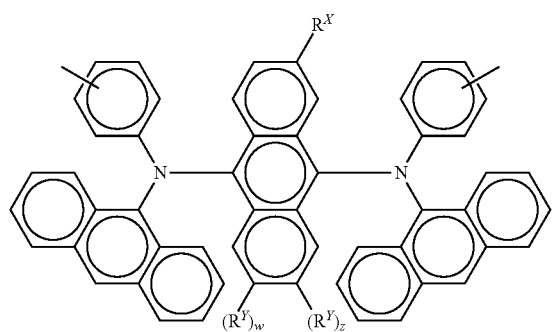
(D-8)

(D-9) 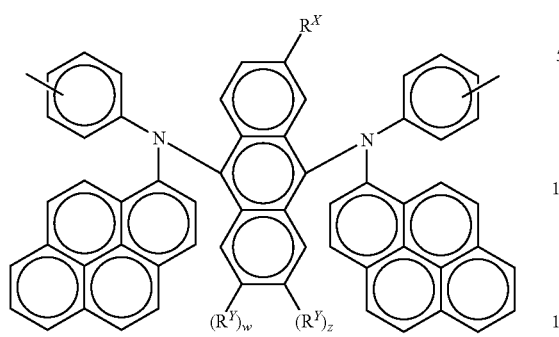
(D-10) 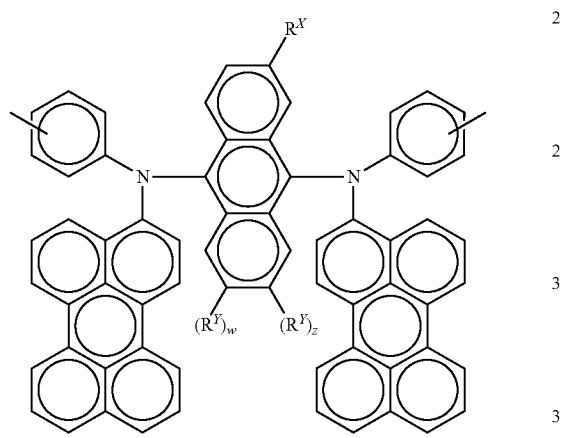
(D-11) 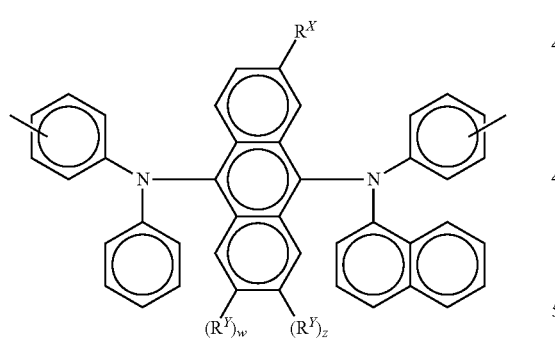
(D-12) 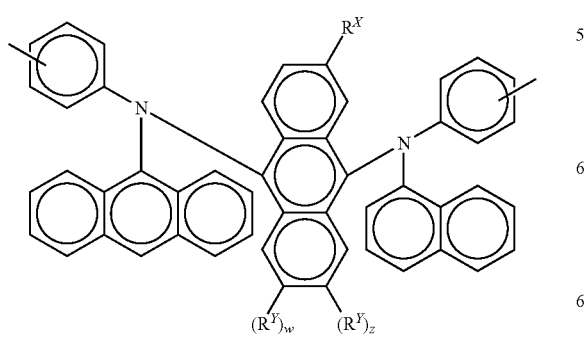
(E-1) 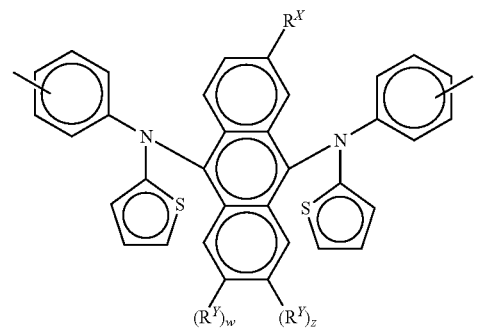
(E-2) 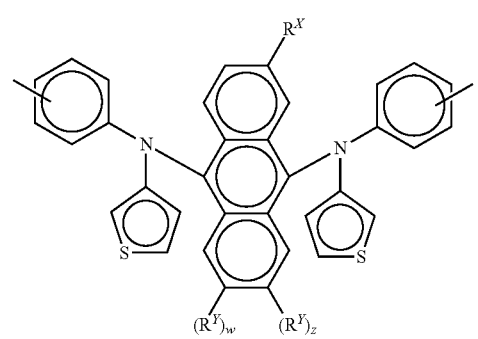
(E-3) 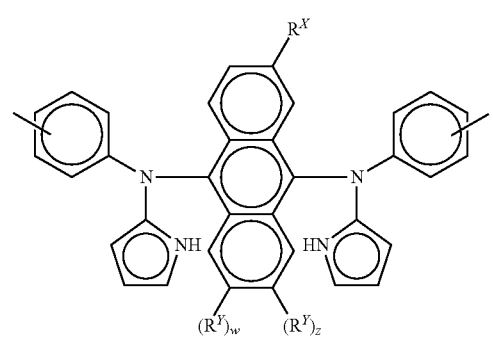
(E-4) 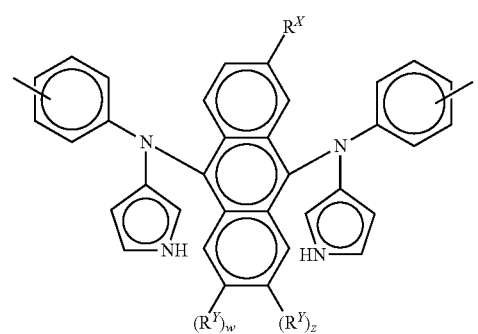

(E-5)
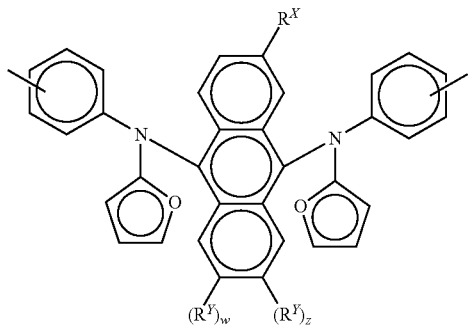
(E-9)
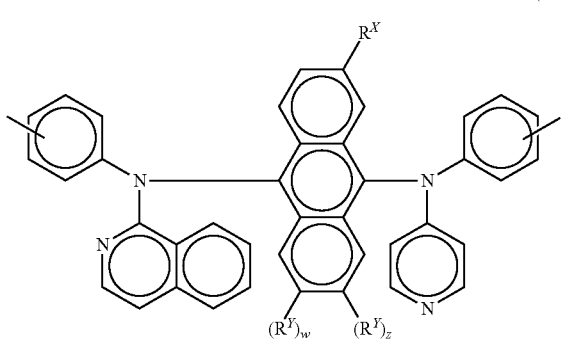
(E-6)
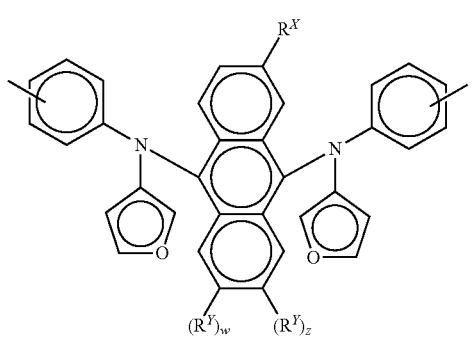
(E-10)
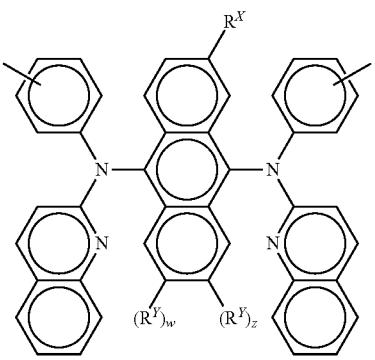
(E-7)
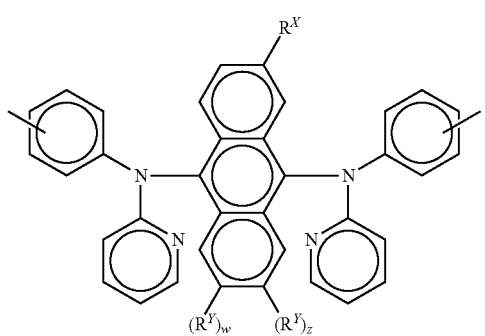
(E-11)
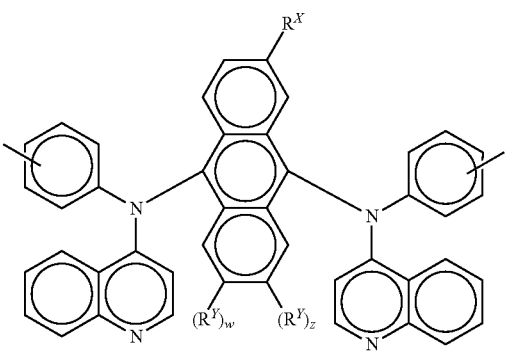
(E-8)
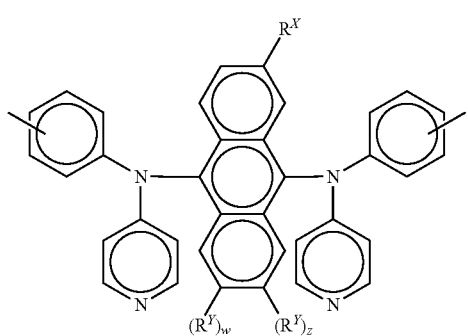
(E-12)
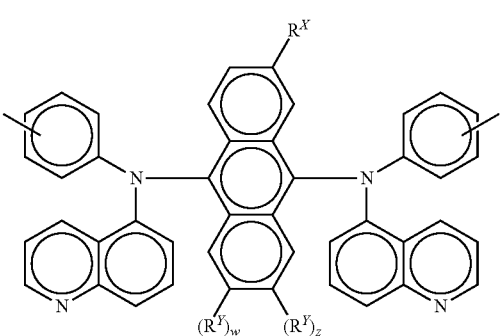

(E-13)
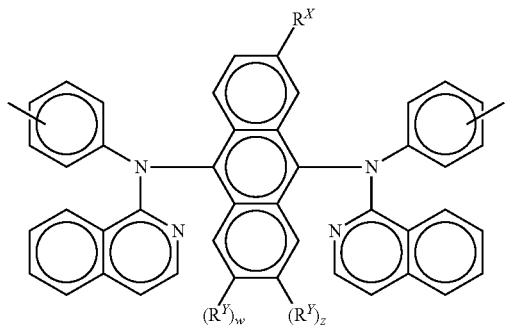
(F-2)
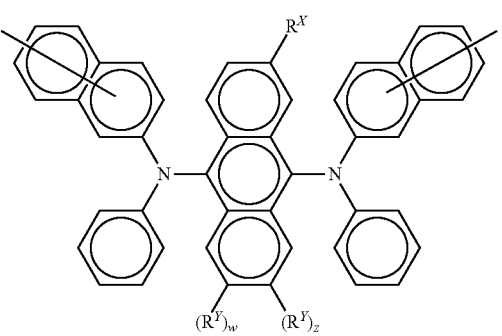
(E-14)
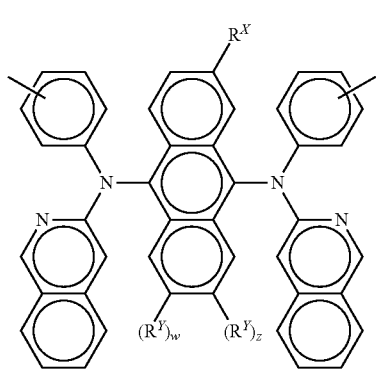
(F-3)
(E-15)
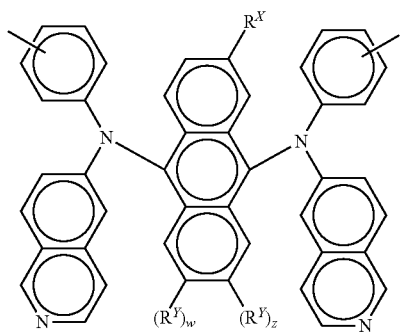
(G-1)
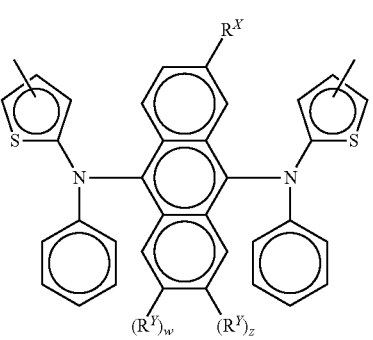
(F-1)
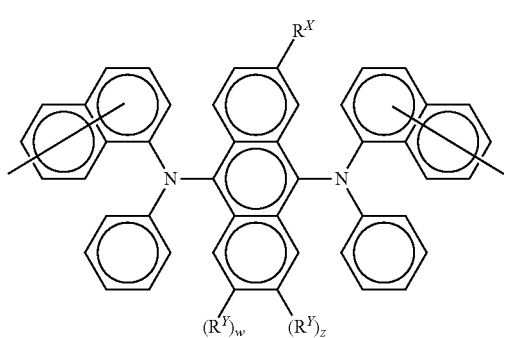
(G-2)
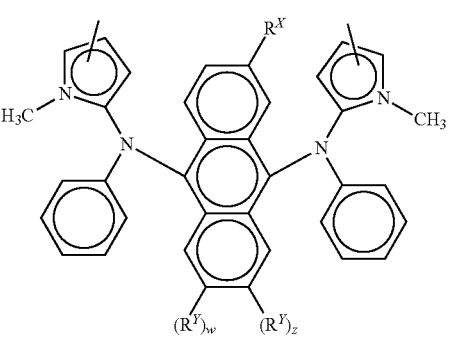

-continued
(G-3)
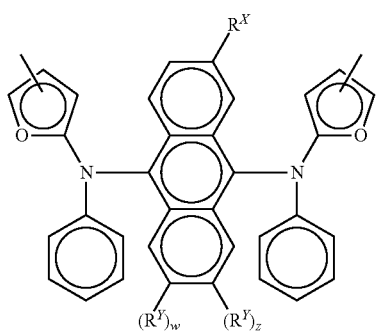
(G-4)
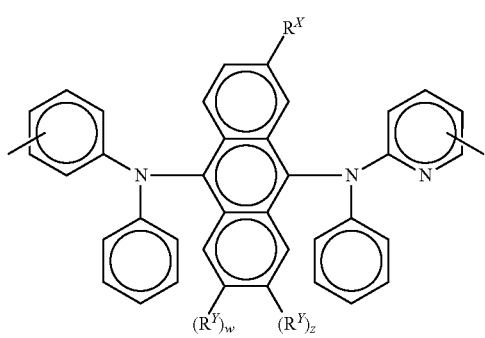
(G-5)
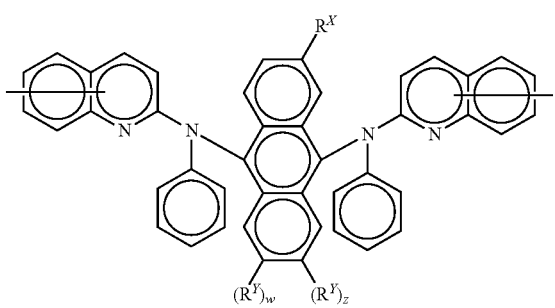
(G-6)
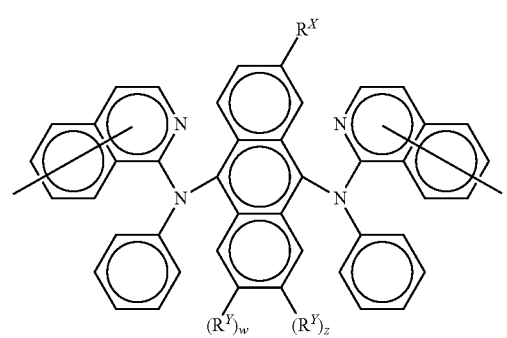
-continued
(H-1)
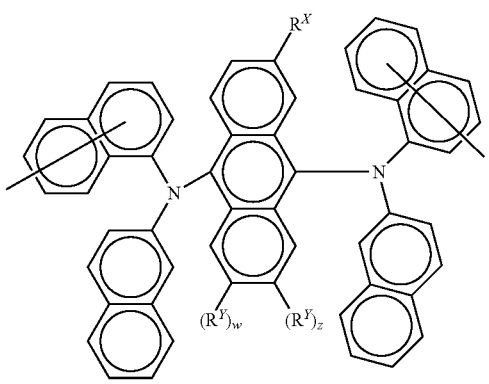
(H-2)
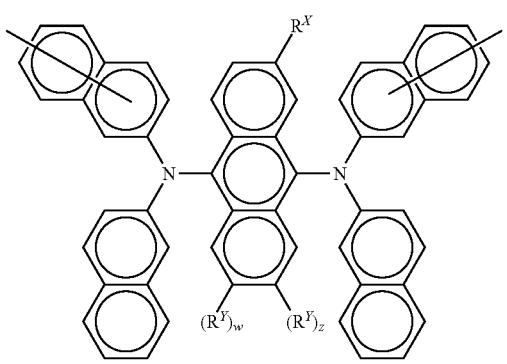
(H-3)
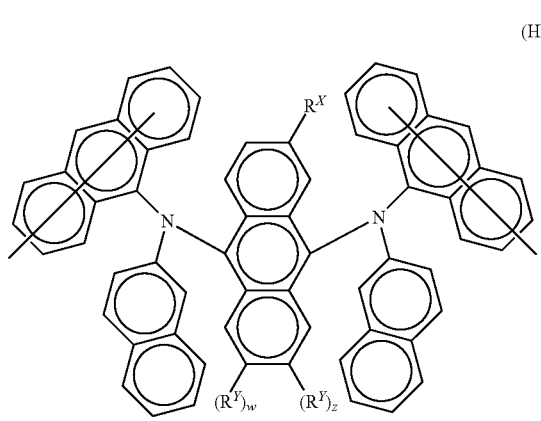
(H-4)
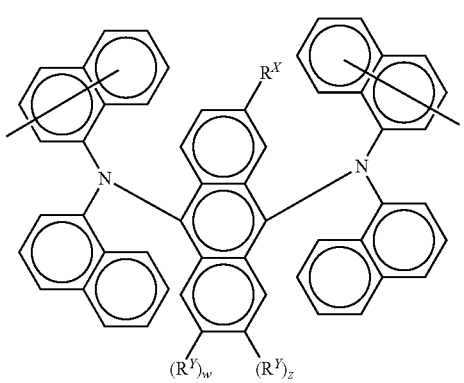

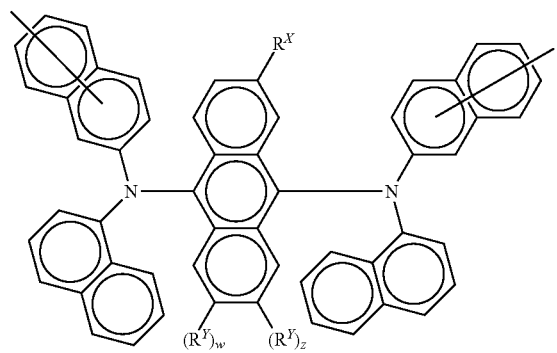
(H-5)
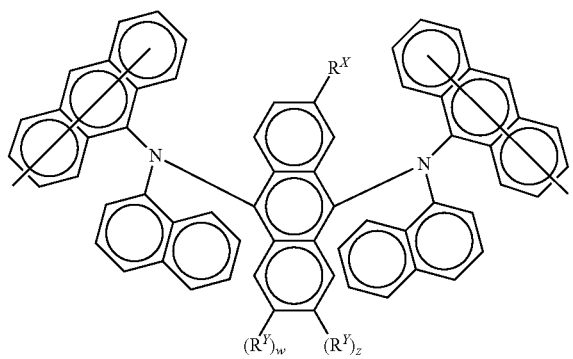
(H-6)
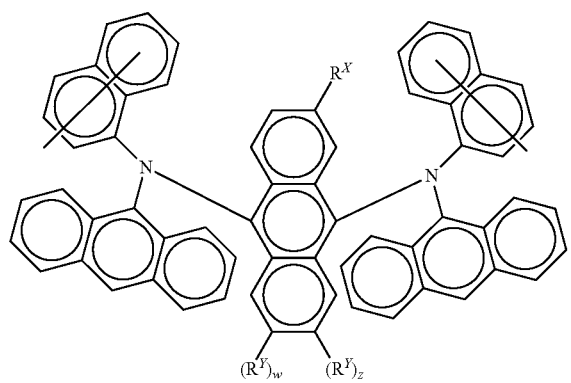
(H-7)
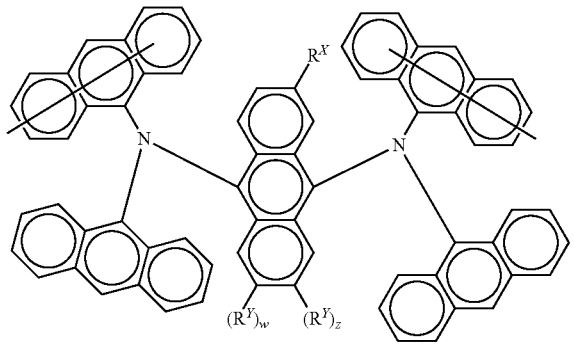
(H-8)
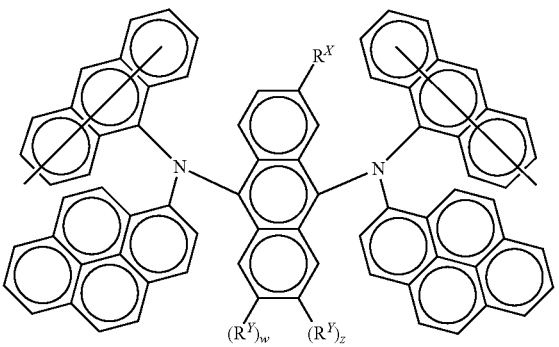
(H-9)
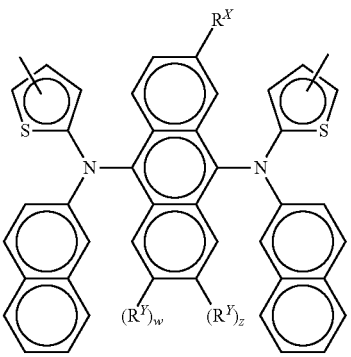
(J-1)
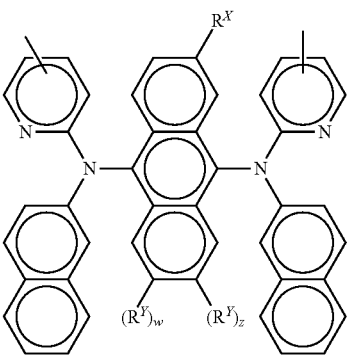
(J-2)
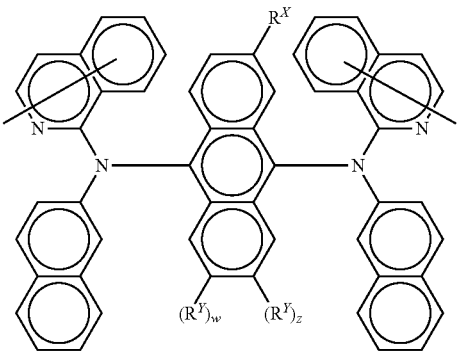
(J-3)

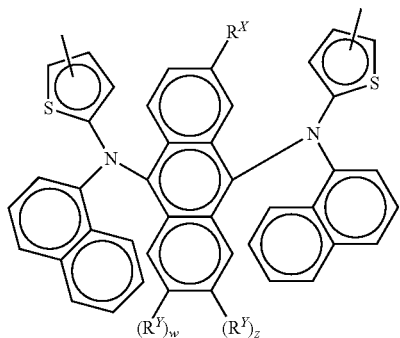
(J-4)
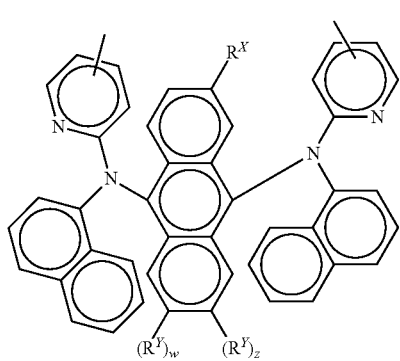
(J-5)
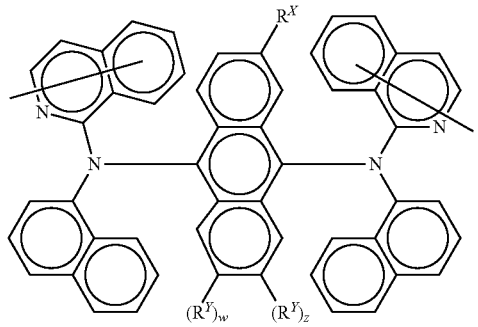
(J-6)
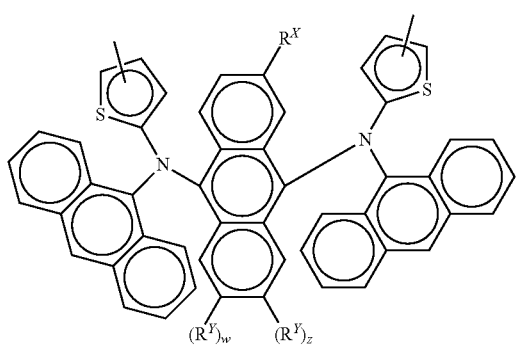
(J-7)
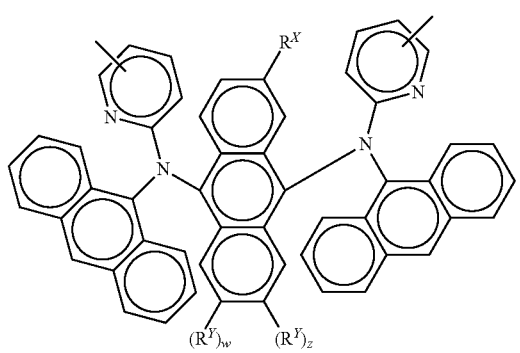
(J-8)
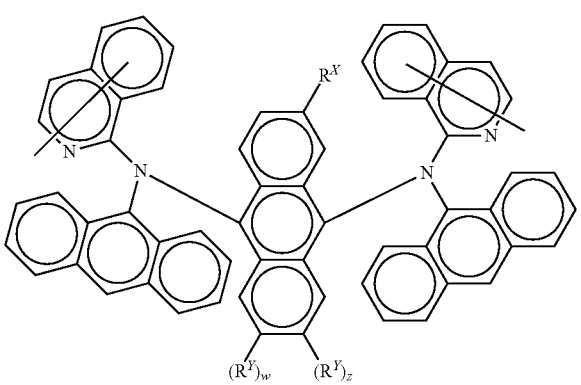
(J-9)
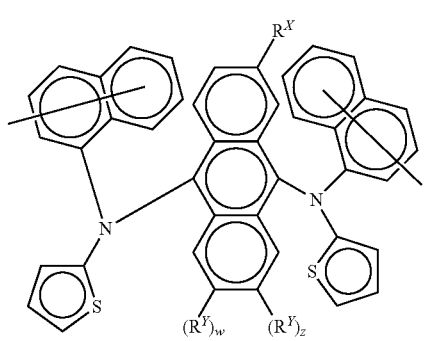
(K-1)
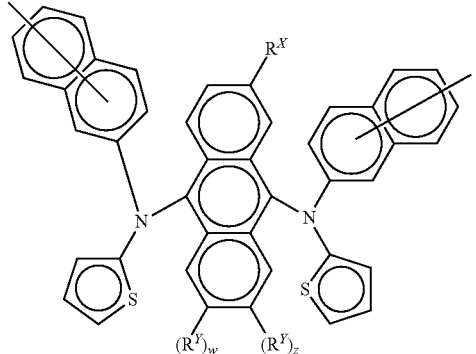
(K-2)

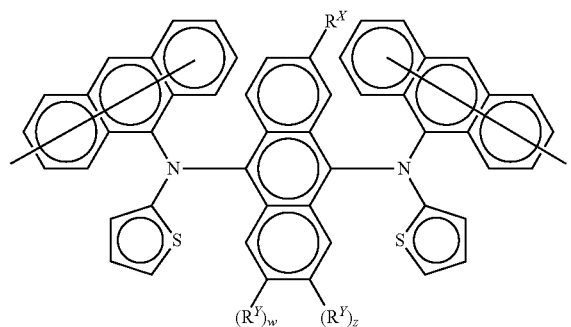
(K-3)
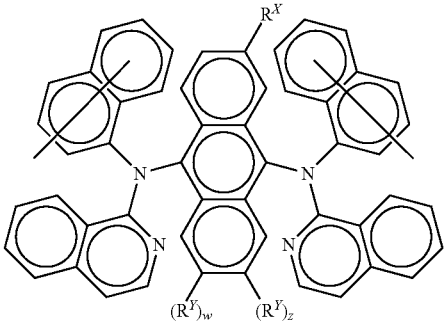
(K-7)
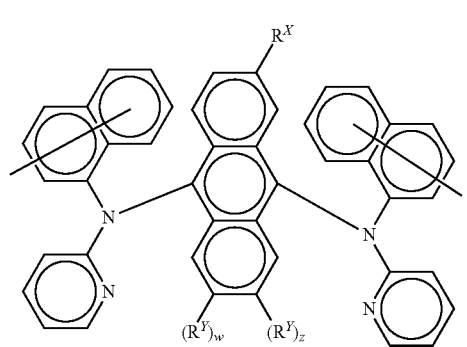
(K-4)
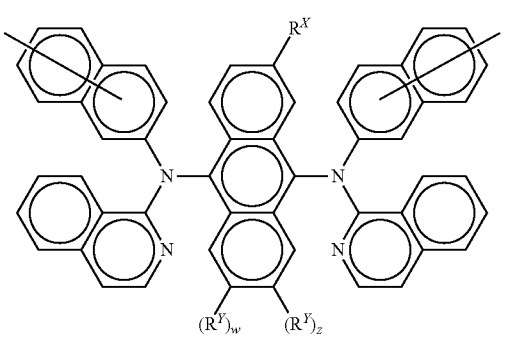
(K-8)
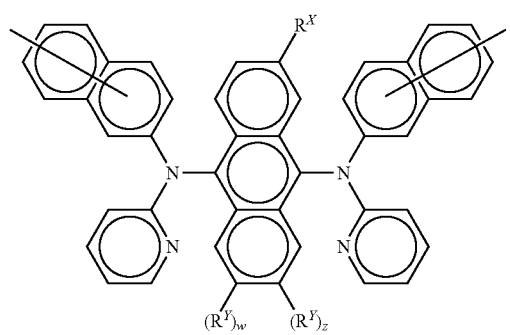
(K-5)
(K-9)
(K-6)
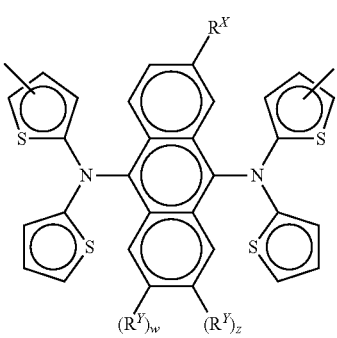
(L-1)

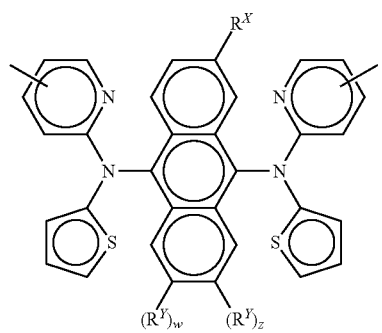
(L-2)

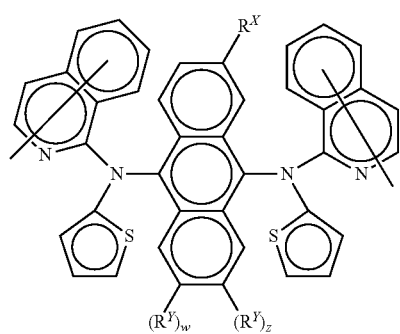
(L-3)

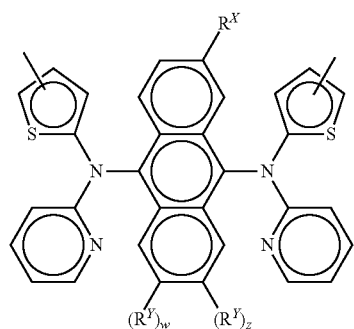
(L-4)

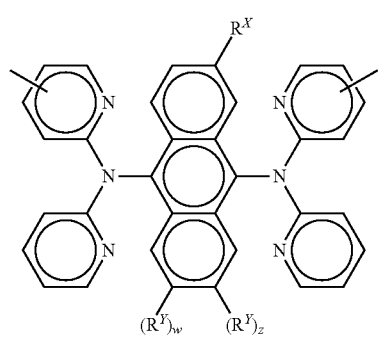
(L-5)

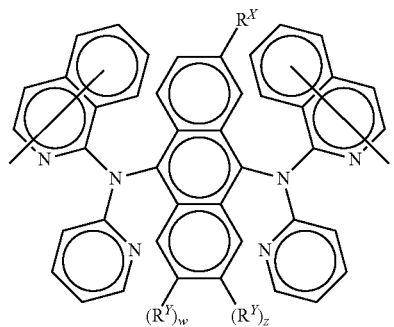
(L-6)

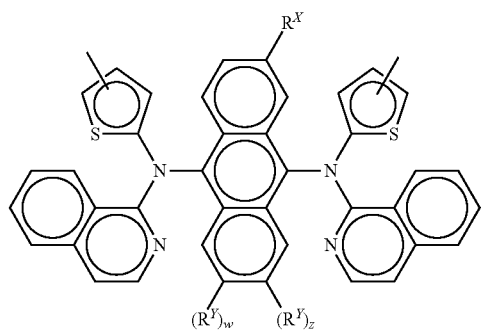
(L-7)

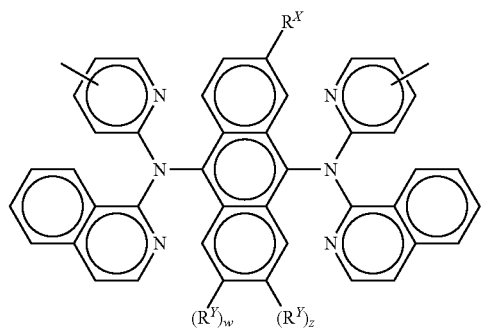
(L-8)

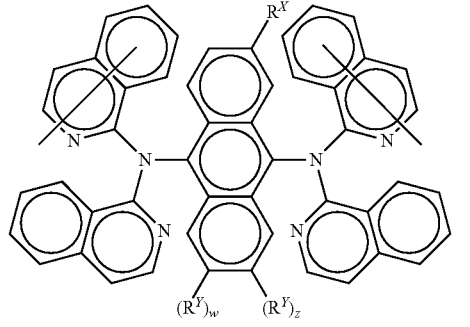
(L-9)

The above-described constitutional units of the formula (1A) include, from the standpoint of easiness of synthesis of the resultant polymer compound and the like, preferably those of the formulae (D-1) to (D-12), (F-1) to (F-3), (H-1) to (H-9) and those of the formulae (D-1) to (D-12), (F-1) to (F-3), (H-1) to (H-9) each carrying a substituent such as an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group, nitro group, cyano group or the like (here, the anthracene ring to which $R^X$ is connected has only substituents $R^X$ and $R^Y$, being applicable also in the following descriptions), more preferably those of the formulae (D-1) to (D-12), (F-1) to (F-3) and those of the formulae (D-1) to (D-12), (F-1) to (F-3) each carrying a substituent such as an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group, nitro group, cyano group or the like, more still preferably those of the formulae (D-1), (F-1) to (F-3) and those of the formulae (D-1), (F-1) to (F-3) each carrying a substituent such as an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group, nitro group, cyano group and the like の substituent, further still preferably those of the formula (D-1) and those of the formula (D-1) carrying a substituent such as an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group, nitro group, cyano group or the like, especially preferably constitutional units of the following formula (1B):

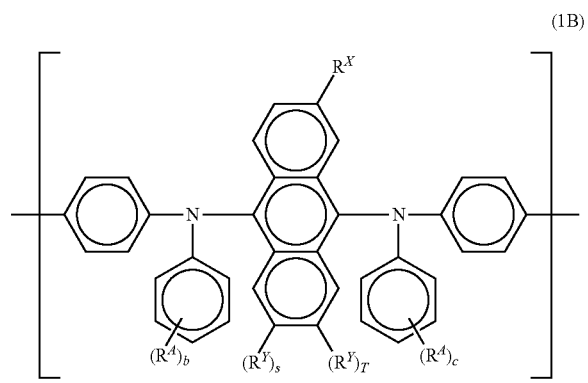

(1B)

(wherein, $R^X$ and $R^Y$ are as described above. $R^A$ represents an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group, nitro group or cyano group. S represents 0 or 1, T represents 0 or 1, and S+T is 0 or 1. b and c represent each independently an integer of 0 to 5. When there exist a plurality of $R^A$'s, these may be mutually the same or different.), particularly preferably constitutional units of the following formula (1C):

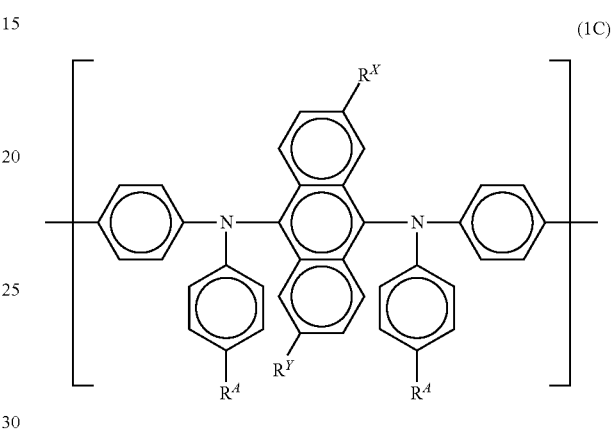

(1C)

(wherein, $R^X$, $R^Y$ and $R^A$ represent the same meanings as described above. Two $R^A$'s may be mutually the same or different.).

In the above-described formula (1B), (1C), $R^A$ represents an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group, nitro group or cyano group. $R^A$ represents preferably a group selected from an alkyl group, alkoxy group, aryl group, aryloxy group, arylalkyl group, arylalkoxy group, substituted amino group, substituted silyl group, acyl group, substituted carboxyl group and cyano group, more preferably a group selected from an alkyl group, alkoxy group, aryl group, aryloxy group, arylalkyl group, arylalkoxy group and substituted carboxyl group, further preferably a group selected from an alkyl group, alkoxy group and aryl group, particularly preferably an alkyl group.

The definitions and examples of the above-described alkyl group, alkoxy group, alkylthio group, aryl group, aryloxy group, arylthio group, arylalkyl group, arylalkoxy group, arylalkylthio group, arylalkenyl group, arylalkynyl group, substituted amino group, substituted silyl group, halogen atom, acyl group, acyloxy group, imine residue, amide group, acid imide group, mono-valent heterocyclic group and substituted carboxyl group are the same as the definitions and examples explained in the section of a substituent when the above-described $Ar^1$ has a substituent. When there exist a plurality of $R^A$'s, these may be mutually the same or different.

In the above-described formula (1B), it is preferable that $R^A$ is present on a para-position of each N atom.

In the above-described formula (1B), S represents 0 or 1, preferably 1. T represents 0 or 1, preferably 0. S+T is 0 or 1, preferably 1.

In the above-described formula (1B), b and c represent each independently an integer of 0 to 5, preferably an integer of 0 to 3, more preferably 1 or 3, further preferably 1.

As the constitutional unit of the above-described formula (1B) (including those of the above-described formula (1C)), for example, those of the following formulae (M-1) to (M-7), (N-1) to (N-35), (O-1) to (O-18), (P-1) to (P-11), (Q-1) to (Q-8), (R-1) to (R-10) and the like are mentioned.

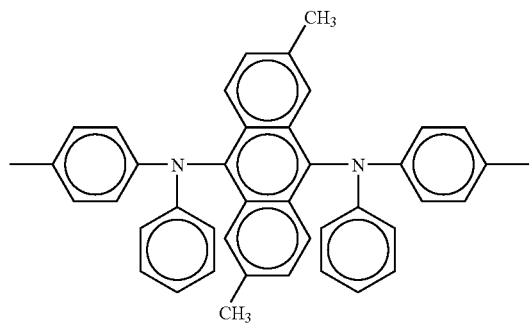
(M-1)

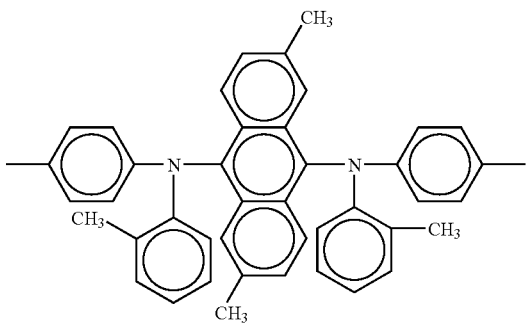
(M-2)

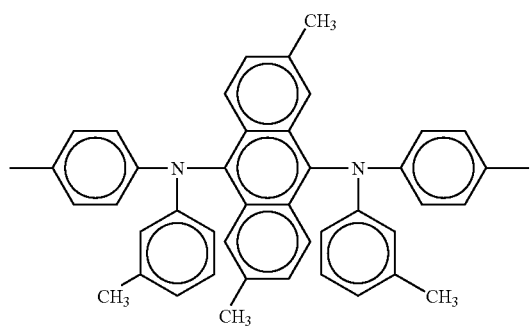
(M-3)

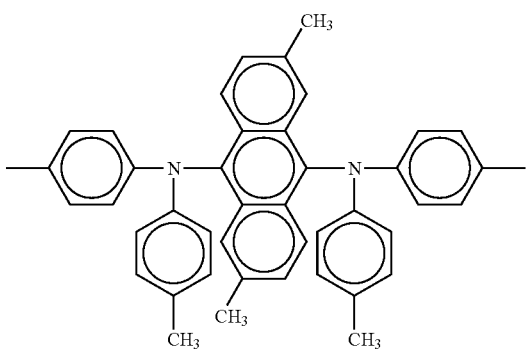
(M-4)

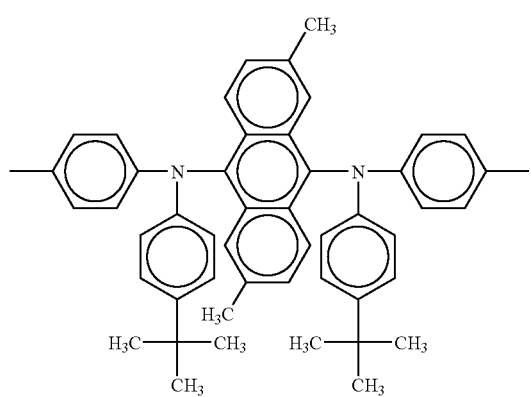
(M-5)

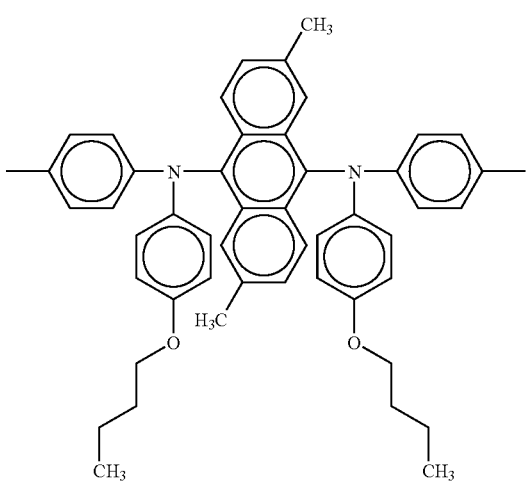
(M-6)

-continued
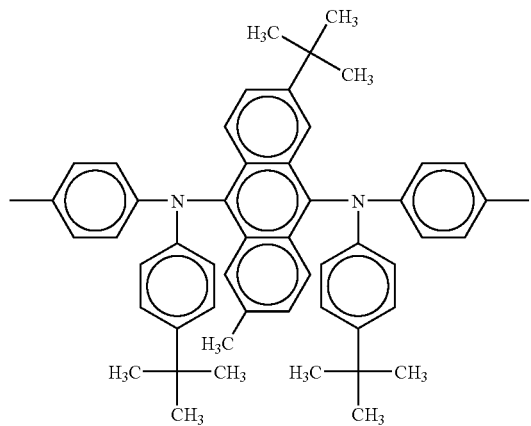
(M-7)
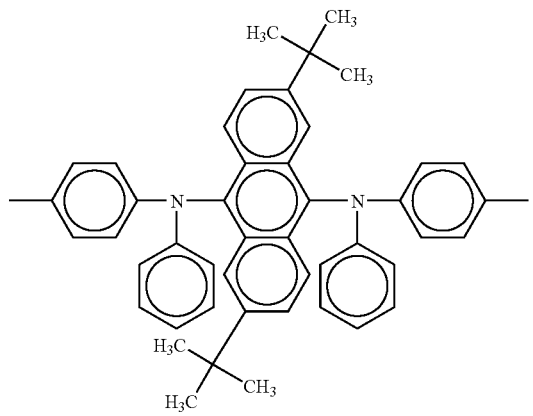
(N-1)
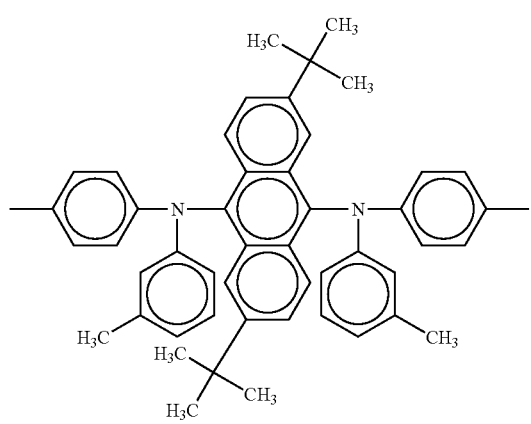
(N-2)
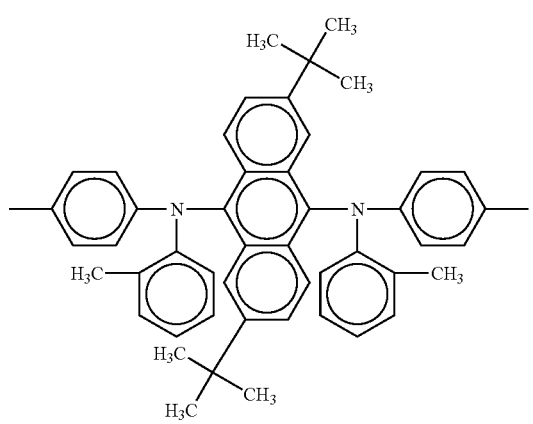
(N-3)
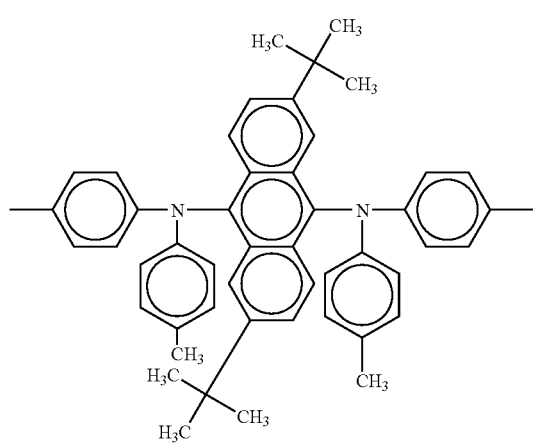
(N-4)
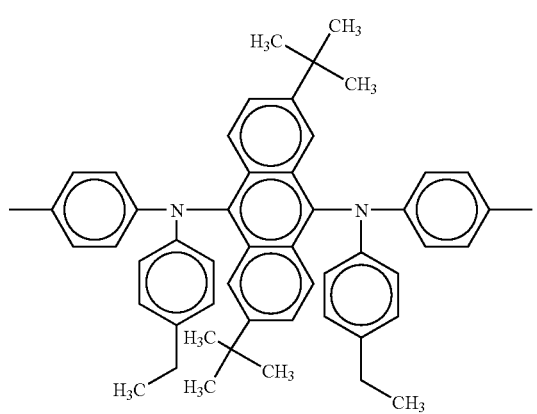
(N-5)

-continued
(N-6)
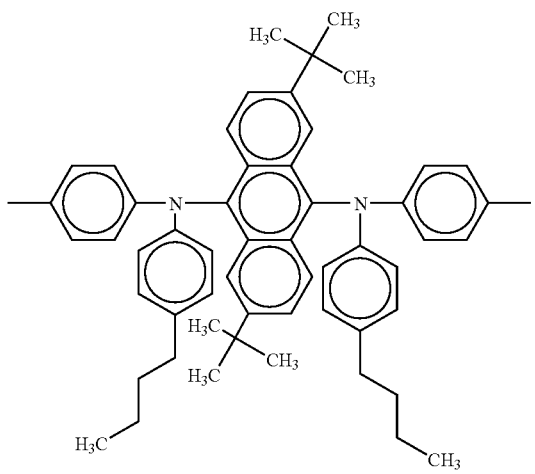
(N-7)
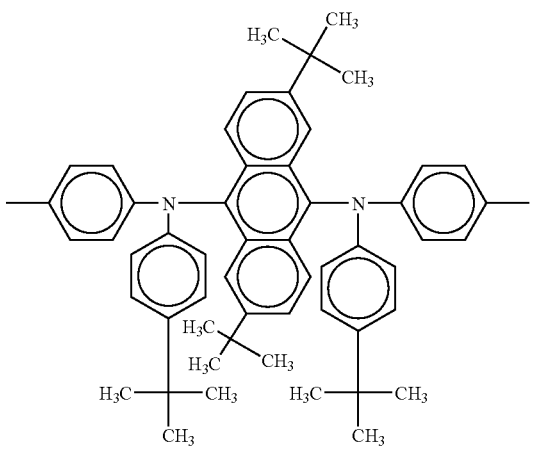
(N-8)
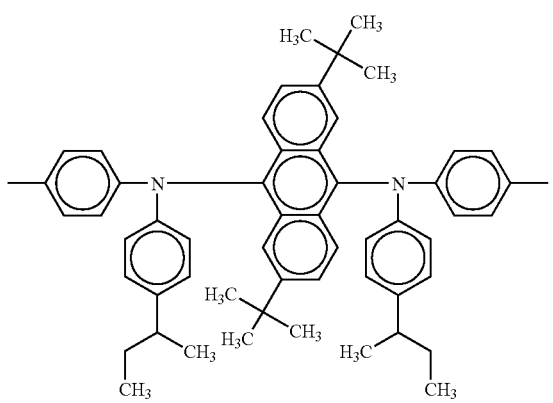
(N-9)
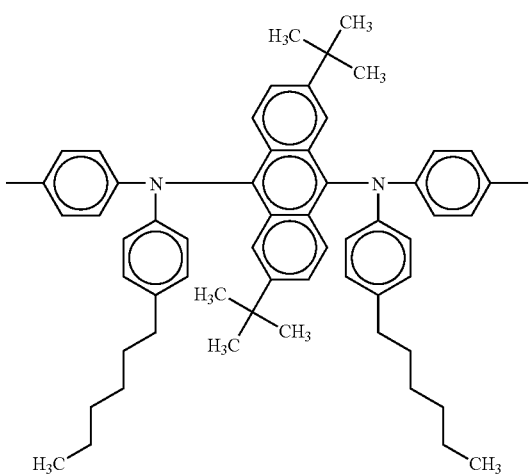
(N-10)
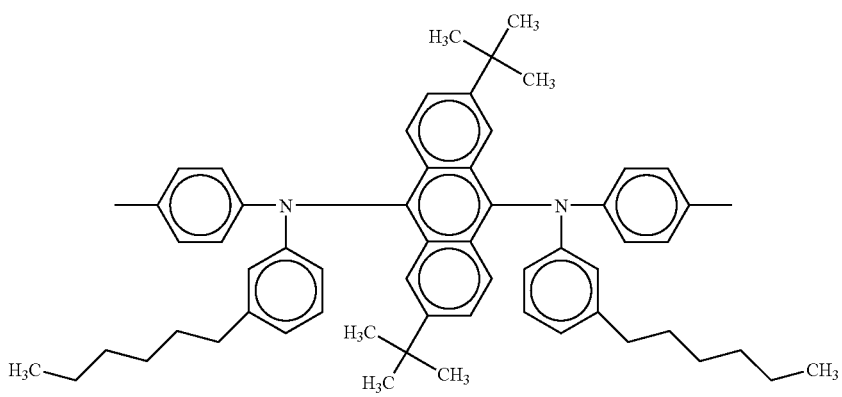

-continued
(N-11)
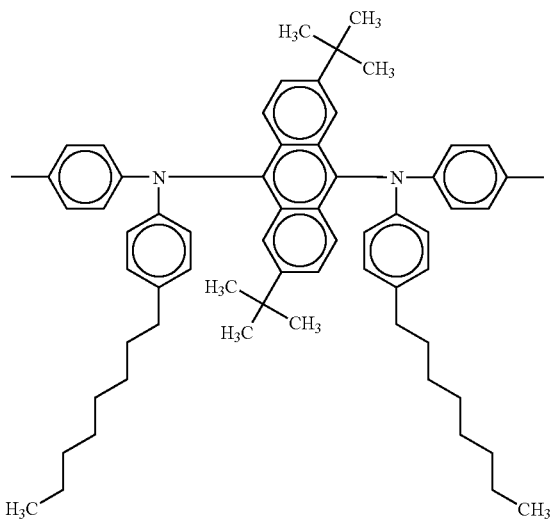
(N-12)
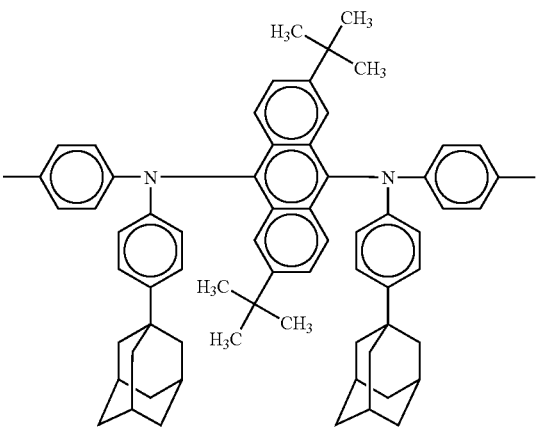
(N-13)
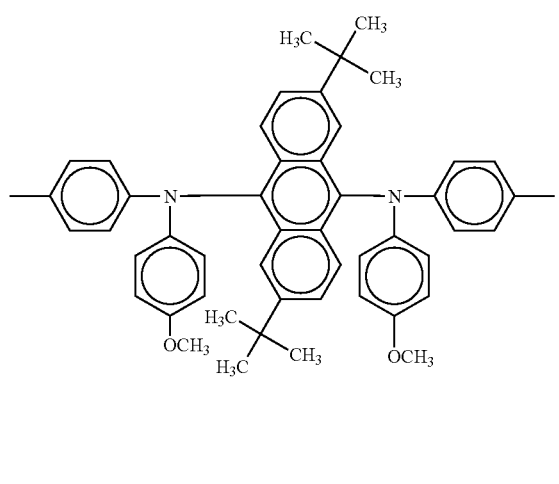
(N-14)
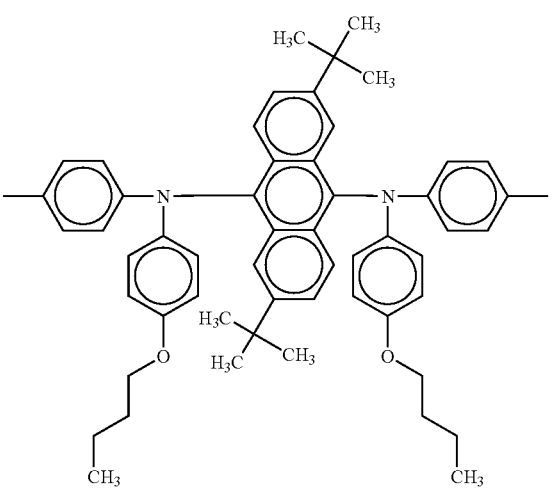
(N-15)
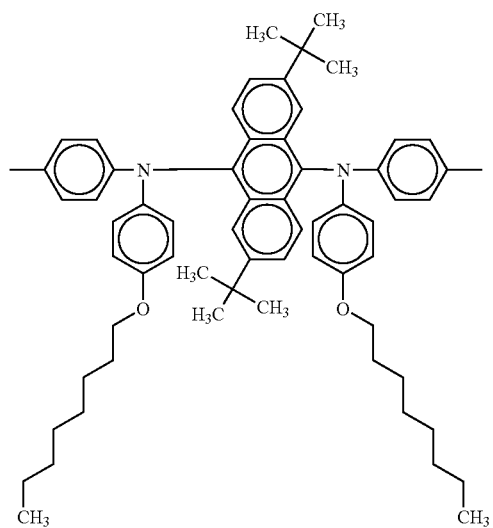
(N-16)
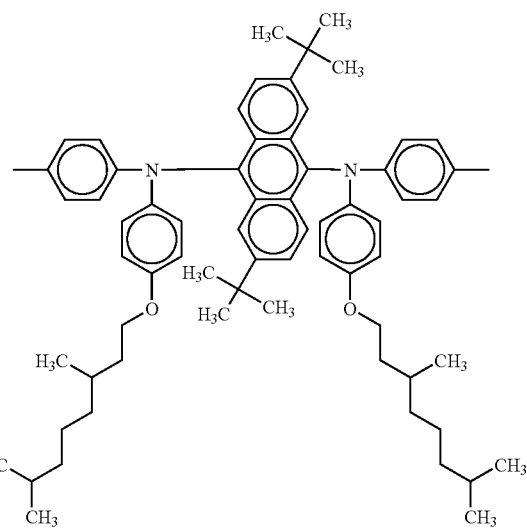

-continued
(N-17)
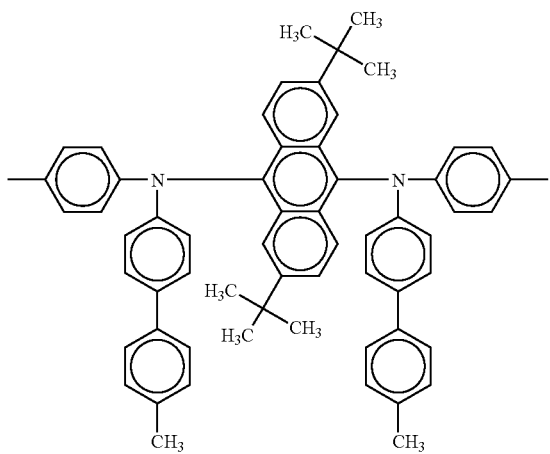
(N-18)
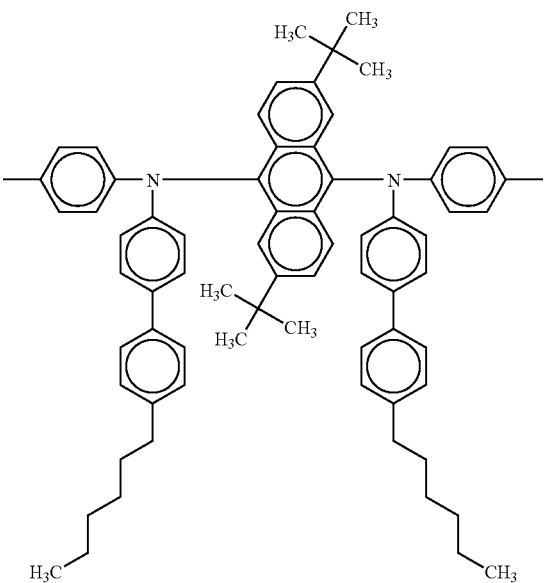
(N-19)
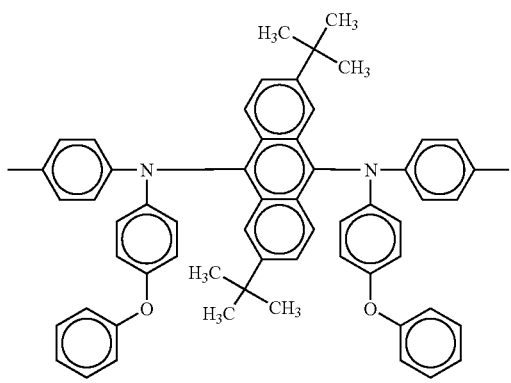
(N-20)
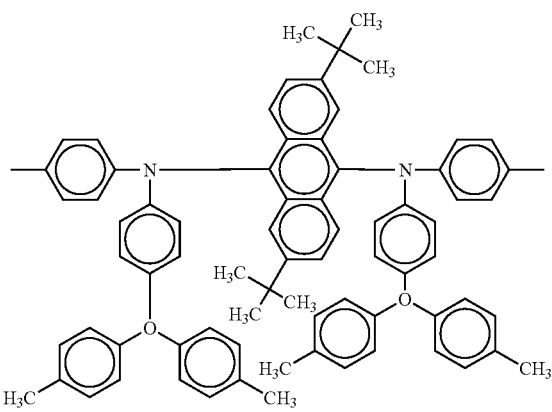
(N-21)
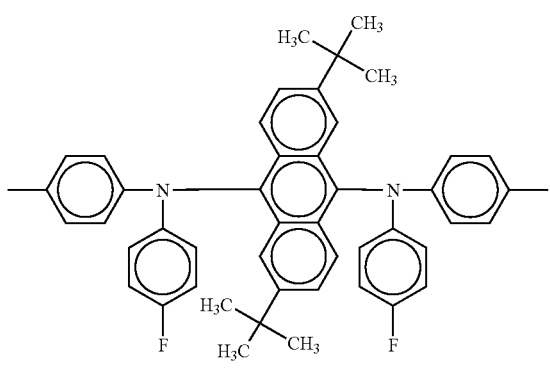
(N-22)
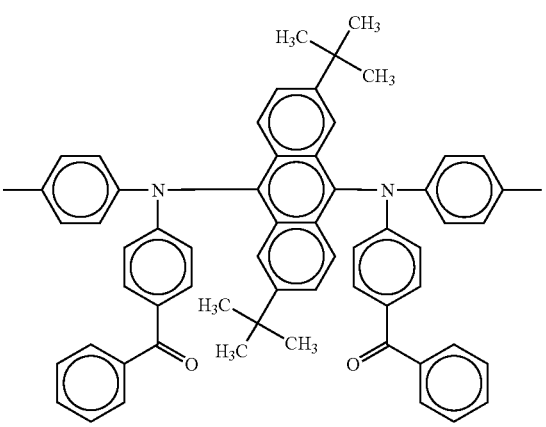

(N-23)
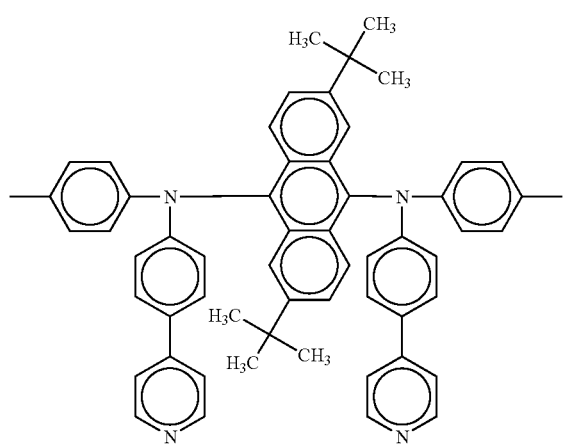
(N-24)
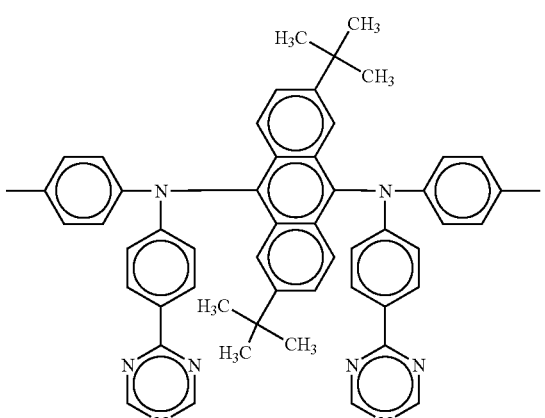
(N-25)
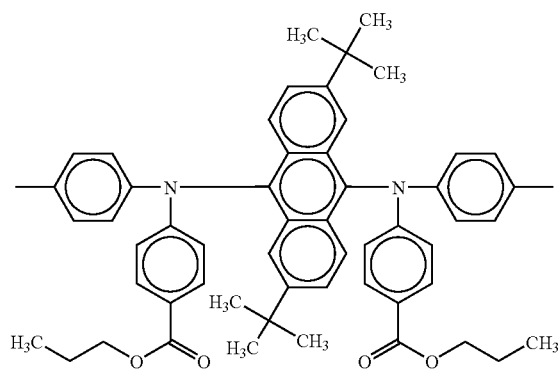
(N-26)
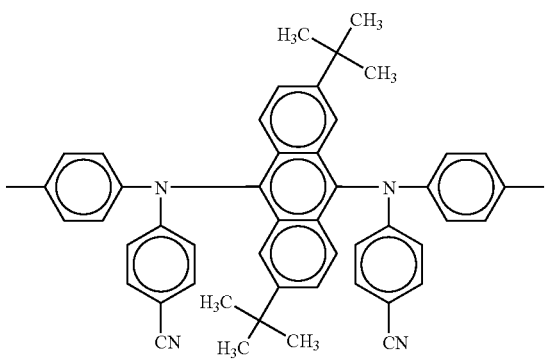
(N-27)
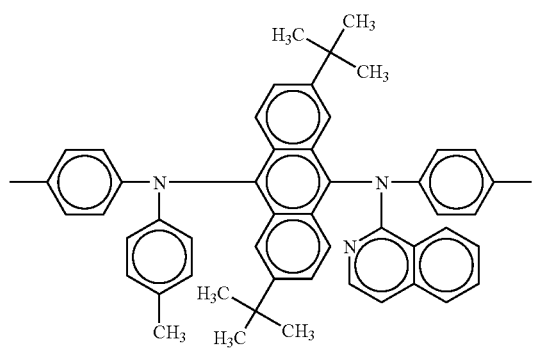
(N-28)
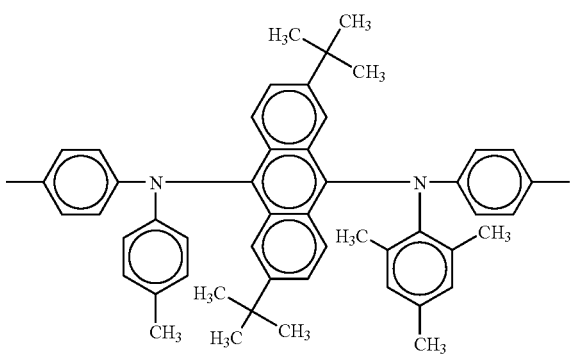
(N-29)
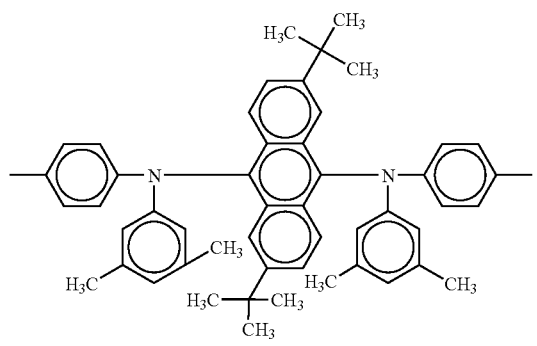
(N-30)
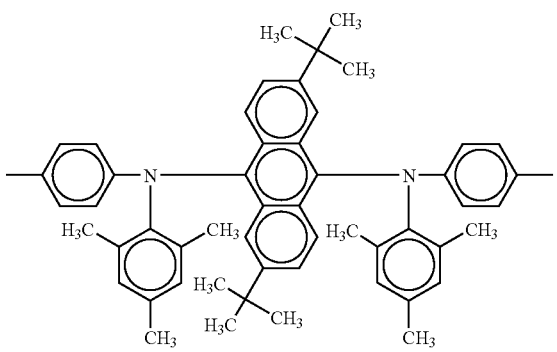

-continued
(N-31)
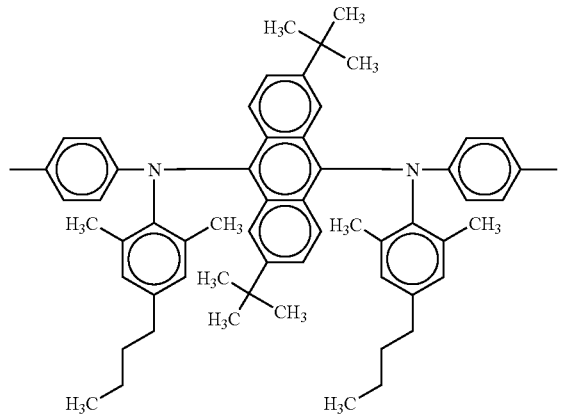
(N-32)
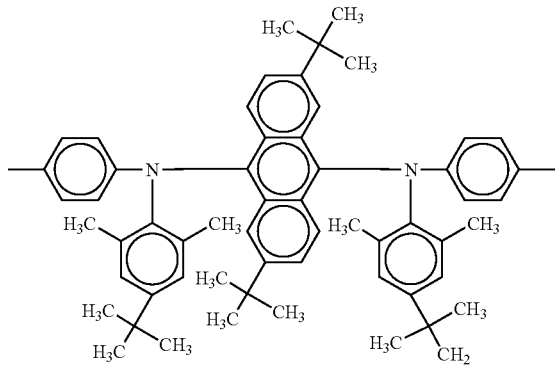
(N-33)
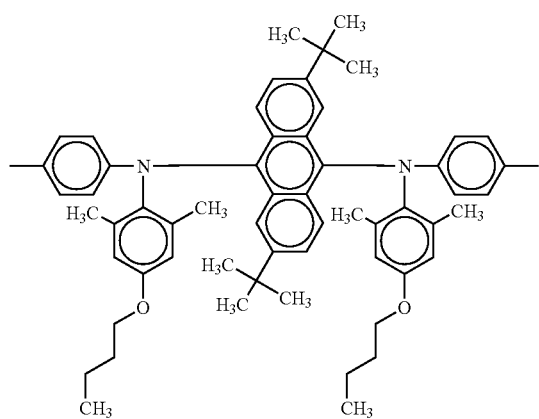
(N-34)
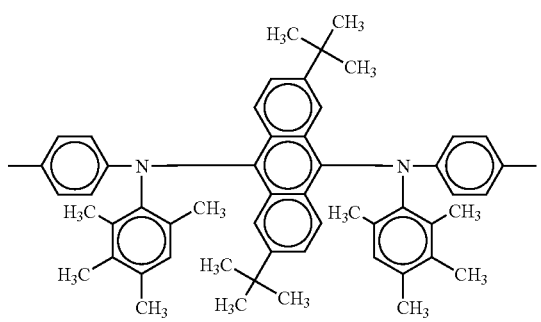
(N-35)
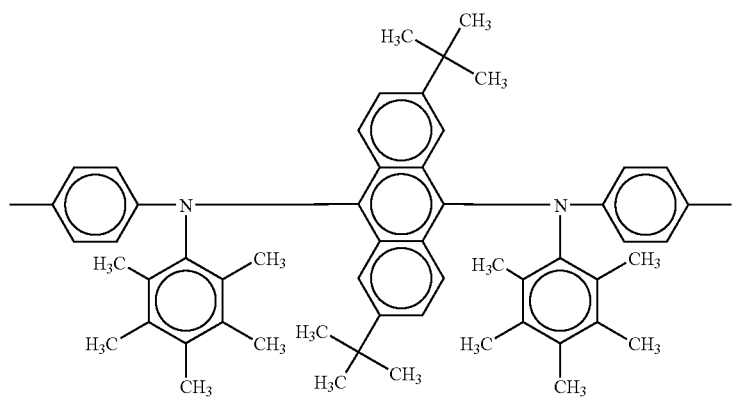

-continued
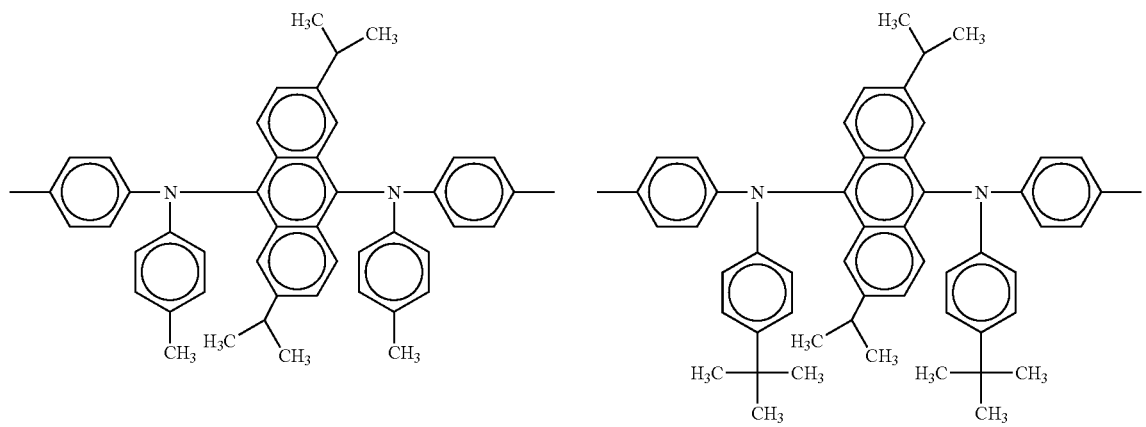
(O-1) (O-2)
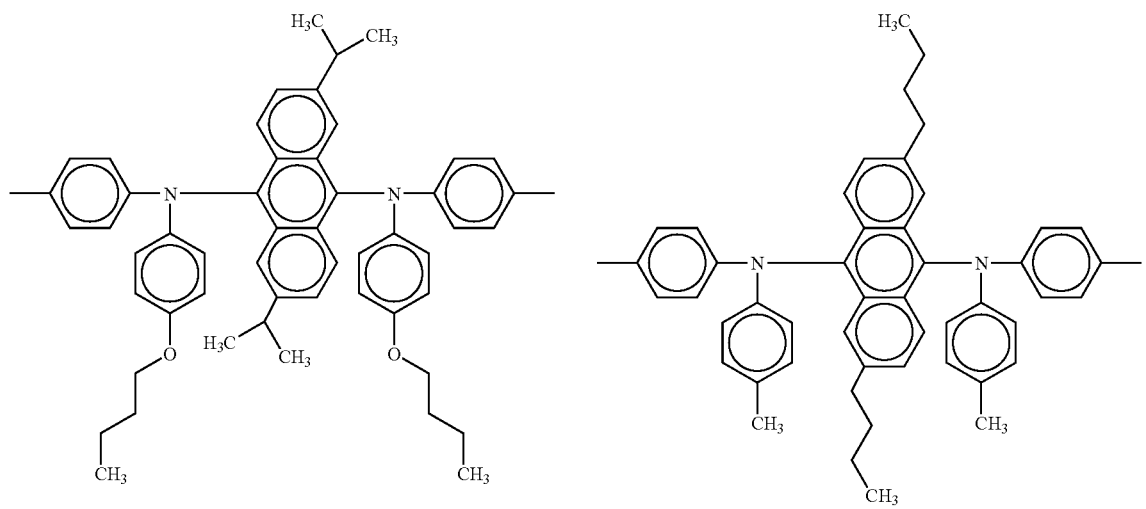
(O-3) (O-4)
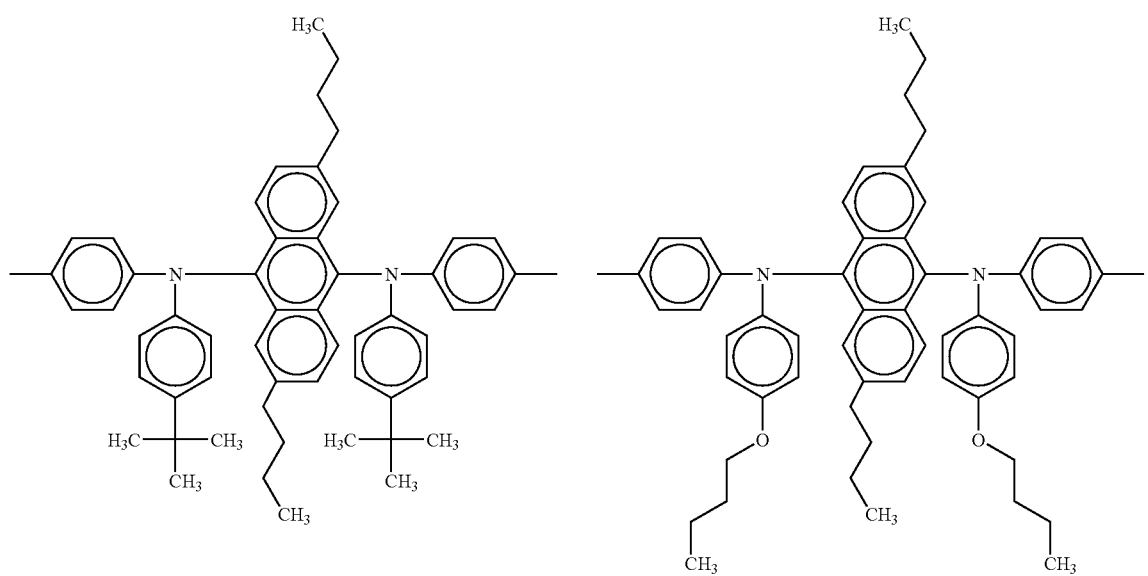
(O-5) (O-6)

-continued
(O-7)
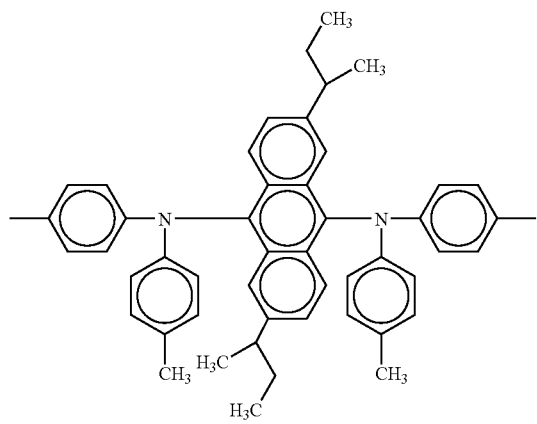
(O-8)
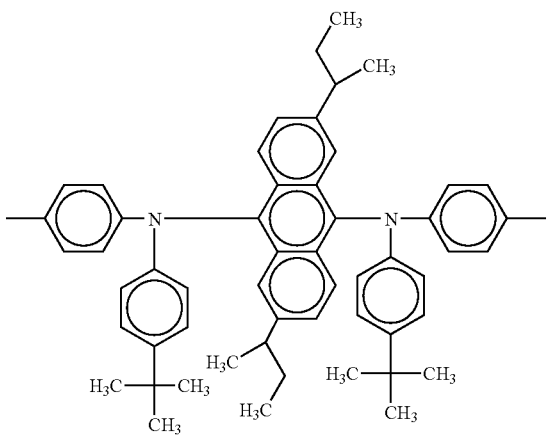
(O-9)
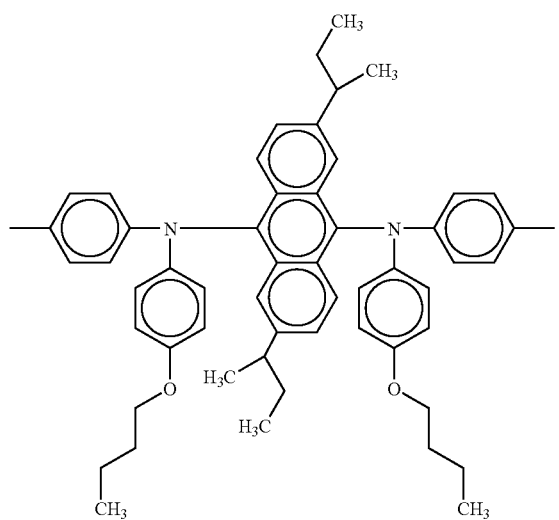
(O-10)
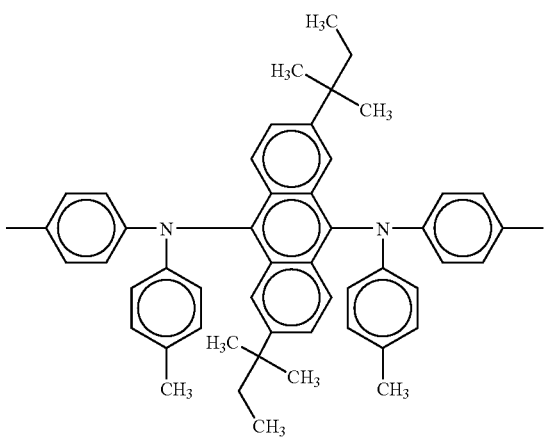
(O-11)
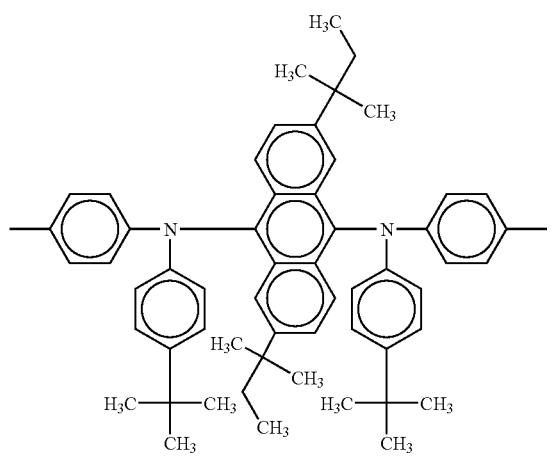
(O-12)
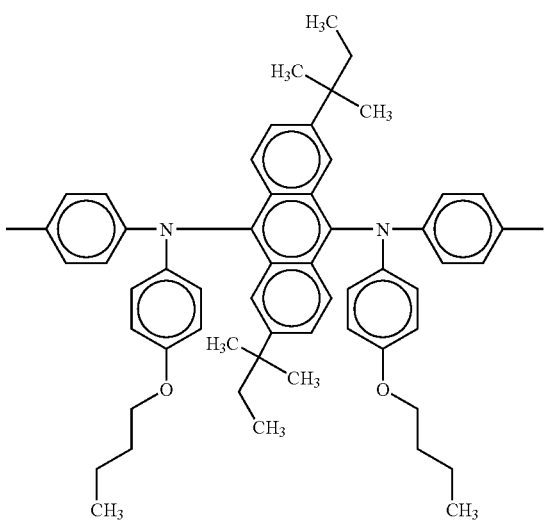

-continued
(O-13)
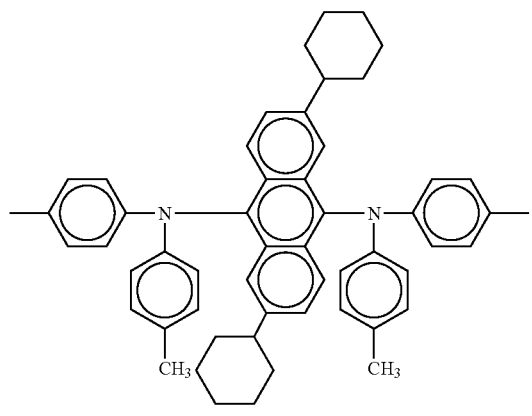
(O-14)
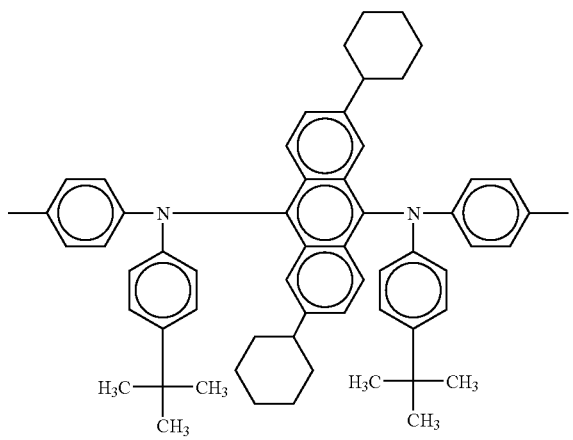
(O-15)
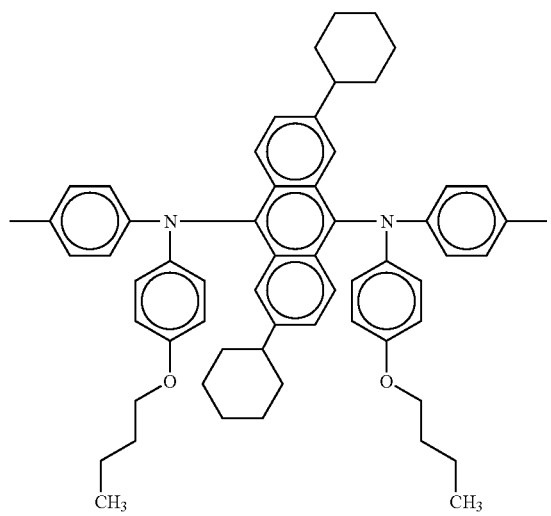
(O-16)
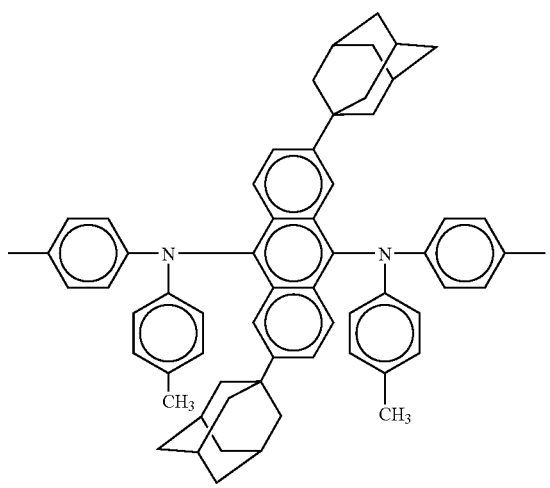
(O-17)
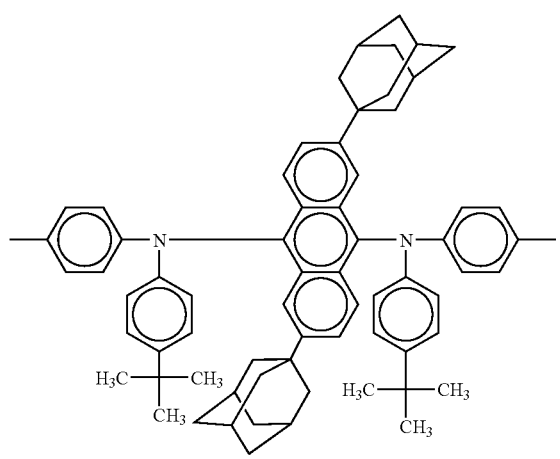
(O-18)
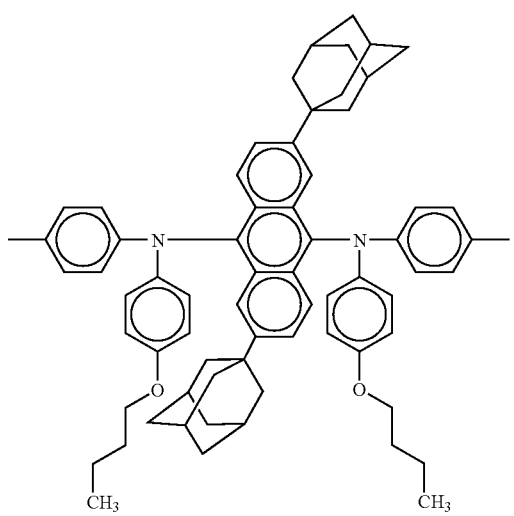

-continued
(P-1)
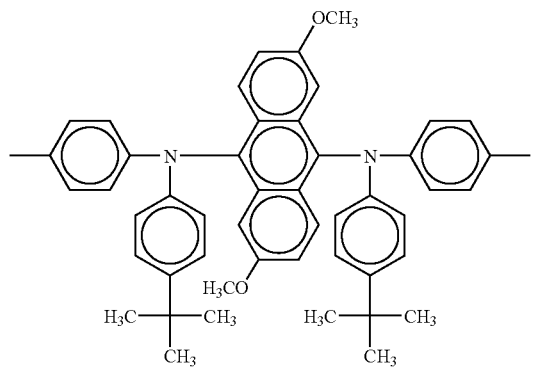
(P-2)
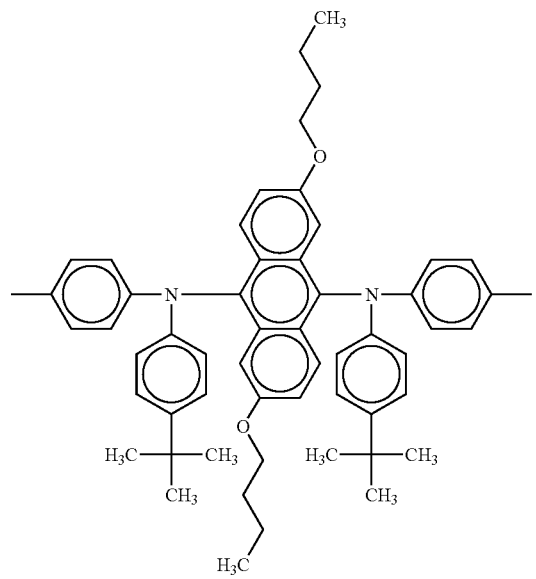
(P-3)
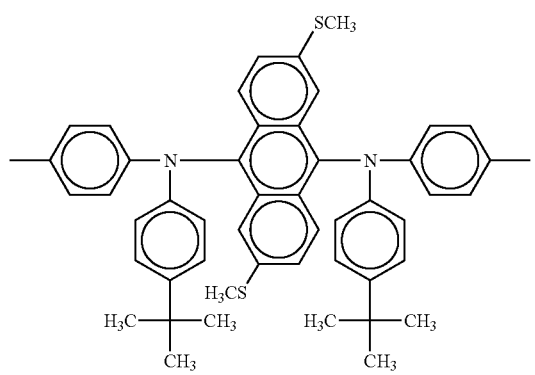
(P-4)
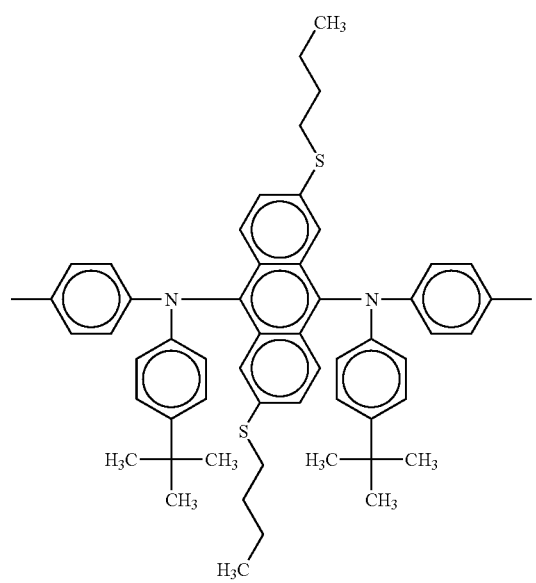

-continued
(P-5)
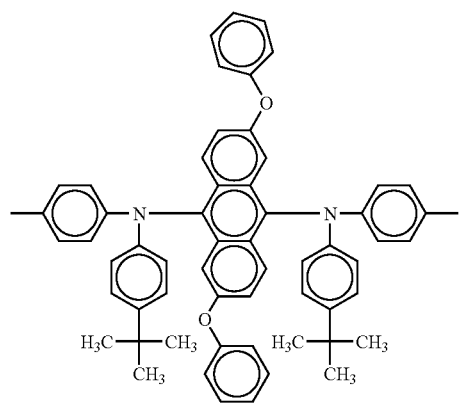
(P-6)
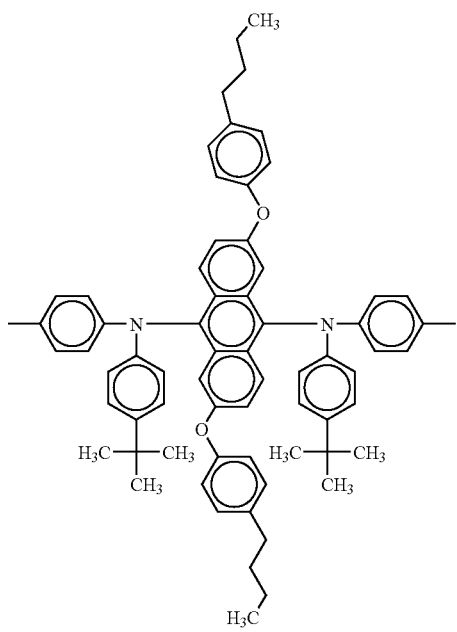
(P-7)
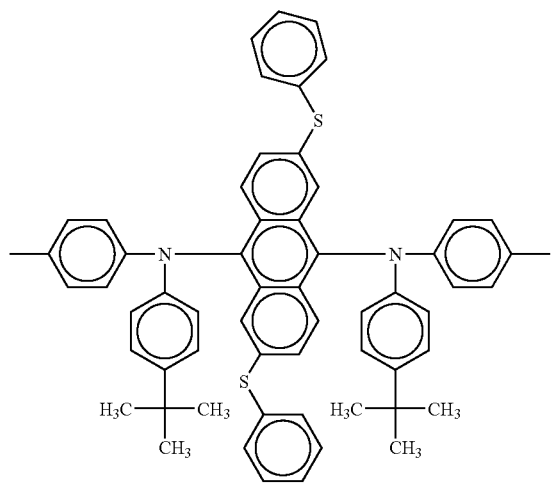
(P-8)
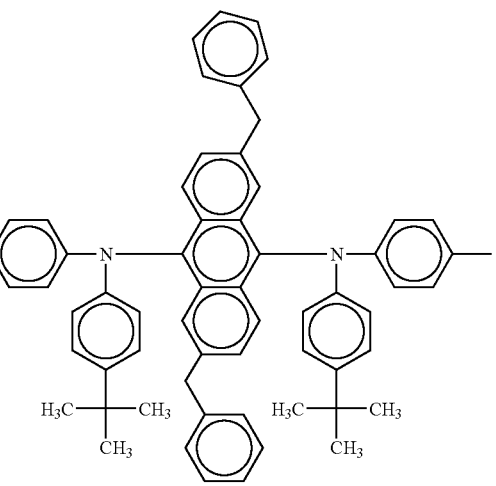

-continued
(P-9)
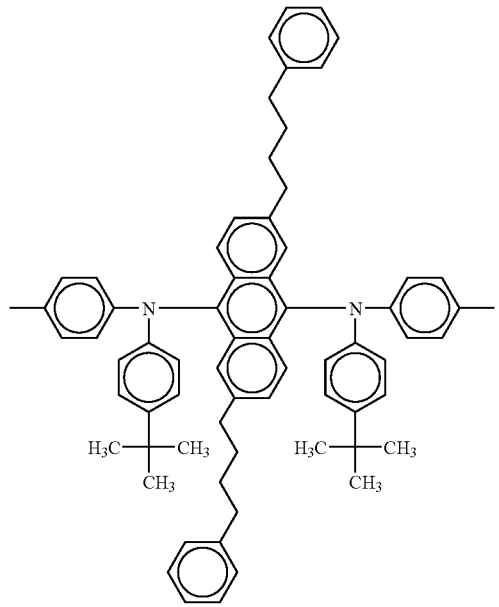
(P-10)
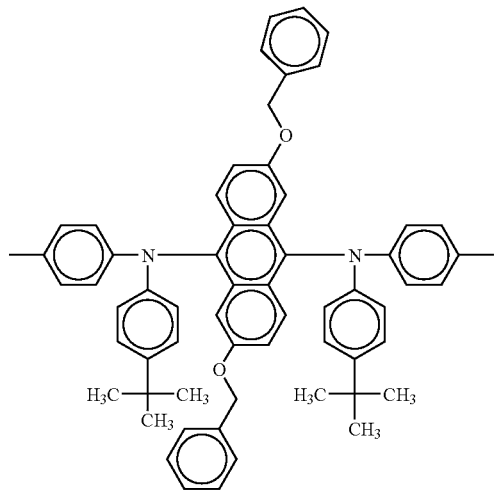
(P-11)
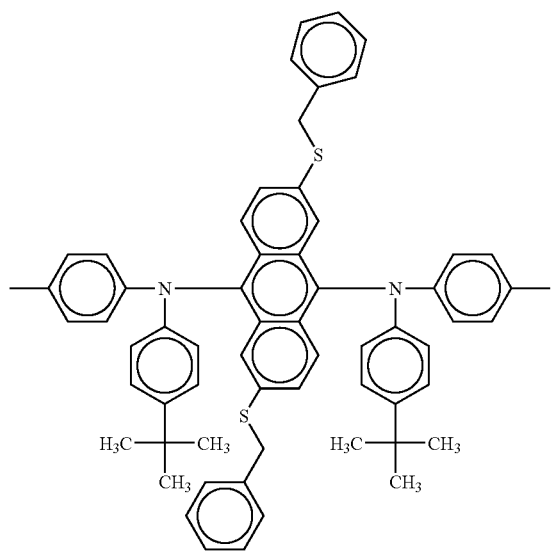
(Q-1)
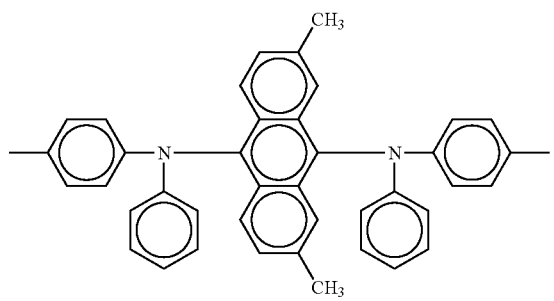
(Q-2)
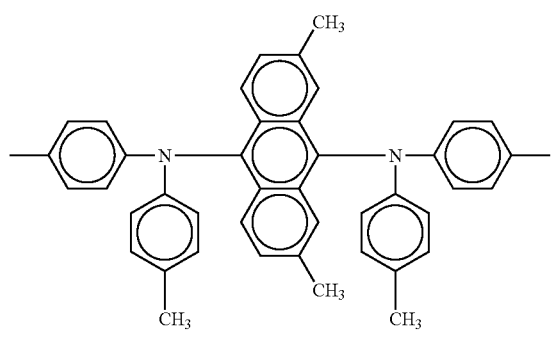
(Q-3)
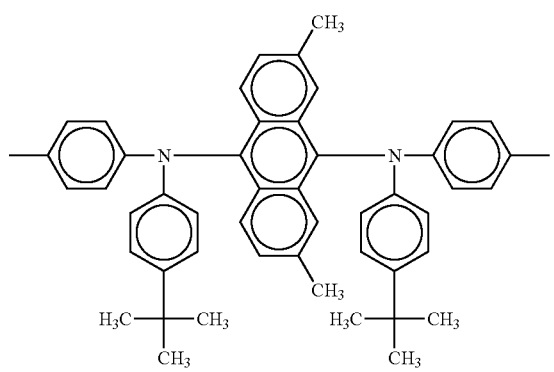

-continued
(Q-4)
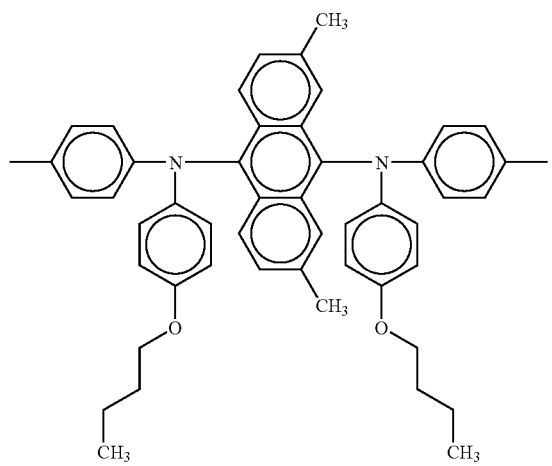
(Q-5)
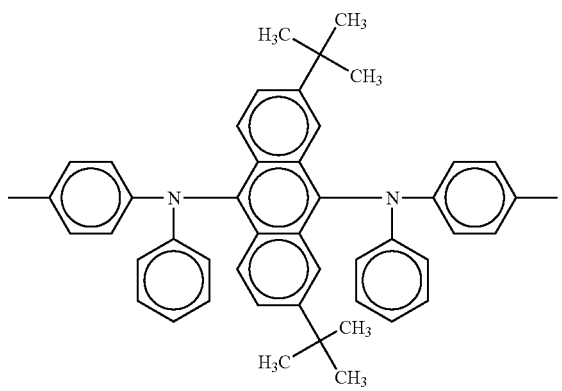
(Q-6)
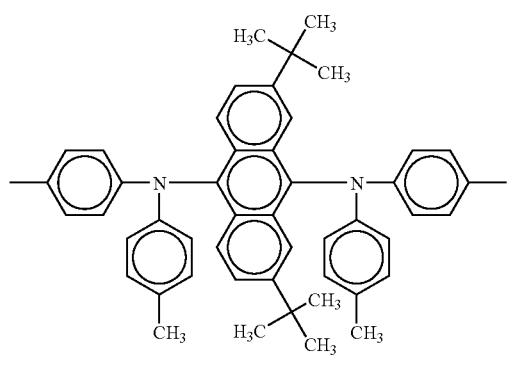
(Q-7)
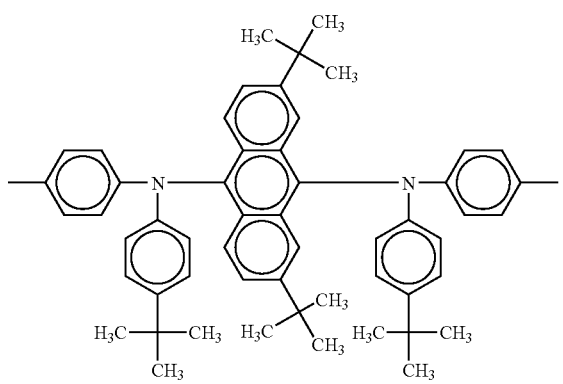
(Q-8)
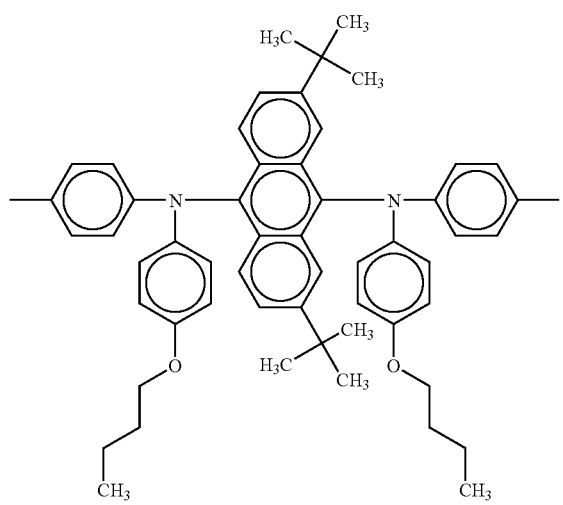
(R-1)
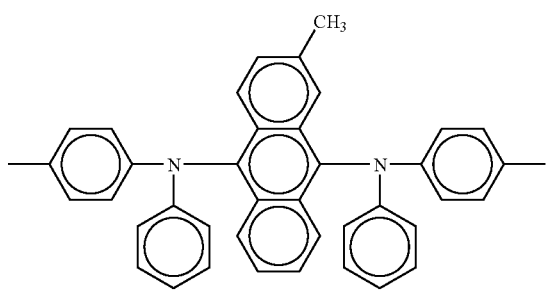

-continued
(R-2)
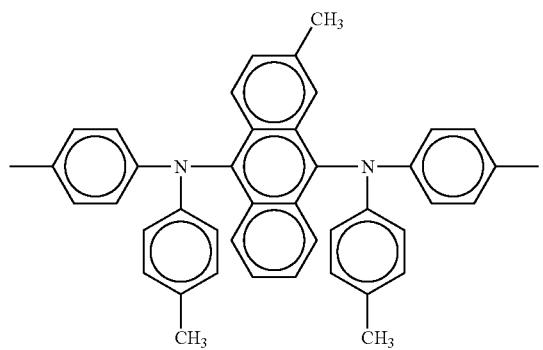
(R-3)
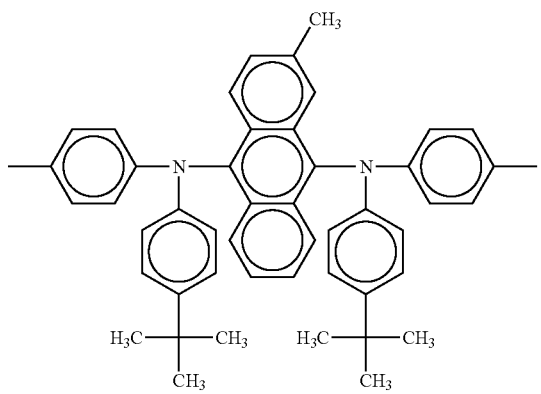
(R-4)
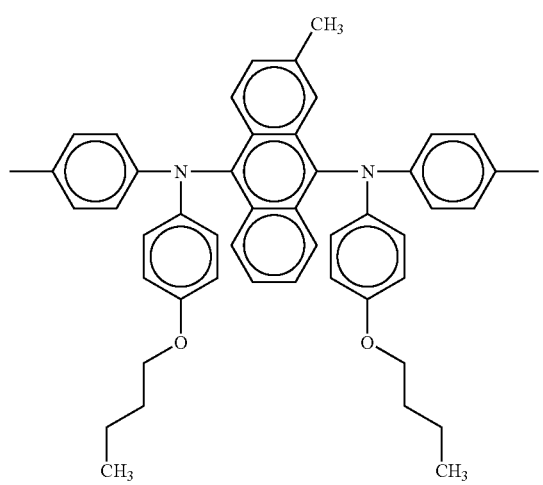
(R-5)
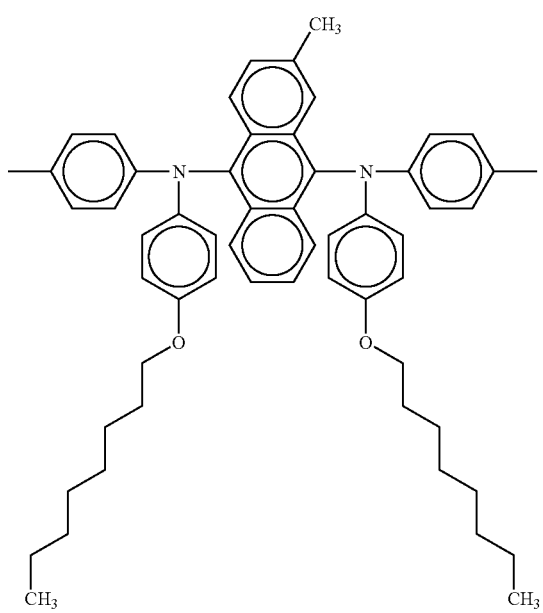
(R-6)
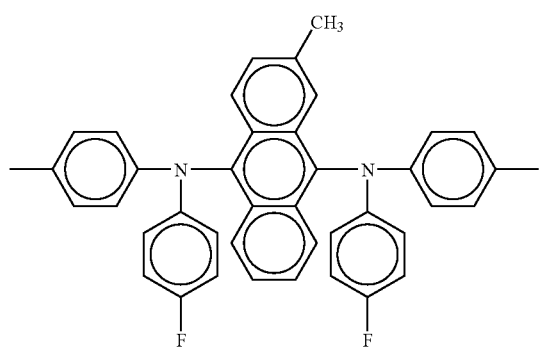
(R-7)
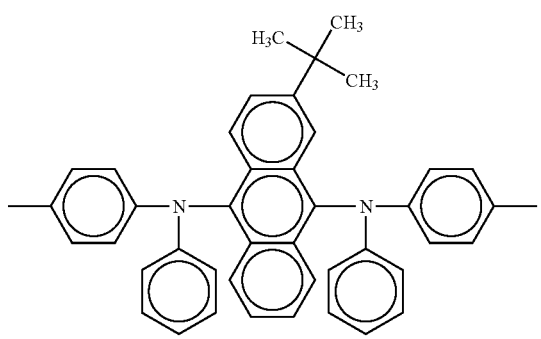

-continued (R-8)

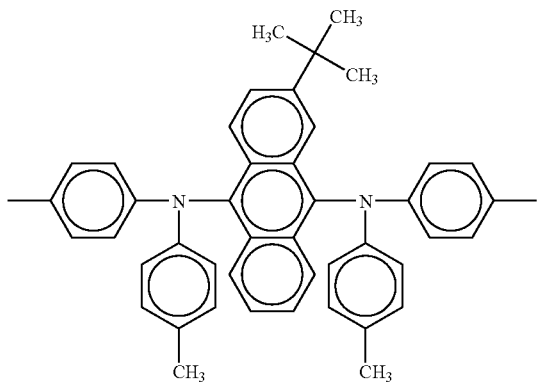

(R-9)

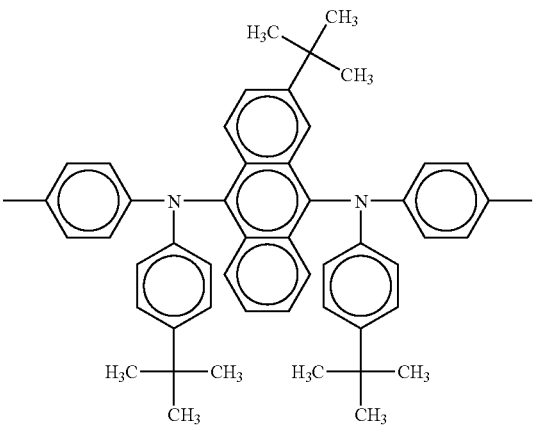

(R-10)

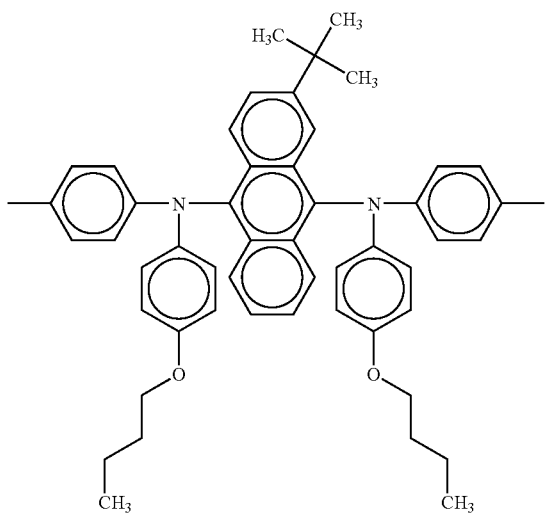

As the constitutional unit of the above-described formula (1B) (including those of the above-described (1C)), mentioned from the standpoint of a balance between the color purity of green light emission of a light emitting device obtained when used for fabrication of a light emitting device and easiness of synthesis of a monomer are preferably constitutional units of the above-described formulae (M-1) to (M-7), (N-1) to (N-16), (O-13) to (O-18), (R-1) to (R-10), more preferably constitutional units of the formulae (N-1) to (N-8), (R-2) to (R-3), (R-8) to (R-9), further preferably constitutional units of the formulae (N-7), (R-3).

It is preferable that the polymer compound of the present invention further contains at least one selected from the group consisting of a constitutional unit of the following formula (2), a constitutional unit of the following formula (3) and a constitutional unit of the following formula (4).

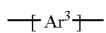 (2)

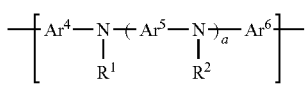 (3)

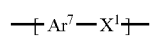 (4)

(wherein, $Ar^3$ and $Ar^7$ represent each independently an unsubstituted or substituted arylene group, an unsubstituted or substituted di-valent heterocyclic group or a di-valent group having a metal complex structure. $Ar^4$, $Ar^5$ and $Ar^6$ represent each independently an unsubstituted or substituted arylene group, an unsubstituted or substituted di-valent aromatic heterocyclic group or an unsubstituted or substituted di-valent group having two aromatic rings connected via a single bond. $R^1$ and $R^2$ represent each independently a hydrogen atom, alkyl group, aryl group, mono-valent heterocyclic group or arylalkyl group. $X^1$ represents —$CR^3$=$CR^4$— or —C≡C—. Here, $R^3$ and $R^4$ represent each independently a hydrogen atom, alkyl group, aryl group, mono-valent heterocyclic group, carboxyl group, substituted carboxyl group or cyano group. a represents 0 or 1.).

—Constitutional Unit of the Formula (2)—

The constitutional unit of the above-described formula (2) will be described.

In the above-described formula (2), $Ar^3$'s represent each independently an unsubstituted or substituted arylene group, an unsubstituted or substituted di-valent heterocyclic group or a di-valent group having a metal complex structure.

The above-described arylene group means an atomic group obtained by removing two hydrogen atoms from an aromatic hydrocarbon, and includes those having an independent benzene ring or condensed ring. The above-described arylene group has a carbon number of usually about 6 to 60, preferably 6 to 48, more preferably 6 to 30, further preferably 6 to 18, especially preferably 10 to 14, particularly preferably 7. This carbon number does not include the carbon number of the substituent.

Examples of the above-described arylene group include unsubstituted or substituted phenylene groups such as a 1,4-phenylene group, 1,3-phenylene group, 1,2-phenylene group and the like; unsubstituted or substituted naphthalenediyl groups such as a 1,4-naphthalenediyl group, 1,5-naphthalenediyl group, 2,6-naphthalenediyl group and the like; unsubstituted or substituted anthracenediyl groups such as a 1,4-anthracenediyl group, 1,5-anthracenediyl group, 2,6-anthracenediyl group, 9,10-anthracenediyl group and the like; unsubstituted or substituted phenanthrenediyl groups such as a 2,7-phenanthrenediyl group and the like; unsubstituted or substituted naphthacenediyl groups such as a 1,7-naphthacenediyl group, 2,8-naphthacenediyl group, 5,12-naphthacenediyl group and the like; unsubstituted or substituted fluorenediyl groups such as a 2,7-fluorenediyl group, 3,6-fluorenediyl group and the like; unsubstituted or substituted pyrenediyl groups such as a 1,6-pyrenediyl group, 1,8-pyrenediyl group, 2,7-pyrenediyl group, 4,9-pyrenediyl group and the like; unsubstituted or substituted perylenediyl groups such as a 3,9-perylenediyl group, 3,10-perylenediyl group and the like; etc., and preferably unsubstituted or substituted phenylene groups and unsubstituted or substituted fluorenediyl groups.

When the above-described arylene group has a substituent, examples thereof include preferably those selected from an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group, nitro group and cyano group, more preferably an alkyl group, alkoxy group, aryl group, aryloxy group, substituted amino group or mono-valent heterocyclic group, further preferably an alkyl group, alkoxy group or aryl group. The definitions and examples of the above-described alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group, nitro group and cyano group are the same as the definitions and examples explained in the section of a substituent when $Ar^1$ in the above-described formula (1) has a substituent.

The above-described di-valent heterocyclic group has a carbon number of usually about 4 to 60, preferably 4 to 48, more preferably 4 to 30, further preferably 6 to 22, especially preferably 6 to 12, particularly preferably 12. This carbon number does not include the carbon number of the substituent. Examples of the above-described di-valent heterocyclic group include unsubstituted or substituted pyridinediyl groups such as a 2,5-pyridinediyl group, 2,6-pyridinediyl group and the like; unsubstituted or substituted thiophenediyl groups such as a 2,5-thiophenediyl group and the like; unsubstituted or substituted furandiyl groups such as a 2,5-furandiyl group and the like; unsubstituted or substituted quinolinediyl groups such as a 2,6-quinolinediyl group and the like; unsubstituted or substituted isoquinolinediyl groups such as a 1,4-isoquinolinediyl group, 1,5-isoquinolinediyl group and the like; unsubstituted or substituted quinoxalinediyl groups such as a 5,8-quinoxalinediyl group and the like; unsubstituted or substituted benzo[1,2,5]thiadiazolediyl groups such as a 4,7-benzo[1,2,5]thiadiazolediyl group and the like; unsubstituted or substituted benzothiazolediyl groups such as a 4,7-benzothiazolediyl group and the like; unsubstituted or substituted carbazolediyl groups such as a 2,7-carbazolediyl group, 3,6-carbazolediyl group and the like; unsubstituted or substituted phenoxazinediyl groups such as a 3,7-phenoxazinediyl group and the like; unsubstituted or substituted phenothiazinediyl groups such as a 3,7-phenothiazinediyl group and the like; unsubstituted or substituted dibenzosiloledyl groups such as a 2,7-dibenzosiloledyl group and the like; etc., and preferably an unsubstituted or substituted benzo[1,2,5]thiadiazolediyl group, an unsubstituted or substituted phenoxazinediyl group, an unsubstituted or substituted phenothiazinediyl group.

When the above-described di-valent heterocyclic group has a substituent, examples thereof include preferably those selected from an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group, nitro group and cyano group, more preferably an alkyl group, alkoxy group, aryl group, aryloxy group, substituted amino group or mono-valent heterocyclic group, further preferably an alkyl group, alkoxy group or aryl group. The definitions and examples of the above-described alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group, nitro group and cyano group are the same as the definitions and examples explained in the section of a substituent when $Ar^1$ in the above-described formula (1) has a substituent.

The above-described di-valent group having a metal complex structure means an atomic group remaining after removal of two hydrogen atoms from an organic ligand of a metal complex having the organic ligand and a center metal.

The organic ligand has a carbon number of usually about 4 to 60. Examples of the above-described organic ligand include 8-quinolinol and derivatives thereof, benzoquinolinol and derivatives thereof, 2-phenyl-pyridine and derivatives thereof, 2-phenyl-benzothiazole and derivatives thereof, 2-phenyl-benzoxazole and derivatives thereof, porphyrin and derivatives thereof, and the like.

Examples of the center metal of the above-described metal complex include aluminum, zinc, beryllium, iridium, platinum, gold, europium, terbium and the like.

The above-described metal complex includes metal complexes known as low molecular weight fluorescent materials and phosphorescent materials, and triplet light emitting complexes, and the like.

Examples of the above-described di-valent group having a metal complex structure include groups of the following formulae 126 to 132.

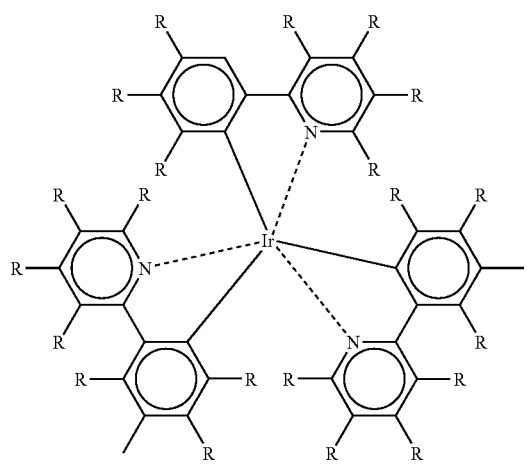
126
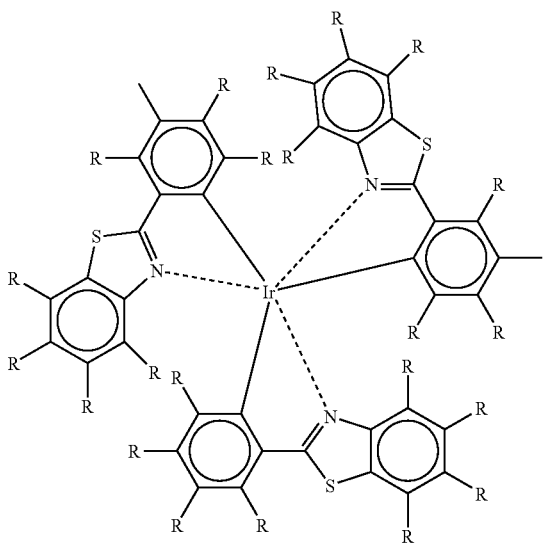
127
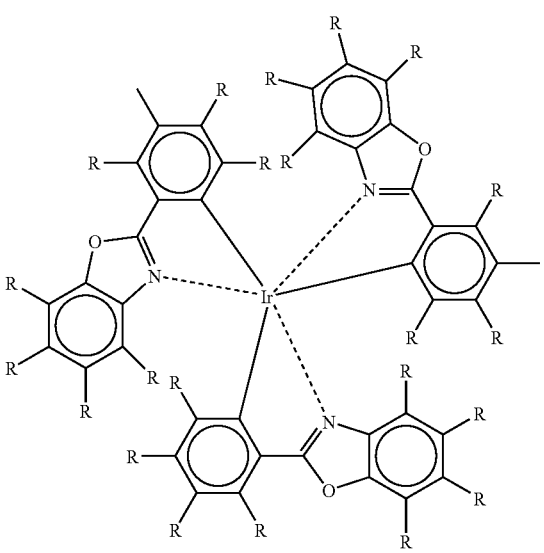
129
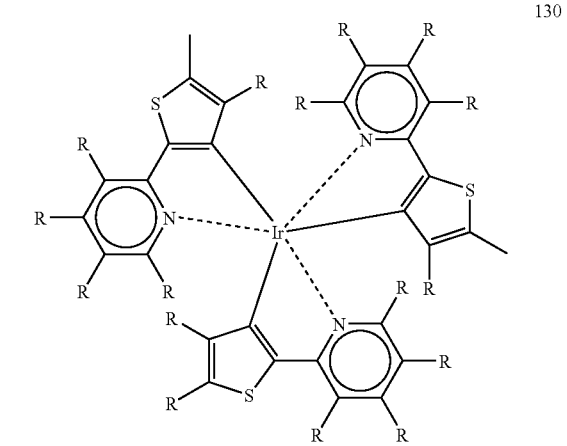
130
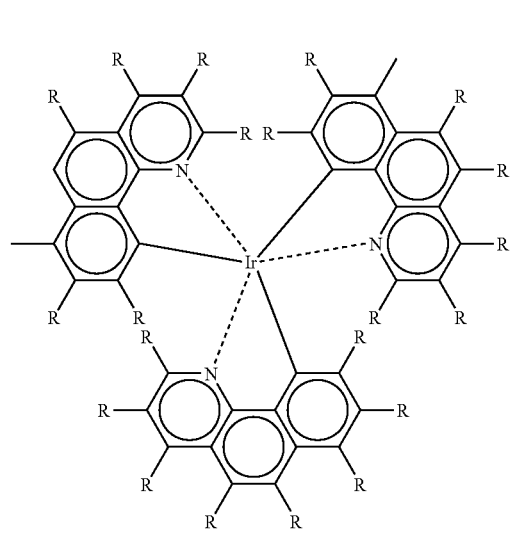
131

-continued

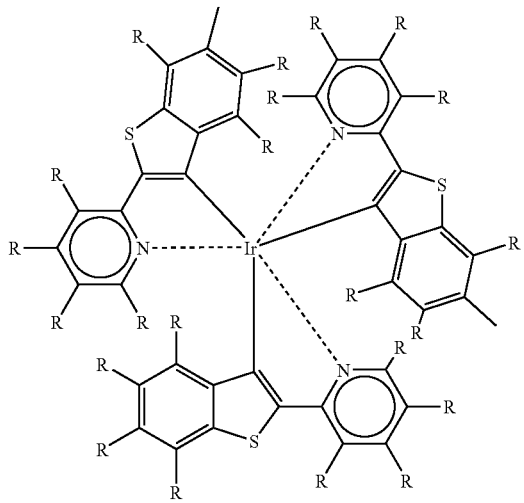

132

In the above-described formula 126 to 132, R's represent each independently a hydrogen atom, alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group or cyano group. A carbon atom in the divalent group of the above-described formulae 126 to 132 may be substituted by a nitrogen atom, oxygen atom or sulfur atom, and a hydrogen atom in the divalent group may be substituted by a fluorine atom.

The definitions, examples and preferable examples of the above-described alkyl group, alkoxy group, alkylthio group, aryl group, aryloxy group, arylthio group, arylalkyl group, arylalkoxy group, arylalkylthio group, arylalkenyl group, arylalkynyl group, substituted amino group, substituted silyl group, halogen atom, acyl group, acyloxy group, imine residue, amide group, acid imide group, mono-valent heterocyclic group, substituted carboxyl group are the same as the definitions and examples explained in the section of a substituent when $Ar^1$ in the above-described formula (1) has a substituent.

In the above-described formula (2), $Ar^a$ represents preferably an unsubstituted or substituted phenylene group such as an unsubstituted or substituted 1,4-phenylene group, an unsubstituted or substituted 1,3-phenylene group and the like; an unsubstituted or substituted naphthalenediyl group such as an unsubstituted or substituted 1,4-naphthalenediyl group, an unsubstituted or substituted 1,5-naphthalenediyl group, an unsubstituted or substituted 2,6-naphthalenediyl group and the like; an unsubstituted or substituted anthracenediyl group such as an unsubstituted or substituted 9,10-anthracenediyl group and the like; an unsubstituted or substituted phenanthrylenediyl group such as an unsubstituted or substituted 2,7-phenanthrylene group and the like; an unsubstituted or substituted naphthacenylene group such as an unsubstituted or substituted 5,12-naphthacenylene group and the like; an unsubstituted or substituted fluorenediyl group such as an unsubstituted or substituted 2,7-fluorenediyl group, an unsubstituted or substituted 3,6-fluorenediyl group and the like; an unsubstituted or substituted pyrenediyl group such as an unsubstituted or substituted 1,6-pyrenediyl group, an unsubstituted or substituted 1,8-pyrenediyl group and the like; an unsubstituted or substituted perylenediyl group such as an unsubstituted or substituted 3,9-perylenediyl group, an unsubstituted or substituted 3,10-perylenediyl group and the like; an unsubstituted or substituted pyridinediyl group; an unsubstituted or substituted thiophenediyl group; an unsubstituted or substituted furanediyl group; an unsubstituted or substituted dibenzosilolediyl group; an unsubstituted or substituted quinolinediyl group such as an unsubstituted or substituted 2,6-quinolinediyl group and the like; an unsubstituted or substituted isoquinolinediyl group such as an unsubstituted or substituted 1,4-isoquinolinediyl group, an unsubstituted or substituted 1,5-isoquinolinediyl group and the like; an unsubstituted or substituted quinoxalinediyl group such as an unsubstituted or substituted 5,8-quinoxalinediyl group and the like; an unsubstituted or substituted benzothiadiazolediyl group such as an unsubstituted or substituted 4,7-benzo[1,2,5]thiadiazolediyl group and the like; an unsubstituted or substituted phenoxazinediyl group such as an unsubstituted or substituted 3,7-phenoxazinediyl group and the like; an unsubstituted or substituted phenothiazinediyl group such as an unsubstituted or substituted 3,7-phenothiazinediyl group and the like, more preferably an unsubstituted or substituted phenylene group such as an unsubstituted or substituted 1,4-phenylene group and the like; an unsubstituted or substituted naphthalenediyl group such as an unsubstituted or substituted 1,4-naphthalenediyl group, an unsubstituted or substituted 1,5-naphthalenediyl group, an unsubstituted or substituted 2,6-naphthalenediyl group and the like; an unsubstituted or substituted anthracenediyl group such as an unsubstituted or substituted 9,10-anthracenediyl group and the like; an unsubstituted or substituted fluorenediyl group such as an unsubstituted or substituted 2,7-fluorenediyl group and the like; an unsubstituted or substituted pyrenediyl group such as an unsubstituted or substituted 1,6-pyrenediyl group and the like; an unsubstituted or substituted perylenediyl group such as an unsubstituted or substituted 3,9-perylenediyl group, an unsubstituted or substituted 3,10-perylenediyl group and the like; an unsubstituted or substituted quinolinediyl group such as an unsubstituted or substituted 2,6-quinolinediyl group and the like; an unsubstituted or substituted isoquinolinediyl group such as an unsubstituted or substituted 1,4-isoquinolinediyl group and the like; an unsubstituted or substituted quinoxalinediyl group such as an unsubstituted or substituted 5,8-quinoxalinediyl group and the like; an unsubstituted or substituted benzothiadiazolediyl group such as an unsubstituted or substituted 4,7-benzo[1,2,5]thiadiazolediyl group and the like; an unsubstituted or substituted phenoxazinediyl group such as an unsubstituted or substituted 3,7-phenoxazinediyl group and the like; an unsubstituted or substituted phenothiazinediyl group such as an unsubstituted or substituted 3,7-phenothiazinediyl group and the like, further preferably an unsubstituted or substituted phenylene group such as an unsubstituted or substituted 1,4-phenylene group and the like; an unsubstituted or substituted naphthalenediyl group such as an unsubstituted or substituted 1,4-naphthalenediyl group, an unsubstituted or substituted 1,5-naphthalenediyl group, an unsubstituted or substituted 2,6-naphthalenediyl group and the like; an unsubstituted or substituted anthracenediyl group such as an unsubstituted or substituted 9,10-anthracenediyl group and the like; an unsubstituted or substituted fluorenediyl group such as an unsubstituted or substituted 2,7-fluorenediyl group and the like; an unsubstituted or substituted quinoxalinediyl group such as an unsubstituted or substituted 5,8-quinoxalinediyl group and the like; an unsubstituted or substituted benzothiadiazolediyl group such as an unsubstituted or substituted 4,7-benzo[1,2,5]thiadiazolediyl group and the like; an unsubstituted or substituted phenoxazinediyl group such as an unsubstituted or substituted 3,7-phenoxazinediyl group and the like; an unsubstituted or substituted phenothiazinediyl group such as an unsubstituted or substituted 3,7-phenothiazinediyl group and the like, especially preferably an unsubstituted or substituted phenylene group such as an unsubstituted or substituted 1,4-phenylene group and the like; an unsubstituted or substituted fluorenediyl group such as an unsubstituted or substituted 2,7-fluorenediyl group and the like; an unsubstituted or substituted benzothiadiazolediyl group such as an unsubstituted or substituted 4,7-benzo[1,2,5]thiadiazolediyl group and the like; an unsubstituted or substituted phenoxazinediyl group such as an unsubstituted or substituted 3,7-phenoxazinediyl group and the like; an unsubstituted or substituted phenothiazinediyl group such as an unsubstituted or substituted 3,7-phenothiazinediyl group and the like, particularly preferably a di-valent group of the following formula (6) to (10):

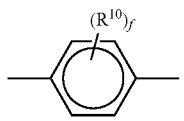

(6)

(wherein, $R^{10}$ represents an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group or cyano group. f represents an integer of 0 to 4. When there exist a plurality of $R^{10}$'s, these groups may be the same or different.)

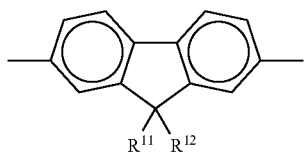

(7)

(wherein, $R^{11}$ and $R^{12}$ represent each independently a hydrogen atom, alkyl group, aryl group, arylalkyl group or mono-valent heterocyclic group.)

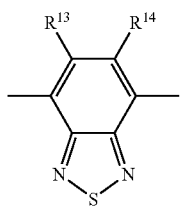

(8)

(wherein, $R^{13}$ and $R^{14}$ represent each independently a hydrogen atom, alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group, nitro group or cyano group.)

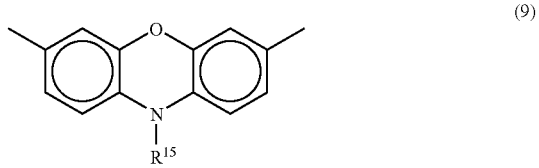

(9)

(wherein, $R^{15}$ represents a hydrogen atom, alkyl group, aryl group, mono-valent heterocyclic group or arylalkyl group.)

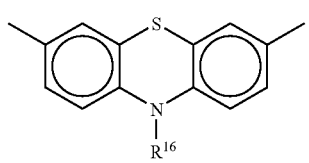

(10)

(wherein, $R^{16}$ represents a hydrogen atom, alkyl group, aryl group, mono-valent heterocyclic group or arylalkyl group.).

In the above-described formula (6), $R^{10}$ represents preferably an alkyl group, alkoxy group, aryl group, aryloxy group, arylalkyl group, arylalkoxy group, arylalkenyl group, arylalkynyl group, substituted amino group, acyl group or mono-valent heterocyclic group, more preferably an alkyl group, alkoxy group, aryl group, aryloxy group, substituted amino group, acyl group or mono-valent heterocyclic group, further preferably an alkyl group, alkoxy group, aryl group or mono-valent heterocyclic group, particularly preferably an alkyl group, alkoxy group or aryl group. The definitions and examples of the above-described alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group, nitro group and cyano group are the same as the definitions and examples explained in the section of a substituent when $Ar^1$ in the above-described formula (1) has a substituent.

In the above-described formula (6), f represents preferably an integer of 1 to 4, more preferably an integer of 1 to 3, further preferably 1 or 2, particularly preferably 2.

In the above-described formula (7), $R^{11}$ and $R^{12}$ represent each independently, preferably an alkyl group, aryl group or mono-valent heterocyclic group, more preferably an alkyl group or aryl group. The definitions and examples of the alkyl group, aryl group, arylalkyl group and mono-valent heterocyclic group are the same as the definitions and examples explained in the section of a substituent when $Ar^1$ in the above-described formula (1) has a substituent.

In the above-described formula (8), $R^{13}$ and $R^{14}$ represent each independently, preferably a hydrogen atom, alkyl group, alkoxy group, aryl group, aryloxy group, arylalkyl group, arylalkoxy group, substituted amino group, acyl group or mono-valent heterocyclic group, more preferably a hydrogen atom, alkyl group, alkoxy group, aryl group, aryloxy group or mono-valent heterocyclic group, further preferably a hydrogen atom or alkyl group, particularly preferably a hydrogen atom. The definitions and examples of the above-described alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group, nitro group and cyano group are the same as the definitions and examples explained in the section of a substituent when $Ar^1$ in the above-described formula (1) has a substituent.

In the above-described formula (9), $R^{15}$ represents preferably an alkyl group, aryl group or mono-valent heterocyclic group, more preferably an alkyl group or aryl group, further preferably an aryl group. The definitions and examples of the above-described alkyl group, aryl group, mono-valent heterocyclic group and arylalkyl group are the same as the definitions and examples explained in the section of a substituent when $Ar^1$ in the above-described formula (1) has a substituent.

In the above-described formula (10), $R^{16}$ represents preferably an alkyl group, aryl group or mono-valent heterocyclic group, more preferably an alkyl group or aryl group, further preferably an aryl group. The definitions and examples of the above-described alkyl group, aryl group, mono-valent heterocyclic group and arylalkyl group are the same as the definitions and examples explained in the section of a substituent when $Ar^1$ in the above-described formula (1) has a substituent.

—Constitutional Unit of the Formula (3)—

The constitutional unit of the above-described formula (3) will be described. The constitutional unit of the above-described formula (3) is different from the constitutional unit of the above-described formula (1).

In the above-described formula (3), $Ar^4$, $Ar^5$ and $Ar^6$ represent each independently an unsubstituted or substituted arylene group, an unsubstituted or substituted di-valent heterocyclic group or an unsubstituted or substituted di-valent group having two aromatic rings connected via a single bond.

The arylene group represented by $Ar^4$, $Ar^5$ and $Ar^6$ means an atomic group obtained by removing two hydrogen atoms from an aromatic hydrocarbon, and includes those having an independent benzene ring or condensed ring. The above-described arylene group has a carbon number of usually about 6 to 60, preferably 6 to 48, more preferably 6 to 30, further preferably 6 to 18, especially preferably 6 to 10, particularly preferably 6. This carbon number does not include the carbon number of the substituent. Examples of the above-described arylene group include a 1,3-phenylene group, 1,4-phenylene group, 1,4-naphthalenediyl group, 2,6-naphthalenediyl group, 9,10-anthracenediyl group, 2,7-phenanthrenediyl group, 5,12-naphthacenediyl group, 2,7-fluorenediyl group, 3,8-perylenediyl group and the like.

The di-valent heterocyclic group represented by $Ar^4$, $Ar^5$ and $Ar^6$ has a carbon number of usually about 4 to 60, preferably 4 to 20, more preferably 4 to 9, further preferably 4 to 5. Examples of the above-described di-valent heterocyclic group include a 2,5-thiophenediyl group, N-methyl-2,5-pyrrolediyl group, 2,5-furandiyl group, 2,5-pyridinediyl group, 2,6-pyridinediyl group, 2,4-quinolinediyl group, 2,6-quinolinediyl group, 1,4-isoquinolinediyl group, 1,5-isoquinolinediyl group, 4,7-benzo[1,2,5]thiadiazolediyl group, 3,7-phenoxazinediyl group, 3,6-carbazolediyl group and the like.

The di-valent group having two aromatic rings connected via a single bond (here, the aromatic ring includes those described in Chemical Dictionary first edition (Tokyo Kagaku Dojin), p. 1345) includes groups of the following formulae (3A-1) to formula (3A-8).

(3A-1)

(3A-2)

(3A-3)

(3A-4)

(3A-5)

(3A-6)

(3A-7)

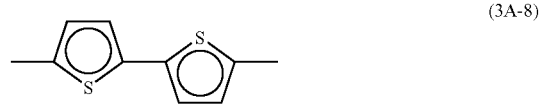
(3A-8)

When $Ar^4$, $Ar^5$ and $Ar^6$ have a substituent, examples thereof include preferably those selected from an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group, nitro group and cyano group, more preferably those selected from an alkyl group, alkoxy group, aryl group, aryloxy group, arylalkyl group, arylalkoxy group, substituted amino group, substituted silyl group, acyl group, substituted carboxyl group and cyano group, further preferably those selected from an alkyl group, alkoxy group, aryl group, aryloxy group, arylalkyl group, arylalkoxy group and substituted carboxyl group, especially preferably those selected from an alky group, alkoxy group and aryl group, particularly preferably an alkyl group. The definitions and examples of the above-described alkyl group, alkoxy group, alkylthio group, aryl group, aryloxy group, arylthio group, arylalkyl group, arylalkoxy group, arylalkylthio group, arylalkenyl group, arylalkynyl group, substituted amino group, substituted silyl group, halogen atom, acyl group, acyloxy group, imine residue, amide group, acid imide group, mono-valent heterocyclic group and substituted carboxyl group are the same as the definitions and examples explained in the section of a substituent when $Ar^1$ in the above-described formula (1) has a substituent.

$Ar^4$ and $Ar^6$ represent preferably an unsubstituted or substituted arylene group, more preferably an unsubstituted or substituted 1,3-phenylene group, an unsubstituted or substituted 1,4-phenylene group, an unsubstituted or substituted 1,4-naphthalenediyl group, an unsubstituted or substituted 2,6-naphthalenediyl group, an unsubstituted or substituted 2,5-pyridinediyl group, an unsubstituted or substituted 1,4-isoquinolinediyl group or an unsubstituted or substituted group of the formula (3A-1), further preferably an unsubstituted or substituted 1,4-phenylene group or an unsubstituted or substituted 1,4-naphthalenediyl group, particularly preferably an unsubstituted or substituted 1,4-phenylene group.

$Ar^5$ represents preferably an unsubstituted or substituted 1,3-phenylene group, an unsubstituted or substituted 1,4-phenylene group, an unsubstituted or substituted 1,4-naphthalenediyl group, an unsubstituted or substituted 2,7-fluorenediyl group, an unsubstituted or substituted 2,5-pyridinediyl group, an unsubstituted or substituted 1,4-isoquinolinediyl group, an unsubstituted or substituted 4,7-benzo[1,2,5]thiadiazolediyl group, an unsubstituted or substituted 3,7-phenoxazinediyl group, an unsubstituted or substituted group of the formula (3A-1) or an unsubstituted or substituted group of the formula (3A-4), more preferably an unsubstituted or substituted 1,4-phenylene group, an unsubstituted or substituted 1,4-naphthalenediyl group, an unsubstituted or substituted 2,7-fluorenediyl group, an unsubstituted or substituted 2,5-pyridinediyl group, an unsubstituted or substituted 1,4-isoquinolinediyl group or an unsubstituted or substituted group of the formula (3A-1), further preferably an unsubstituted or substituted 1,4-phenylene group or an unsubstituted or substituted group of the formula (3A-1).

$R^1$ and $R^2$ represent each independently preferably an alkyl group, aryl group or mono-valent heterocyclic group, more preferably an alkyl group or aryl group, further preferably an aryl group. The definitions and examples of the above-described alkyl group, aryl group, mono-valent heterocyclic group and arylalkyl group are the same as the definitions and examples explained in the section of a substituent when $Ar^1$ in the above-described formula (1) has a substituent.

Preferable examples of the constitutional unit of the above-described formula (3) include constitutional units of the following formulae (3B-1) to (3B-4). In these formulae, $R^a$ represents a hydrogen atom, alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group, nitro group or cyano group. A plurality of $R^a$'s may be the same or different. The definitions and examples of the above-described alkyl group, alkoxy group, alkylthio group, aryl group, aryloxy group, arylthio group, arylalkyl group, arylalkoxy group, arylalkylthio group, arylalkenyl group, arylalkynyl group, substituted amino group, substituted silyl group, halogen atom, acyl group, acyloxy group, imine residue, amide group, acid imide group, mono-valent heterocyclic group and substituted carboxyl group are the same as the definitions and examples explained in the section of a substituent when $Ar^1$ in the above-described formula (1) has a substituent.

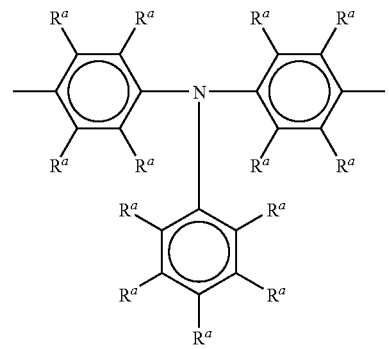

(3B-1)

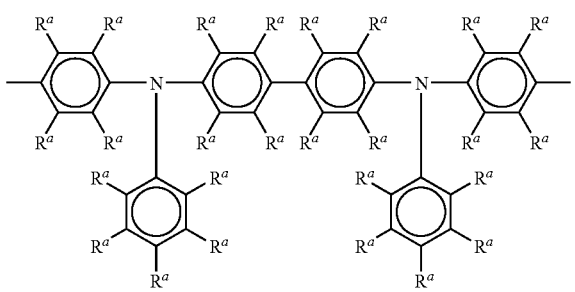

(3B-2)

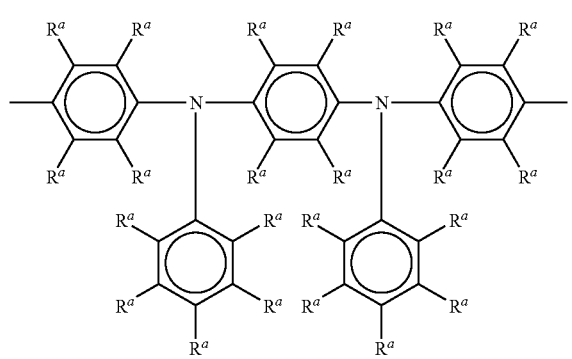

(3B-3)

(3B-4)

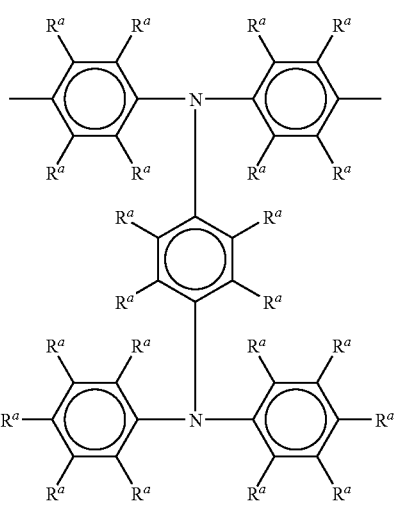

—Constitutional Unit of the Formula (4)—

The constitutional unit of the above-described formula (4) will be described.

$Ar^7$ represents an unsubstituted or substituted arylene group, an unsubstituted or substituted di-valent heterocyclic group or a di-valent group having a metal complex structure.

Here, the definitions and examples of the unsubstituted or substituted arylene group, unsubstituted or substituted di-valent heterocyclic group or di-valent group having a metal complex structure are the same as the definitions and examples explained in the above-described section of $Ar^3$.

$X^1$ represents —$CR^3$=$CR^4$— or —C≡C—.

$R^3$ and $R^4$ represent each independently preferably a hydrogen atom, alkyl group or aryl group, more preferably a hydrogen atom or aryl group. The group represented by $R^3$ and $R^4$ may have a substituent. The definitions and examples of the above-described alkyl group, aryl group, mono-valent heterocyclic group and substituted carboxyl group are the same as the definitions and examples explained in the section of a substituent when $Ar^1$ in the above-described formula (1) has a substituent.

As preferable examples of the constitutional unit of the above-described formula (4), the following formulae (4A-1) to (4A-11) are mentioned.

(4A-1)
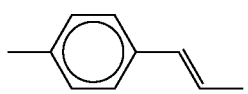

(4A-2)
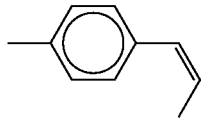

(4A-3)
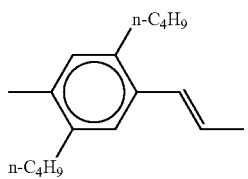

(4A-4)
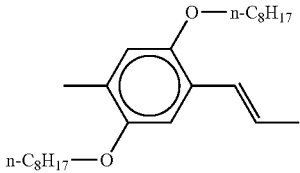

(4A-5)
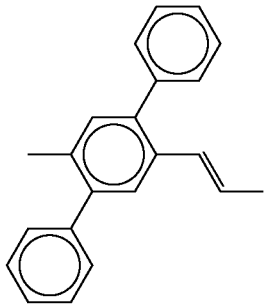

(4A-6)
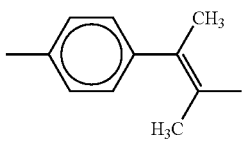

(4A-7)
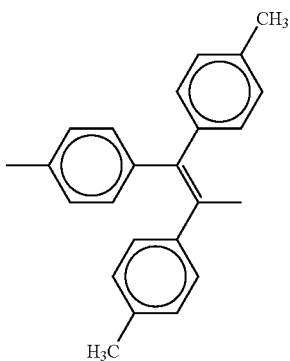

(4A-8)
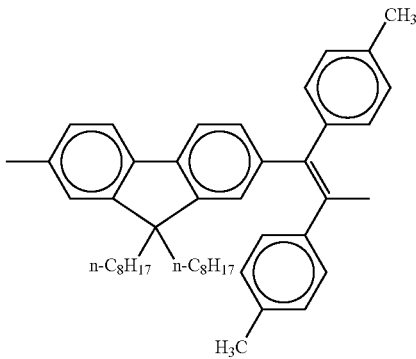

(4A-9)
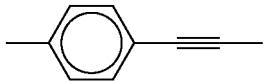

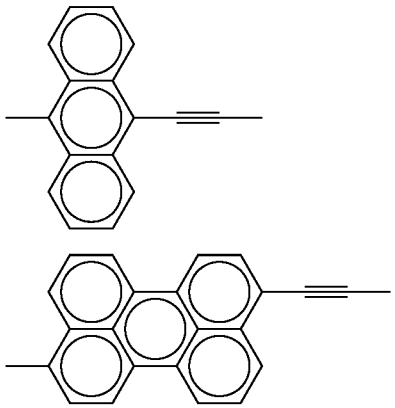
(4A-10)

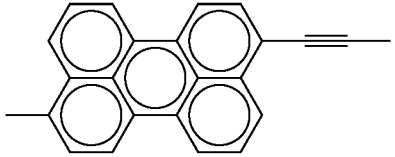
(4A-11)

In the polymer compound of the present invention, the total mole number of the constitutional unit of the formula (1), the constitutional unit of the formula (2), the constitutional unit of the formula (3) and the constitutional unit of the formula (4) with respect to the total mole number of all constitutional units is preferably 90 to 100%, more preferably 95 to 100%, further preferably 98 to 100%, particularly preferably 100%, from the standpoint of the heat resistance of the polymer compound, device properties thereof (light emission efficiency, life) and the like.

In the polymer compound of the present invention, the total mole number of the constitutional unit of the formula (1), the repeating unit of the formula (2) and the repeating unit of the formula (3) with respect to the total mole number of all constitutional units is preferably 90 to 100%, more preferably 95 to 100%, further preferably 98 to 100%, particularly preferably 100%, from the standpoint of the heat resistance of the polymer compound, device properties thereof (light emission efficiency, life) and the like.

In the polymer compound of the present invention, the total mole number of the constitutional unit of the formula (1) with respect to the total mole number of all constitutional units is preferably 0.01 to 90%, more preferably 0.1 to 50%, further preferably 0.5 to 10%, particularly preferably 1 to 5%, from the standpoint of the device properties of the polymer compound (light emission efficiency, life) and the like.

As the polymer compound of the present invention, preferable are those containing at least one constitutional unit of the formula (1) and at least one selected from the group consisting of a constitutional unit of the formula (2) and a constitutional unit of the formula (3), more preferable are those containing at least one constitutional unit of the formula (1) and at least one selected from the group consisting of a constitutional unit of the formula (7) and a constitutional unit of the formula (9), and particularly preferable are those containing at least one constitutional unit of the formula (1), at least one constitutional unit of the formula (7) and at least one constitutional unit of the formula (9), and those containing at least one constitutional unit of the formula (1), at least one constitutional unit of the formula (7) and at least one constitutional unit of the above-described formulae (3B-1) to (3B-4).

The polymer compound of the present invention has a polystyrene-equivalent number average molecular weight (Mn) by gel permeation chromatography (hereinafter, referred to as "GPC") of usually about $1 \times 10^3$ to $1 \times 10^8$, preferably $1 \times 10^4$ to $1 \times 10^6$. The polystyrene-equivalent weight average molecular weight is usually about $1 \times 10^3$ to $1 \times 10^8$, and from the standpoint of film formability and from the standpoint of efficiency when made into a device, it is preferably $1 \times 10^4$ to $5 \times 10^6$, more preferably $3 \times 10^4$ to $1 \times 10^6$, further preferably $5 \times 10^4$ to $5 \times 10^5$.

When a polymerization active group remains intact on the end of the polymer compound of the present invention, there is a possibility of lowering of light emission property and life when the polymer compound is used for fabrication of a light emitting device, thus, it is preferable that the end group is a stable group. Those having a conjugated bond to the main chain are preferable, and for example, structures containing bonding to an aryl group or heterocyclic group via a carbon-carbon bond are mentioned, and specifically, substituents described in JP-A No. 9-45478, chemical formula 10, and the like are mentioned.

In the polymer compound of the present invention, constitutional units of the formula (1), and constitutional units of the formulae (2) to (4) may be contained singly or in combination with another or more.

The polymer compound of the present invention may be any copolymer, and for example, may be any of block copolymers, random copolymers, alternating copolymers, graft copolymers and the like.

The polymer compound of the present invention is useful as a light emitting material, charge transporting material or the like, and may be used together with other compound having high molecular weight in use (that is, may be used as a composition described later).

<Method of Producing Polymer Compound>

Next, preferable methods of producing a polymer compound of the present invention will be described.

The polymer compound of the present invention can be produced by, for example, condensation-polymerizing at least one compound of the following formula (a), and further, if necessary, at least one compound selected from the group consisting of a compound of the following formula (b-1), a compound of the following formula (b-2) and a compound of the following formula (b-3).

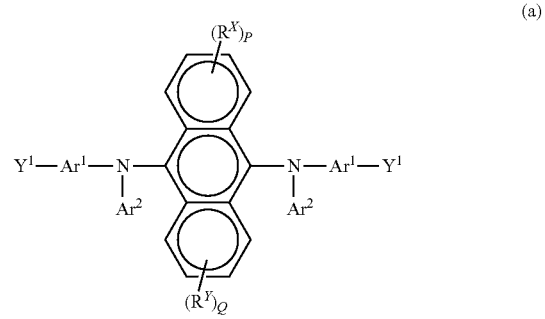
(a)

(wherein, $Ar^1$, $Ar^2$, $R^x$, $R^Y$, P and Q represent the same meanings as described above. $Y^1$ represents a halogen atom, sulfonate group of the following formula (a-1), methoxy group, borate residue, boronic acid residue (namely, $-B(OH)_2$), group of the following formula (a-2), group of the following formula (a-3) or group of the following formula (a-4). A plurality of $Y^1$'s may be the same or different.)

$$Y^1-Ar^3-Y^1 \quad \text{(b-1)}$$

(wherein, $Ar^3$ and $Y^1$ represent the same meanings as described above. A plurality of $Y^1$'s may be the same or different.)

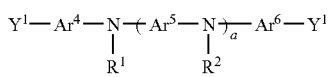 (b-2)

(wherein, $Ar^4$, $Ar^5$, $Ar^6$, $R^1$, $R^2$, $Y^1$ and a represent the same meanings as described above. A plurality of $Y^1$'s may be the same or different.)

$$Y^1-Ar^7-X^1-Y^1 \quad (b\text{-}3)$$

(wherein, $Ar^7$, $X^1$ and $Y^1$ represent the same meanings as described above. A plurality of $Y^1$'s may be the same or different.)

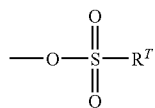 (a-1)

(wherein, $R^T$ represents an unsubstituted or substituted alkyl group or an unsubstituted or substituted aryl group.)

$$-MgX_A \quad (a\text{-}2)$$

(wherein, $X_A$ represents a halogen atom.)

$$ZnX_A \quad (a\text{-}3)$$

(wherein, $X_A$ represents the same meaning as described above.)

$$-Sn(R^T)_3 \quad (a\text{-}4)$$

(wherein, $R^T$ represents the same meaning as described above. A plurality of $R^T$'s may be mutually the same or different.).

In the above-described formulae (a), (b-1) to (b-3), (a-2) and (a-3), the halogen atoms represented by $Y^1$ and $X_A$ include a chlorine atom, bromine atom and iodine atom.

In the above-described formulae (a), (b-1) to (b-3), the borate residue represented by $Y^1$ includes, for example, groups of the following formulae.

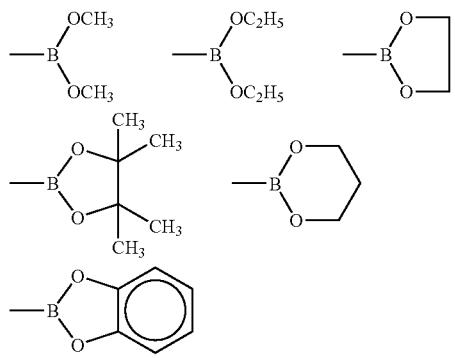

The definitions and examples of the alkyl group and aryl group represented by $R^T$ in the above-described formula (a-1) are the same as the definitions and examples explained in the section of a substituent when $Ar^1$ in the above-described formula (1) has a substituent.

Examples of the sulfonate group of the above-described formula (a-1) include a methanesulfonate group, trifluoromethanesulfonate group, phenylsulfonate group, 4-methylphenylsulfonate group and the like.

The definitions and examples of the alkyl group and aryl group represented by $R^T$ in the above-described formula (a-4) are the same as the definitions and examples explained in the section of a substituent when $Ar^1$ in the above-described formula (1) has a substituent. Examples of the group of the above-described formula (a-4) include a trimethylstannanyl group, triethylstannanyl group, tributylstannanyl group and the like.

As the compounds of the above-described formulae (a), (b-1) to (b-3), those previously synthesized and isolated may be used, and those prepared in the reaction system may be used as they are.

In the above-described formulae (a), (b-1) to (b-3), $Y^1$ represents preferably a halogen atom, borate residue or boronic acid residue from the standpoint of simplicity of synthesis of the compounds of the above-described formulae (a), (b-1) to (b-3) and easiness of handling thereof.

As the above-described condensation polymerization method, a method is mentioned in which the compounds of the above-described formulae (a), (b-1) to (b-3) are reacted using, if necessary, a suitable catalyst and a suitable base.

As the above-described catalyst, for example, catalysts are mentioned composed of a transition metal complex such as palladium complexes such as palladium[tetrakis(triphenylphosphine)], [tris(dibenzylideneacetone)]dipalladium, palladium acetate and the like, nickel complexes such as nickel[tetrakis(triphenylphosphine)], [1,3-bis(diphenylphosphino)propane]dichloronickel, [bis(1,4-cyclooctadiene)]nickel and the like, and if necessary, further of a ligand such as triphenylphosphine, tri(t-butylphosphine), tricyclohexylphosphine, diphenylphosphinopropane, bipyridyl and the like. As the above-described catalyst, those previously synthesized may be used, and those prepared in the reaction system may be used as they are. The above-described catalysts may be used singly or in combination with another or more.

In the case of use of the above-described catalyst, its amount is not particularly restricted, and the amount of the transition metal compound with respect to the sum of the mole numbers of the compounds of the formulae (a), (b-1) to (b-3) is preferably 0.00001 to 3 mol equivalent, more preferably 0.00005 to 0.5 mol equivalent, further preferably 0.0001 to 0.2 mol equivalent.

Examples of the above-described base include inorganic bases such as sodium carbonate, potassium carbonate, cesium carbonate, potassium fluoride, cesium fluoride, tripotassium phosphate and the like, and organic bases such as tetrabutylammonium fluoride, tetrabutylammonium chloride, tetrabutylammonium bromide, tetrabutylammonium hydroxide and the like.

In the case of use of the above-described base, its amount is not particularly restricted, and preferably 0.5 to 20 mol equivalent, more preferably 1 to 10 mol equivalent with respect to the sum of the mole numbers of the compounds of the formulae (a), (b-1) to (b-3).

The above-described condensation polymerization may be carried out in the absence of a solvent or in the presence of a solvent, and usually, it is carried out in the presence of an organic solvent.

The above-described organic solvent includes, for example, toluene, xylene, mesitylene, tetrahydrofuran, 1,4-dioxane, dimethoxyethane, N,N-dimethylacetamide, N,N-dimethylformamide and the like, though it varies depending on the kind and the reaction of the compounds of the formulae (a), (b-1) to (b-3). In general, a deoxidation treatment is desirably carried out for suppressing side reactions. These organic solvents may be used singly or in combination with another or more.

The use amount of the above-described organic solvents is so adjusted that the total concentration of the compounds of the formulae (a), (b-1) to (b-3) is usually 0.1 to 90 wt %, preferably 1 to 50 wt %, more preferably 2 to 30 wt %.

The reaction temperature of the above-described condensation polymerization is not particularly restricted and preferably −100° C. to 200° C., more preferably −80° C. to 150° C., further preferably 0° C. to 120° C.

The above-described reaction time is usually 1 hour or longer, preferably 2 to 500 hours, depending on conditions such as the reaction temperature and the like.

The above-described condensation polymerization is desirably carried out under anhydrous conditions in some cases. For example, when $Y^1$ in the above-described formulae (a), (b-1) to (b-3) is a group of the above-described formula (a-2), the condensation polymerization is carried out under anhydrous conditions.

The above-described condensation polymerization method includes, for example, a method of polymerization by the Suzuki reaction (Chem. Rev., vol. 95, p. 2457 (1995)), a method of polymerization by the Grignard reaction (Kyoritsu Publication, Polymer Functional Material Series (kobunshi kino zairyo series), vol. 2, Synthesis and Reaction of Polymer (2) (Kobunshi no Gosei to Hanno (2)), p. 432 to 433), a method of polymerization by the Yamamoto Polymerization method (Prog. Polym. Sci., vol. 17, p. 1153 to 1205, 1992), and the like.

The post treatment of the above-described condensation polymerization can be carried out by known methods, and for example, there are mentioned methods in which the reaction solution obtained in the above-described condensation polymerization is added to a lower alcohol such as methanol and the like to deposit a precipitate which is then filtrated and dried.

A polymer compound of the present invention is obtained by the above-described post treatment, and when the purity of the polymer compound is low, it may be advantageously purified by usual methods such as re-crystallization, continuous extraction with a Soxlet extractor, column chromatography and the like.

The compound of the above-described formula (a) can be produced, for example, by a method via a coupling reaction of correspondent 9,10-dibromoanthracene and diarylamine, a method via a condensation reaction of correspondent anthraquinone, and the like.

<Composition>

The composition of the present invention comprises at least one material selected from the group consisting of hole transporting material, electron transporting materials and light emitting materials, and a polymer compound of the present invention. This composition can be used, for example, as a light emitting material or charge transporting material.

The content ratio of the above-described at least one material selected from the group consisting of hole transporting material, electron transporting materials and light emitting materials to the polymer compound of the present invention may be determined according to its application, and in the case of application of a light emitting material, the weight of the polymer compound of the present invention is usually 20 to 99 parts by weight, preferably 40 to 95 parts by weight with respect to 100 parts by weight of the weight of the whole composition.

The composition of the present invention can also be prepared in the form of solution (referred to also as "ink composition") by allowing the composition to contain a solvent such as an organic solvent and the like, as described later. The details will be described later.

The composition of the present invention has a polystyrene-equivalent number average molecular weight of usually about $1 \times 10^3$ to $1 \times 10^8$, preferably $1 \times 10^4$ to $1 \times 10^6$. The polystyrene-equivalent weight average molecular weight is usually about $1 \times 10^3$ to $1 \times 10^8$, and from the standpoint of film formability and from the standpoint of light emission efficiency of the resultant device, it is preferably $1 \times 10^4$ to $5 \times 10^6$. Here, the average molecular weight of the composition of the present invention is a value obtained by analyzing the composition by GPC.

<Solution (Ink Composition)>

The solution of the present invention comprises a polymer compound of the present invention, and a solvent. In another embodiment, the solution of the present invention comprises a composition of the present invention containing a solvent. This solution is useful for a printing method and the like. The solution of the present invention may also contain a hole transporting material, electron transporting material, light emitting material, stabilizer, thickener (compound of high molecular weight and poor solvent for increasing viscosity), compound of low molecular weight for decreasing viscosity, surfactant (for lowering surface tension), antioxidant and the like, in addition to the above-described polymer compound and solvent.

The proportion of the polymer compound of the present invention in the solution of the present invention is usually 0.1 to 99.9 parts by weight, preferably 0.1 to 10 parts by weight, more preferably 0.2 to 7 parts by weight and further preferably 0.5 to 2 parts by weight with respect to 100 parts by weight of the solution.

The viscosity of the solution of the present invention may be regulated according to the kind of a printing method, and when the solution passes through a discharging apparatus such as in an ink jet print method and the like, the viscosity at 25° C. is preferably in the range of 1 to 20 mPa·s, for preventing clogging and flying curving in discharging.

As the above-described high molecular weight compound used as the thickener, those soluble in the same solvent as for the polymer compound of the present invention and not disturbing light emission and charge transportation may be permissible, and for example, high molecular weight polystyrene, high molecular weight polymethyl methacrylate and the like can be used. These high molecular weight compounds have a polystyrene-equivalent weight average molecular weight of preferably 500000 or more, more preferably 1000000 or more.

Also a poor solvent can be used as the thickening agent. The viscosity can be enhanced by adding a small amount of poor solvent for solid components in the solution. When a poor solvent is added for this purpose, the kind of the solvent and the addition amount thereof may be advantageously selected in a range not causing deposition of solid components in the solution. When also stability in preservation is taken into consideration, the amount of the poor solvent is preferably 50 parts by weight or less, further preferably 30 parts by weight or less with respect to 100 parts by weight of the whole solution.

The above-described antioxidant is used for improving the preservation stability of the solution of the present invention.

As the above-described antioxidant, those soluble in the same solvent as for the polymer compound of the present invention and not disturbing light emission and charge transportation may be permissible, and examples include phenol antioxidants, phosphorus antioxidants and the like.

The solvent in the solution of the present invention is not particularly restricted, and those capable of dissolving or uniformly dispersing solid components in the solution are preferable. Examples of the solvent include chlorine-based solvents such as chloroform, methylene chloride, 1,2-dichloroethane, 1,1,2-trichloroethane, chlorobenzene, o-dichlorobenzene and the like, ether solvents such as tetrahydrofuran, dioxane, anisole and the like, aromatic hydrocarbon solvents such as toluene, xylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone, benzophenone, acetophenone and the like, ester solvents such as ethyl acetate, butyl acetate, ethyl cellosolve acetate, methyl benzoate, phenyl acetate and the like, poly-hydric alcohols, such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and the like and derivatives thereof, alcohol solvents such as methanol, ethanol, propanol, isopropanol, cyclohexanol and the like, sulfoxide solvents such as dimethyl sulfoxide and the like, amide solvents such as N-methyl-2-pyrrolidone, N,N-dimethylformamide and the like. These solvents may be used singly or in combination with another or more. Of them, aromatic hydrocarbon solvents, ether solvents, aliphatic hydrocarbon solvents, ester solvents and ketone solvents are preferable, and toluene, xylene, ethylbenzene, diethylbenzene, trimethylbenzene, n-propylbenzene, isopropylbenzene, n-butylbenzene, isobutylbenzene, s-butylbenzene, n-hexylbenzene, cyclohexylbenzene, 1-methylnaphthalene, tetralin, anisole, ethoxybenzene, cyclohexane, bicyclohexyl, cyclohexenyl cyclohexanone, n-heptylcyclohexane, n-hexylcyclohexane, decalin, methyl benzoate, cyclohexanone, 2-propylcyclohexanone, 2-heptanone, 3-heptanone, 4-heptanone, 2-octanone, 2-nonanone, 2-decanone, dicyclohexyl ketone, acetophenone and benzophenone are more preferable, from the standpoint of the solubility of the polymer compound of the present invention, uniformity in film formation, viscosity property, and the like.

Two or more of the above-described solvents are preferably used in combination, two to three of the above-described solvents are more preferably used in combination, and two of the above-described solvents are particularly preferably used in combination, from the standpoint of film formability, device properties and the like.

When two solvents are contained in the solution of the present invention, one of them may be solid at 25° C. From the standpoint of film formability, it is preferable that one solvent has a boiling point of 180° C. or higher, and it is more preferable that one solvent has a boiling point of 200° C. or higher. From the standpoint of viscosity, it is preferable that 1 wt % or more of an aromatic polymer is dissolved at 60° C. in both of two solvents, and it is preferable that 1 wt % or more of an aromatic polymer is dissolved at 25° C. in one of two solvents.

When two or more solvents are contained in the solution of the present invention, the proportion of a solvent having highest boiling point is preferably 40 to 90 wt %, more preferably 50 to 90 wt %, further preferably 65 to 85 wt % with respect to the weight of all solvents in the solution, from the standpoint of viscosity and film formability.

One or two or more kinds of polymer compounds of the present invention may be contained in the solution of the present invention, and a compound of high molecular weight other than the polymer compound may also be contained in a range not deteriorating device properties and the like.

In the solution of the present invention, water, metals and salts thereof may also be contained in a range of 1 to 1000 ppm by weight. Examples of the above-described metals include lithium, sodium, calcium, potassium, iron, copper, nickel, aluminum, zinc, chromium, manganese, cobalt, platinum, iridium and the like. In the solution of the present invention, silicon, phosphorus, fluorine, chlorine, bromine and the like may be contained in a range of 1 to 1000 ppm by weight.

<Thin Film>

The thin film of the present invention comprises a polymer compound of the present invention, and for example, is a luminous thin film, electric conductive thin film, organic semiconductor thin film or the like.

The thin film of the present invention can be manufactured, for example, by a spin coat method, casting method, micro gravure coat method, gravure coat method, bar coat method, roll coat method, wire bar coat method, dip coat method, spray coat method, screen printing method, flexo printing method, offset printing method, inkjet print method, capillary coat method, nozzle coat method and the like, preferably by a screen printing method, flexo printing method, offset printing method, inkjet print method, more preferably by an inkjet method.

When a thin film is fabricated using a solution of the present invention, baking at temperatures of 100° C. or higher is possible since the polymer compound of the present invention contained in the solution has high glass transition temperature, and even if baking is performed at a temperature of 130° C., lowering of device properties is small. Depending on the kind of the polymer compound, baking at temperatures of 160° C. or higher is also possible.

The luminous thin film has a quantum yield of light emission of preferably 30% or more, more preferably 50% or more, further preferably 60% or more, particularly preferably 70% or more, from the standpoint of luminance of a device, light emission voltage and the like.

The electric conductive thin film has a surface resistance of preferably 1 KΩ/□ or less, more preferably 100 Ω/□ or less, further preferably 10 Ω/□ or less. The electric conductivity can be enhanced by doping the electric conductive thin film with a Lewis acid, ionic compound or the like.

In the organic semiconductor thin film, one larger parameter of electron mobility or hole mobility is preferably $10^{-5}$ cm$^2$/V·s or more, more preferably $10^{-3}$ cm$^2$/V·s or more, further preferably $10^{-1}$ cm$^2$/V·s or more. By forming the organic semiconductor thin film on a Si substrate carrying a gate electrode and an insulation film of SiO$_2$ and the like formed thereon, and forming a source electrode and a drain electrode with Au and the like, an organic transistor can be obtained.

<Light Emitting Device>

Next, the light emitting device of the present invention will be described.

The light emitting device of the present invention has electrodes composed of an anode and a cathode, and an organic layer disposed between the electrodes and containing the above-described polymer compound.

The above-described organic layer is preferably at least one layer selected from the group consisting of a light emitting layer, hole transporting layer, hole injection layer, electron transporting layer, electron injection layer and "interlayer" layer, and it is more preferable that a light emitting layer is included in them or the above-described organic layer is a light emitting layer.

The above-mentioned light emitting layer means a layer having a function of light emission. The hole transporting layer means a layer having a function of transporting holes. The electron transporting layer means a layer having a function of transporting electrons. The "interlayer" layer means a layer which is present adjacent to a light emitting layer between the light emitting layer and an anode, and has a function of insulating a light emitting layer and an anode, or a light emitting layer and a hole injection layer or hole transporting layer. The electron transporting layer and the hole transporting layer are collectively called a charge transporting layer. The electron injection layer and the hole injection layer are collectively called a charge injection layer. The light emitting layer, hole transporting layer, hole injection layer, electron transporting layer, electron injection layer and interlayer may each be composed of only one layer or two or more layers.

When the organic layer is a light emitting layer, the light emitting layer may further contain a hole transporting material, electron transporting material or light emitting material. Here, the light emitting material means a material manifesting fluorescence and/or phosphorescence (excluding the polymer compound of the present invention).

When the organic layer contains a polymer compound of the present invention and a hole transporting material, the proportion of the hole transporting material is usually 1 to 80 parts by weight, preferably 5 to 60 parts by weight with respect to 100 parts by weight the sum of the polymer compound of the present invention and the hole transporting material.

When the organic layer contains a polymer compound of the present invention and an electron transporting material, the proportion of the electron transporting material is usually 1 to 80 parts by weight, preferably 5 to 60 parts by weight with respect to 100 parts by weight the sum of the polymer compound of the present invention and the electron transporting material.

When the organic layer contains a polymer compound of the present invention and a light emitting material, the proportion of the light emitting material is usually 1 to 80 parts by weight, preferably 5 to 60 parts by weight with respect to 100 parts by weight the sum of the polymer compound of the present invention and the light emitting material.

When the organic layer contains a polymer compound of the present invention, and two or more selected from the group consisting of a hole transporting material, electron transporting material and light emitting material, the proportion of the light emitting material is usually 1 to 50 parts by weight, preferably 5 to 40 parts by weight with respect to 100 parts by weight the sum of them, and the total proportion of the hole transporting material and electron transporting material is usually 1 to 50 parts by weight, preferably 5 to 40 parts by weight with respect to 100 parts by weight the sum of them.

As the above-described hole transporting material, electron transporting material and light emitting material, known low molecular weight compounds, triplet light emitting complexes or high molecular weight compounds can be used, and it is preferable to use high molecular weight compounds.

Examples of the above-described high molecular weight compounds include polymers and copolymers (hereinafter, referred to as "(co)polymer") containing a fluorenediyl group as a repeating unit, (co)polymers containing an arylene group as a repeating unit, (co)polymers containing an arylenevinylene group as a repeating unit and (co)polymers containing a di-valent aromatic amine group as a repeating units described in WO 99/13692, WO 99/48160, GB 2340304A, WO 00/53656, WO 01/19834, WO 00/55927, GB 2348316, WO 00/46321, WO 00/06665, WO 99/54943, WO 99/54385, U.S. Pat. No. 5,777,070, WO 98/06773, WO 97/05184, WO 00/35987, WO 00/53655, WO 01/34722, WO 99/24526, WO 00/22027, WO 00/22026, WO 98/27136, U.S. Pat. No. 573636, WO 98/21262, U.S. Pat. No. 5,741,921, WO 97/09394, WO 96/29356, WO 96/10617, EP 0707020, WO 95/07955, JP-A No. 2001-181618, JP-A No. 2001-123156, JP-A No. 2001-3045, JP-A No. 2000-351967, JP-A No. 2000-303066, JP-A No. 2000-299189, JP-A No. 2000-252065, JP-A No. 2000-136379, JP-A No. 2000-104057, JP-A No. 2000-80167, JP-A No. 10-324870, JP-A No. 10-114891, JP-A No. 9-111233, JP-A No. 9-45478 and the like.

Examples of the above-described low molecular weight compounds include naphthalene derivatives, anthracene and derivatives thereof, perylene and derivatives thereof, dyes such as polymethine dye, xanthene dye, coumarin dye, cyanine dye and the like, metal complexes of 8-hydroxyquinoline and derivatives thereof, aromatic amines, tetraphenylcyclopentadiene and derivatives thereof, tetraphenylbutadiene and derivatives thereof, and the like, and more specifically, those described in JP-A Nos. 57-51781, 59-194393, and the like.

The above-described triplet light emitting complexes include, for example, Ir(ppy)$_3$, Btp$_2$Ir(acac) containing iridium as a center metal, PtOEP containing platinum as a center metal, Eu(TTA)$_3$phen containing europium as a center metal, and the like, and more specifically, described, for example, in Nature, (1998), 395, 151, Appl. Phys. Lett. (1999), 75(1), 4, Proc. SPIE-Int. Soc. Opt. Eng. (2001), 4105 (Organic Light-Emitting Materials and Devices IV), 119, J. Am. Chem. Soc., (2001), 123, 4304, Appl. Phys. Lett., (1997), 71(18), 2596, Syn. Met., (1998), 94(1), 103, Syn. Met., (1999), 99(2), 1361, Adv. Mater., (1999), 11(10), 852, Jpn. J. Appl. Phys., 34, 1883 (1995) and the like.

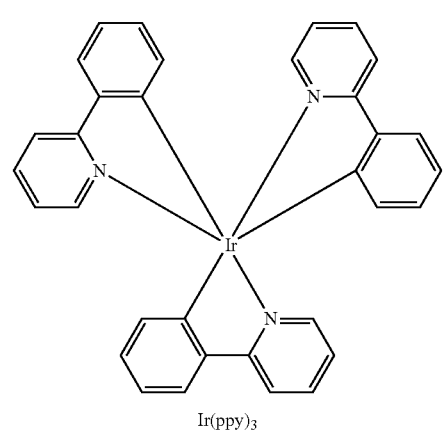

Ir(ppy)$_3$

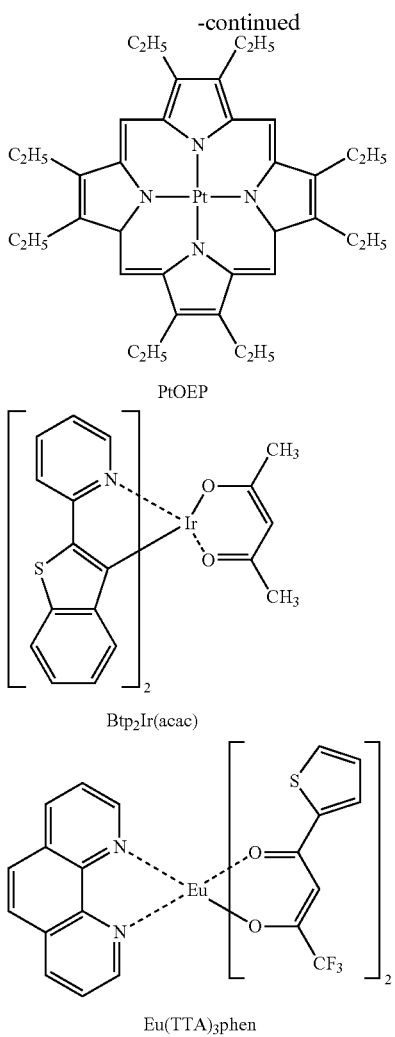

PtOEP

Btp₂Ir(acac)

Eu(TTA)₃phen

The thickness of the light emitting layer manifests the optimum value varying depending on the material to be used, and may be advantageously selected so as to give optimum driving voltage and light emission efficiency, and it is usually 1 nm to 1 μm, preferably 2 nm to 500 nm, more preferably 5 nm to 200 nm.

As the method for forming the light emitting layer, for example, a method of film formation from a solution is mentioned. As the film formation method from a solution, application methods such as, for example, a spin coat method, casting method, micro gravure coat method, gravure coat method, bar coat method, roll coat method, wire bar coat method, dip coat method, spray coat method, screen printing method, flexo printing method, offset printing method, inkjet print method, capillary coat method, nozzle coat method and the like can be used, and preferable from the standpoint of easiness of pattern formation and multi-color separate painting are printing methods such as a screen printing method, flexo printing method, offset printing method, inkjet print method and the like.

The light emitting device of the present invention shows a maximum external quantum yield of preferably 1% or more, more preferably 1.5% or more when a voltage of 3.5 V or more is applied between an anode and a cathode, from the standpoint of the luminance of the device, and the like.

As the light emitting device of the present invention, mentioned are a light emitting device having an electron transporting layer disposed between a cathode and a light emitting layer, a light emitting device having a hole transporting layer disposed between an anode and a light emitting layer, a light emitting device having an electron transporting layer disposed between a cathode and a light emitting layer and having a hole transporting layer disposed between an anode and a light emitting layer, and the like, and examples thereof include the following structures a) to d).

a) anode/light emitting layer/cathode
b) anode/hole transporting layer/light emitting layer/cathode
c) anode/light emitting layer/electron transporting layer/cathode
d) anode/hole transporting layer/light emitting layer/electron transporting layer/cathode (Here, / represents adjacent lamination of layers, being applicable also in the following descriptions)

Also examples include structures having an "interlayer" layer provided adjacent to a light emitting layer between the light emitting layer and an anode in each of these structures. That is, examples include the following structures a') to d').

a') anode/"interlayer" layer/light emitting layer/cathode
b') anode/hole transporting layer/"interlayer" layer/light emitting layer/cathode
c') anode/"interlayer" layer/light emitting layer/electron transporting layer/cathode
d') anode/hole transporting layer/"interlayer" layer/light emitting layer/electron transporting layer/cathode When the light emitting device of the present invention has a hole transporting layer, the hole transporting layer contains usually the above-described hole transporting material (high molecular weight compound, low molecular weight compound). Examples of the hole transporting material are polyvinylcarbazole and its derivatives, polysilane and its derivatives, polysiloxane derivatives having an aromatic amine on the side chain or main chain, pyrazoline derivatives, arylamine derivatives, stilbene derivatives, triphenyldiamine derivatives, polyaniline and its derivatives, polythiophene and its derivatives, polypyrrole and its derivatives, poly(p-phenylenevinylene) and its derivatives, poly(2,5-thienylenevinylene) and its derivatives, and the like, and compounds described in JP-A Nos. 63-70257, 63-175860, 2-135359, 2-135361, 2-209988, 3-37992 and 3-152184, and the like.

Among them, preferable as the high molecular weight compound are polyvinylcarbazole and its derivatives, polysilane and its derivatives, polysiloxane derivatives having an aromatic amine compound group on the side chain or main chain, polyaniline and its derivatives, polythiophene and its derivatives, poly(p-phenylenevinylene) and its derivatives, poly(2,5-thienylenevinylene) and its derivatives, and the like, and more preferable are polyvinylcarbazole and its derivatives, polysilane and its derivatives, and polysiloxane derivatives having an aromatic amine on the side chain or main chain.

Of them, examples of the low molecular weight compound include pyrazoline derivatives, arylamine derivatives, stilbene derivatives, and triphenyldiamine derivatives. These low molecular weight compounds are preferably used in the form of dispersion in a polymer binder.

As the above-described polymer binder, those not extremely disturbing charge transportation and showing no strong absorption against visible ray are preferable. Examples of the polymer binder are poly(N-vinylcarbazole), polyaniline and its derivatives, polythiophene and its derivatives, poly(p-phenylenevinylene) and its derivatives, poly(2,5-thienylenevinylene) and its derivatives, polycarbonate, polyacrylate, polymethyl acrylate, polymethyl methacrylate, polystyrene, polyvinyl chloride, polysiloxane and the like.

Polyvinylcarbazole and its derivatives are obtained, for example, from a vinyl monomer by cation polymerization or radical polymerization.

Examples of the polysilane and its derivatives include compounds described in Chem. Rev., vol. 89, p. 1359 (1989), GB Patent No. 2300196 publication, and the like. Also as the synthesis method, methods described in them can be used, and particularly, the Kipping method is suitably used.

In the polysiloxane and its derivatives, the siloxane skeleton structure shows little hole transporting property, thus, those having a structure of the above-described low molecular weight hole transporting material on the side chain or main chain are preferable, and those having an aromatic amine showing hole transportability on the side chain or main chain are more preferable.

Examples of the film formation method of a hole transporting layer include a method of film formation from a mixed solution with a polymer binder in the case of use of a low molecular weight compound, and a method of film formation from a solution in the case of use of a high molecular weight compound.

As the solvent used for film formation from a solution, those which can dissolve or uniformly disperse a hole transporting material are preferable. Examples of the solvent include chlorine-based solvents such as chloroform, methylene chloride, 1,2-dichloroethane, 1,1,2-trichloroethane, chlorobenzene, o-dichlorobenzene and the like, ether solvents such as tetrahydrofuran, dioxane and the like, aromatic hydrocarbon solvents such as toluene, xylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone and the like, ester solvents such as ethyl acetate, butyl acetate, ethylcellosolve acetate and the like, polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and the like and derivatives thereof, alcohol solvents such as methanol, ethanol, propanol, isopropanol, cyclohexanol and the like, sulfoxide solvents such as dimethyl sulfoxide and the like, amide solvents such as N-methyl-2-pyrrolidone, N,N-dimethylformamide and the like. These organic solvents can be used singly or in combination with another or more.

As the method for film formation from a solution, there can be used application methods such as a spin coat method, casting method, micro gravure coat method, gravure coat method, bar coat method, roll coat method, wire bar coat method, dip coat method, spray coat method, screen printing method, flexo printing method, offset printing method, inkjet print method, capillary coat method, nozzle coat method and the like.

Regarding the thickness of a hole transporting layer, the optimum value varies depending on the material to be used, and it may be advantageously selected so as to give suitable driving voltage and light emission efficiency, and a thickness at least causing no formation of pin holes is necessary, and when the thickness is too large, the driving voltage of a device increases undesirably. Therefore, the thickness of the hole transporting layer is usually 1 nm to 1 μm, preferably 2 to 500 nm, more preferably 5 to 200 nm.

When the light emitting device of the present invention has an electron transporting layer, the electron transporting layer contains usually the above-described electron transporting material (high molecular weight compound, low molecular weight compound). As the electron transporting material, known materials can be used, and examples include oxadiazole derivatives, anthraquinodimethane and its derivatives, benzoquinone and its derivatives, naphthoquinone and its derivatives, anthraquinone and its derivatives, tetracyanoanthraquinodimethane and its derivatives, fluorenone derivatives, diphenyldicyanoethylene and its derivatives, diphenoquinone derivatives, metal complexes of 8-hydroxyquinoline and its derivatives, polyquinoline and its derivatives, polyquinoxaline and its derivatives, polyfluorene and its derivatives, and the like, and compounds described in JP-A Nos. 63-70257, 63-175860, 2-135359, 2-135361, 2-209988, 3-37992, 3-152184, and the like. Of them, oxadiazole derivatives, benzoquinone and its derivatives, anthraquinone and its derivatives, metal complexes of 8-hydroxyquinoline and its derivatives, polyquinoline and its derivatives, polyquinoxaline and its derivatives, polyfluorene and its derivatives are preferable, and 2-(4-biphenyl)-5-(4-t-butylphenyl)-1,3,4-oxadiazole, benzoqinone, anthraquinone, tris(8-quinolinol) aluminum and polyquinoline are further preferable.

Examples of the film formation method of an electron transporting layer include a vacuum vapor deposition method from power, or a method of film formation from solution or melted condition in the case of use of a low molecular weight compound, and a method of film formation from solution or melted condition in the case of use of a high molecular weight compound. In the method of film formation from solution or melted condition, the above-described polymer binder may be used together.

As the solvent to be used in film formation from solution, compounds which can dissolve or uniformly disperse an electron transporting material and/or polymer binder are preferable. Examples of the solvent include chlorine-based solvents such as chloroform, methylene chloride, 1,2-dichloroethane, 1,1,2-trichloroethane, chlorobenzene, o-dichlorobenzene and the like, ether solvents such as tetrahydrofuran, dioxane and the like, aromatic hydrocarbon solvents such as toluene, xylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone and the like, ester solvents such as ethyl acetate, butyl acetate, ethylcellosolve acetate and the like, polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and the like and derivatives thereof, alcohol solvents such as methanol, ethanol, propanol, isopropanol, cyclohexanol and the like, sulfoxide solvents such as dimethyl sulfoxide and the like, amide solvents such as N-methyl-2-pyrrolidone, N,N-dimethylformamide and the like. These organic solvents can be used singly or in combination of with another or more.

As the film formation method from solution or melted condition, application methods such as a spin coat method, casting method, micro gravure coat method, gravure coat method, bar coat method, roll coat method, wire bar coat method, dip coat method, spray coat method, screen printing method, flexo printing method, offset printing method, inkjet print method, capillary coat method, nozzle coat method and the like can be used.

Regarding the thickness of an electron transporting layer, the optimum value varies depending on a material to be used, and it may be advantageously selected so as to give suitable driving voltage and light emission efficiency, and a thickness at least causing no formation of pin holes is necessary, and when the thickness is too large, the driving voltage of a device increases undesirably. Therefore, the thickness of the electron transporting layer is usually 1 nm to 1 μm, preferably 2 to 500 nm, more preferably 5 to 200 nm.

The above-described hole injection layer and electron injection layer are those having a function of improving charge injection efficiency from an electrode and having an effect of lowering the driving voltage of a device, among charge transporting layers disposed adjacent to an electrode, For improving close adherence with an electrode and improving charge injection from an electrode, the above-described charge injection layer or an insulation layer (usually, having an average thickness of 0.5 to 4.0 nm, being applicable also in the following descriptions) may be provided adjacent to the electrode, alternatively, for improving close adherence of an interface and preventing mixing, a thin buffer layer may be inserted into an interface of a charge transporting layer and a light emitting layer.

The order and number of layers to be laminated, and thickness of each layer may be advantageously determined in view of light emission efficiency and device life.

In the present invention, as the light emitting device carrying a provided charge injection layer (electron injection layer, hole injection layer), mentioned are light emitting devices having a charge injection layer disposed adjacent to a cathode and light emitting devices having a charge injection layer disposed adjacent to an anode. Examples thereof include the following structures e) to p).

e) anode/charge injection layer/light emitting layer/cathode
f) anode/light emitting layer/charge injection layer/cathode
g) anode/charge injection layer/light emitting layer/charge injection layer/cathode
h) anode/charge injection layer/hole transporting layer/light emitting layer/cathode
i) anode/hole transporting layer/light emitting layer/charge injection layer/cathode
j) anode/charge injection layer/hole transporting layer/light emitting layer/charge injection layer/cathode
k) anode/charge injection layer/light emitting layer/electron transporting layer/cathode
l) anode/light emitting layer/electron transporting layer/charge injection layer/cathode
m) anode/charge injection layer/light emitting layer/electron transporting layer/charge injection layer/cathode
n) anode/charge injection layer/hole transporting layer/light emitting layer/electron transporting layer/cathode
o) anode/hole transporting layer/light emitting layer/electron transporting layer/charge injection layer/cathode
p) anode/charge injection layer/hole transporting layer/light emitting layer/electron transporting layer/charge injection layer/cathode Also examples include structures having an "interlayer" layer disposed adjacent to a light emitting layer between the light emitting layer and an anode in each of these structures. In this case, the "interlayer" layer may also function as a hole injection layer and/or hole transporting layer.

Examples of the charge injection layer include a layer containing an electric conductive polymer, a layer disposed between an anode and a hole transporting layer and containing a material having ionization potential of a value between an anode material and a hole transporting material contained in a hole transporting layer, a layer disposed between a cathode and an electron transporting layer and containing a material having electron affinity of a value between a cathode material and an electron transporting material contained in an electron transporting layer, and the like.

When the above-described charge injection layer contains an electric conductive polymer, the electric conductivity of the electric conductive polymer is preferably $10^{-5}$ to $10^3$ S/cm, and for decreasing leak current between light emission picture elements, more preferably $10^{-5}$ to $10^2$ S/cm, further preferably $10^{-5}$ to $10^1$ S/cm.

When the above-described charge injection layer contains an electric conductive polymer, the electric conductivity of the electric conductive polymer is preferably $10^{-5}$ to $10^3$ S/cm, and for decreasing leak current between light emission picture elements, more preferably $10^{-5}$ to $10^2$ S/cm, further preferably $10^{-5}$ to $10^1$ S/cm. Usually, for adjusting the electric conductivity of the electric conductive polymer to such a range, the electric conductive polymer is doped with a suitable amount of electrons.

As the kind of ions to be doped, an anion is used in a hole injection layer and a cation is used in an electron injection layer. Examples of the anion include a polystyrenesulfonic ion, alkylbenzenesulfonic ion, camphorsulfonic ion and the like, and examples of the cation include a lithium ion, sodium ion, potassium ion, tetrabutylammonium ion and the like.

The material used in the charge injection layer may be appropriately selected depending on a relation with materials of an electrode and an adjacent layer, and examples include polyaniline and its derivatives, polythiophene and its derivatives, polypyrrole and its derivatives, polyphenylenevinylene and its derivatives, polythienylenevinylene and its derivatives, polyquinoxaline and its derivatives, electric conductive polymers such as polymers containing an aromatic amine structure on the main chain or side chain, metal phthalocyanines (copper phthalocyanine and the like), carbon and the like.

As the material of the above-described insulation layer, a metal fluoride, metal oxide, organic insulating material and the like are mentioned. As the light emitting device having the above-described insulation layer, there are mentioned light emitting devices in which an insulation layer is disposed adjacent to a cathode, and light emitting devices in which an insulation layer is disposed adjacent to an anode.

As the light emitting device having an insulation layer, for example, the following structures q) to ab) are mentioned.

q) anode/insulation layer/light emitting layer/cathode
r) anode/light emitting layer/insulation layer/cathode
s) anode/insulation layer/light emitting layer/insulation layer/cathode
t) anode/insulation layer/hole transporting layer/light emitting layer/cathode
u) anode/hole transporting layer/light emitting layer/insulation layer/cathode
v) anode/insulation layer/hole transporting layer/light emitting layer/insulation layer/cathode
w) anode/insulation layer/light emitting layer/electron transporting layer/cathode
x) anode/light emitting layer/electron transporting layer/insulation layer/cathode
y) anode/insulation layer/light emitting layer/electron transporting layer/insulation layer/cathode
z) anode/insulation layer/hole transporting layer/light emitting layer/electron transporting layer/cathode
aa) anode/hole transporting layer/light emitting layer/electron transporting layer/insulation layer/cathode
ab) anode/insulation layer/hole transporting layer/light emitting layer/electron transporting layer/insulation layer/cathode Also examples include structures having an "interlayer" layer disposed adjacent to a light emitting layer between the light emitting layer and an anode in each of these structures. In this case, the "interlayer" layer may also function as a hole injection layer and/or hole transporting layer.

In structures in which an "interlayer" layer is applied to the above-described structures a) to ab), the "interlayer" layer is preferably disposed between an anode and a light emitting layer and constituted of a material having intermediate ionization potential between the anode or hole injection layer or hole transporting layer, and a polymer compound constituting the light emitting layer.

Examples of the material to be used in the "interlayer" layer include polymers containing an aromatic amine such as polyvinylcarbazole and its derivatives, polyarylene derivatives having an aromatic amine on the side chain or main chain, arylamine derivatives, triphenyldiamine derivatives and the like.

The method for forming the "interlayer" layer is not particularly restricted, and example include a method of film formation from solution in the case of use of a polymer material.

As the solvent to be used in film formation from solution, compounds which can dissolve or uniformly disperse a material used in an "interlayer" layer are preferable. Examples of the solvent include chlorine-based solvents such as chloroform, methylene chloride, 1,2-dichloroethane, 1,1,2-trichloroethane, chlorobenzene, o-dichlorobenzene and the like, ether solvents such as tetrahydrofuran, dioxane and the like, aromatic hydrocarbon solvents such as toluene, xylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone and the like, ester solvents such as ethyl acetate, butyl acetate, ethylcellosolve acetate and the like, polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and the like and derivatives thereof, alcohol solvents such as methanol, ethanol propanol, isopropanol, cyclohexanol and the like, sulfoxide solvents such as dimethyl sulfoxide and the like, amide solvents such as N-methyl-2-pyrrolidone, N,N-dimethylformamide and the like. These organic solvents can be used singly or in combination with another or more.

As the film formation method from solution, application methods such as a spin coat method, casting method, micro gravure coat method, gravure coat method, bar coat method, roll coat method, wire bar coat method, dip coat method, spray coat method, screen printing method, flexo printing method, offset printing method, inkjet printing method, capillary coat method, nozzle coat method and the like can be used.

Regarding the thickness of an "interlayer" layer, the optimum value varies depending on a material to be used, and it may be advantageously selected so as to give suitable driving voltage and light emission efficiency, and it is usually 1 nm to 1 µm, preferably 2 to 500 nm, more preferably 5 to 200 nm.

When the "interlayer" layer is disposed adjacent to a light emitting layer, particularly when both the layers are formed by an application method, the two layers may be mixed to exert an undesirable influence on device properties and the like in some cases. When the "interlayer" layer is formed by an application method before formation of a light emitting layer by an application method, there is mentioned a method in which an "interlayer" layer is formed by an application method, then, the "interlayer" layer is heated to be insolubilized in an organic solvent to be used for manufacturing a light emitting layer, then, the light emitting layer is formed, as a method for reducing mixing of materials of the two layers. The above-described heating temperature is usually about 150 to 300° C. The above-described heating time is usually about 1 minute to 1 hour. In this case, for removal of components not insolubilized in solvent by heating, the "interlayer" layer may be rinsed with a solvent to be used for formation of a light emitting layer, after heating and before formation of the light emitting layer. When insolubilization in solvent by heating is carried out sufficiently, rinsing with a solvent can be omitted. For insolubilization in solvent by heating to be carried out sufficiently, it is preferable to use a compound containing at least one polymerizable group in the molecule, as a polymer compound to be used in an "interlayer" layer. Further, the number of polymerizable groups is preferably 5% or more with respect to the number of repeating units in the molecule.

The substrate which forms a light emitting device of the present invention may advantageously be that forming an electrode and which does not change in forming a layer of an organic substance, and examples include, for example, substrates of glass, plastic, polymer film, silicon and the like. In the case of an opaque substrate, it is preferable that the opposite electrode is transparent or semi-transparent.

Usually, at least one of an anode and a cathode contained in a polymer light emitting device of the present invention is transparent or semi-transparent, and it is preferable that a cathode is transparent or semi-transparent.

As the material of the cathode, an electric conductive metal oxide film, semi-transparent metal thin film and the like are mentioned, and specifically, films (NESA and the like) formed using electric conductive glass composed of indium oxide, zinc oxide, tin oxide, and composite thereof: indium-.tin.oxide (ITO), indium.zinc.oxide and the like, an gold, platinum, silver, copper and the like are used, and ITO, indium.zinc.oxide, tin oxide are preferable. As the manufacturing method, a vacuum vapor-deposition method, sputtering method, ion plating method, plating method and the like are mentioned. As the anode, organic transparent electric conductive films made of polyaniline or its derivative, polythiophene or its derivative, and the like may be used. The anode may take a lamination structure composed of two or more layers.

The thickness of an anode can be appropriately selected in view of light transmission and electric conductivity, and it is, for example, 10 nm to 10 µm, preferably 20 nm to 1 µm, more preferably 50 nm to 500 nm.

For making charge injection easy, a layer made of a phthalocyanine derivative, electric conductive polymer, carbon and the like, an insulation layer made of a metal oxide, metal fluoride, organic insulation material and the like, may be provided on an anode.

As the material of the cathode, materials of small work function are preferable, and for example, metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, alloys of two or more of them, or alloys made of at least one of them and at least one gold, silver, platinum, copper, manganese, titanium, cobalt, nickel, tungsten and tin, or graphite or graphite intercalation compounds and the like are used. Examples of the alloy include magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may take a laminated structure composed of two or more layers.

The thickness of a cathode can be appropriately selected in view of electric conductivity and durability, and it is usually 10 nm to 10 μm, preferably 20 nm to 1 μm, further preferably 50 to 500 nm.

As the cathode manufacturing method, a vacuum vapor-deposition method, sputtering method, lamination method of thermally press-fitting a metal thin film, and the like are used. A layer made of an electric conductive polymer, or a layer having an average thickness of 2 nm or less made of a metal oxide, metal fluoride, organic insulation material and the like, may be provided between a cathode and an organic substance layer, and after manufacturing a cathode, a protective layer for protecting the polymer light emitting device may be installed. For use of the polymer light emitting device stably for a long period of time, it is preferable to install a protective layer and/or protective cover, for protecting a device from outside.

As the protective layer, a polymer compound, metal oxide, metal fluoride, metal boride and the like can be used. As the protective cover, a metal plate, a glass plate, and a plastic plate having a surface which has been subjected to low water permeation treatment, and the like can be used, and a method of pasting the cover to a device substrate with a thermosetting resin or photo-curable resin to attain close seal is suitably used. When a space is kept using a spacer, prevention of blemishing of a device is easy. If an inert gas such as nitrogen, argon and the like is filled in this space, oxidation of a cathode can be prevented, further, by placing a drying agent such as barium oxide and the like in this space, it becomes easy to suppress moisture adsorbed in a production process or a trace amount of moisture invaded passing through the hardened resin from imparting damage to the device. It is preferable to adopt one or more strategies among these methods.

The light emitting device of the present invention can be used as a sheet light source, segment display, dot matrix display, back light of a liquid crystal display, and the like.

For obtaining light emission in the form of sheet using a polymer light emitting device of the present invention, it may be advantages to place a sheet anode and a sheet cathode so as to overlap. For obtaining light emission in the form of pattern, there are a method in which a mask having a window in the form of pattern is placed on the surface of the above-described sheet light emitting device, a method in which a layer to be a no-light emitting portion is formed with extremely large thickness to give substantially no light emission, and a method in which either anode or cathode, or both electrodes are formed in the form pattern. By forming a pattern by any of these methods, and placing several electrodes so that on/off is independently possible, a display of segment type is obtained which can display digits, letters, simple marks and the like. Further, for providing a dot matrix device, it may be permissible that both an anode and a cathode are formed in the form of stripe, and placed so as to cross. By using a method in which several polymer fluorescent bodies showing different emission colors are painted separately or a method in which a color filter or a fluorescence conversion filter is used, partial color display and multi-color display are made possible. In the case of a dot matrix device, passive driving is possible, and active driving may be carried out in combination with TFT and the like. These displays can be used as a display of a computer, television, portable terminal, cellular telephone, car navigation, view finder of video camera, and the like.

Further, the above-described sheet light emitting device is of self emitting and thin type, and can be suitably used as a sheet light source for back light of a liquid crystal display, or as a sheet light source for illumination. If a flexible substrate is used, it can also be used as a curved light source or display.

EXAMPLES

The present invention will be illustrated further in detail by examples below, but the invention is not limited to them.

(Number Average Molecular Weight and Weight Average Molecular Weight)

In examples, the polystyrene-equivalent number average molecular weight and weight average molecular weight were measured by gel permeation chromatography (GPC, manufactured by Shimadzu Corp., trade name: LC-10Avp). A polymer compound to be measured was dissolved in tetrahydrofuran so as to give a concentration of about 0.5 wt %, and the solution was injected in an amount of 30 μL into GPC. Tetrahydrofuran was used as the mobile phase of GPC, and allowed to flow at a flow rate of 0.6 mL/min. As the column, two TSKgel Super HM-H (manufactured by Tosoh Corp.) and one TSKgel Super H2000 (manufactured by Tosoh Corp.) were connected serially. A differential refractive index detector (trade name: RID-10A, manufactured by Shimadzu Corp.) was used as a detector.

(Comparison of Color Purity of Green Light Emission)

Comparison of the color purity of green light emission when a polymer compound is used as a light emitting material was carried out based on values of (x,y) of the chromaticity coordinate C.I.E 1931 of green light emission obtained when made into an organic electroluminescence device. Regarding green light emission as NTSC standard for display (NTSC: National Television System Committee), when the chromaticity coordinate (x,y) is nearer to (0.20, 0.70), the color purity is higher.

Synthesis Example 1

Synthesis of Compound 1

Under an inert atmosphere, into a three-necked flask was added 37.6 g (0.11 mol) of 9,10-dibromoanthracene, 50.4 g (0.22 mol) of N-(4-t-butylphenyl)aniline, 25.8 g (0.27 mol) of sodium t-butoxide, 2.1 g (2.2 mmol) of [tris(dibenzylideneacetone)]dipalladium, 1.8 g (9 mmol) of tri-t-butylphosphine and 91 mL of dehydrated toluene, and the mixture was stirred at 100° C. for 5 hours. Thereafter, the reaction solution was cooled down to room temperature, and 6.2 g of 1 N hydrochloric acid aqueous solution and 1250 mL of methanol were added while stirring, and the deposited crystal was filtrated, washed with MeOH and distilled water in this order, and dried under reduced pressure to obtain a crude product. The crude product was re-crystallized from hexane to obtain 61 g (yield 100%, HPLC area percentage value 99.3%) of the targeted compound 1.

$^1$H-NMR (299.4 MHz, CDCl$_3$): 1.27 (s, 18H), 6.86 (m, 2H), 7.08 (m, 8H), 7.20 (m, 8H), 7.36 (m, 4H), 8.21 (m, 4H) LC-MS (APPI-MS (posi)): 625 [M+H]$^+$ compound 1

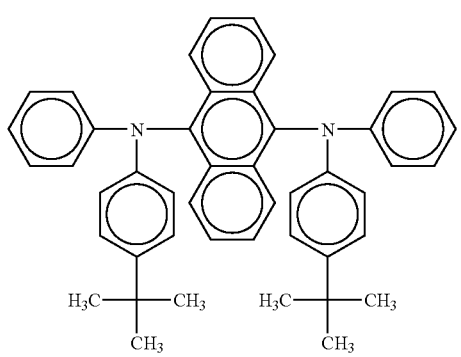

Synthesis Example 2

Synthesis of Compound 2

Under an inert atmosphere, into a three-necked flask was added 50.0 g (80 mmol) of the compound 1 obtained in Synthesis Example 1 and 1167 mL of chloroform and a homogeneous solution was prepared, and a solution composed of 29.4 g (165 mmol) of N-bromosuccinimide and 67 mL of dehydrated N,N-dimethylformamide was dropped while stirring at 25 to 35° C. over a period of 30 minutes, and the mixture was stirred further at 25 to 35° C. for 7 hours. Thereafter, the reaction mixture was heated under reflux and cooled down to 25° C., and 1330 mL of methanol was dropped, and the deposited crystal was filtrated, the crystal was washed with methanol, and dried under reduced pressure to obtain 59 g (yield 95%, HPLC area percentage value 99.2%) of the targeted compound 2.

$^1$H-NMR (299.4 MHz, CDCl$_3$): 1.27 (s, 18H), 6.90 (m, 4H), 7.08 (m, 4H), 7.25 (m, 8H), 7.39 (m, 4H), 8.16 (m, 4H)
LC-MS (APPI-MS (posi)): 781 [M+H]$^+$ compound 2

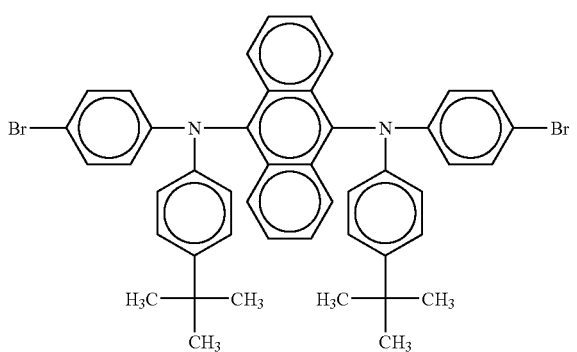

Synthesis Example 3

Synthesis of 2,6-di-t-butylanthracene 153 g of anthracene, 191 g of t-butyl alcohol and 860 mL of trifluoroacetic acid were stirred at 80 to 84° C. for 24 hours, then, cooled down to 4° C. and the deposited precipitate was filtrated, the crystal was washed with toluene and hexane in this order to obtain a gray solid. The solid was re-crystallized from toluene to obtain 76.2 g (yield 30.5%, HPLC area percentage value 99.1%) of the targeted 2,6-di-t-butylanthracene.

Synthesis Example 4

Synthesis of 9,10-dibromo-2,6-di-t-butylanthracene

Into a solution composed of 76.2 g of 2,6-di-t-butylanthracene obtained in Synthesis Example 3 and 2.4 L of carbon tetrachloride, a solution composed of 82.5 g of bromine and 240 mL of carbon tetrachloride was dropped at 24 to 30° C. over a period of 1 hour, and the mixture was further stirred for 3 hours. Then, in an ice bath, 1 L of a 10% sodium hydroxide aqueous solution was dropped over a period of 1.5 hours, and an aqueous layer was separated from an organic layer. The resultant organic layer was washed with water, and carbon tetrachloride was distilled off under reduced pressure until its volume reached 500 mL.

The resultant solution was cooled down to 7° C. while stirring, and the deposited crystal was filtrated to obtain 110 g (yield 95%, HPLC area percentage value 99.7%) of the targeted 9,10-dibromo-2,6-di-t-butylanthracene.

$^1$H-NMR (299.4 MHz, CDCl$_3$): 1.49 (s, 18H), 7.70 (d, 2H), 8.45 (s, 2H), 8.50 (d, 2H)

Synthesis Example 5

Synthesis of Compound 3

Under an inert atmosphere, 50.0 g of 9,10-dibromo-2,6-di-t-butylanthracene obtained in Synthesis Example 4, 50.0 g of N-(4-t-butylphenyl)aniline, 25.7 g of sodium t-butoxide, 2.0 g of [tris(dibenzylideneacetone)]dipalladium, 1.8 g of tri-t-butylphosphine and 300 mL of dehydrated toluene were added and the mixture was stirred at 90° C. for 1 hour. Thereafter, the reaction solution was cooled down to room temperature and neutralized with 318 mL of a 1 N hydrochloric acid aqueous solution, and 1 L of methanol was added while stirring, the deposited crystal was filtrated and the crystal was washed with MeOH. The crystal was dissolved in 900 mL of toluene, 900 mL of hexane was added and the mixture was stirred for 2 hours, and the deposited crystal was filtrated and dried under reduced pressure to obtain 45.1 g (yield 55%, HPLC area percentage value 99.0%) of the targeted compound 3.

LC-MS (APPI-MS (posi)): 737 [M+H]$^+$ compound 3

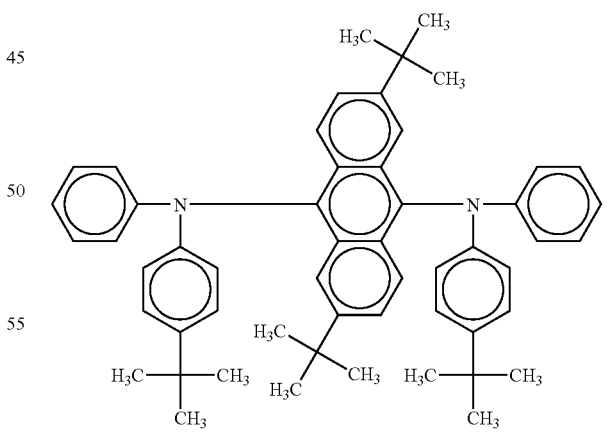

Synthesis Example 6

Synthesis of Compound 4

Under an inert atmosphere, 40.0 g of the compound 3 obtained in Synthesis Example 5 and 840 mL of chlorobenzene were added and heated to give a homogeneous solution, and a solution composed of 17.7 g of N-bromosuccinimide and 40 mL of dehydrated N,N-dimethylformamide was dropped at 30° C. while stirring, and the mixture was stirred at 7° C. for 12 hours. Thereafter, to the reaction mixture was added 3360 mL of hexane and the mixture was stirred for 1 hour, the deposited precipitate was removed by filtration, the filtrate was concentrated until the total amount reached 200 mL and the deposited solid was filtrated. The solid was recrystallized from toluene to obtain 25.7 g (yield 53%, HPLC area percentage value 99.3%) of the targeted compound 4.

$^1$H-NMR (299.4 MHz, CDCl$_3$): 1.21 (s, 18H), 1.26 (s, 18H), 6.89 (m, 4H), 7.07 (m, 4H), 7.25 (m, 8H), 7.42 (d, 2H), 8.01 (m, 4H)

LC-MS (APPI-MS (posi)): 893 [M+H]$^+$ compound 4

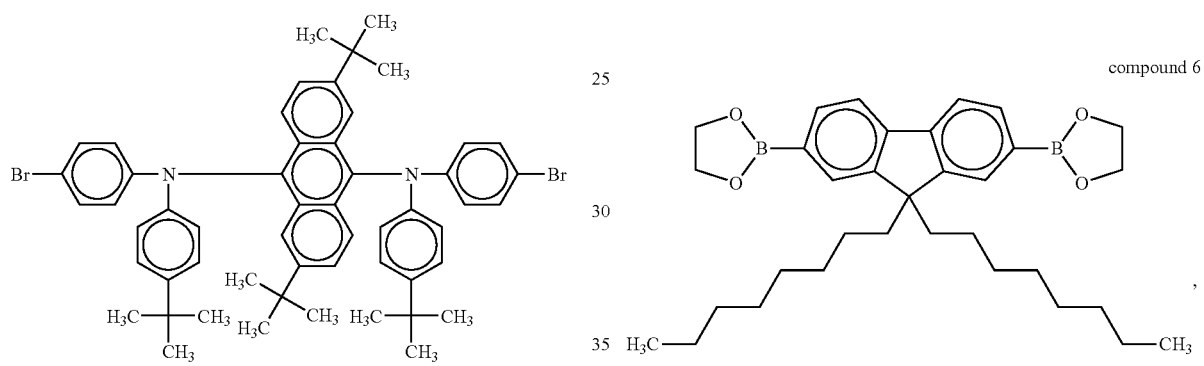

Comparative Example 1

Synthesis of Polymer Compound 1

Under an inert atmosphere, a compound 2 (0.188 g, 0.24 mmol) of the following formula:

compound 2

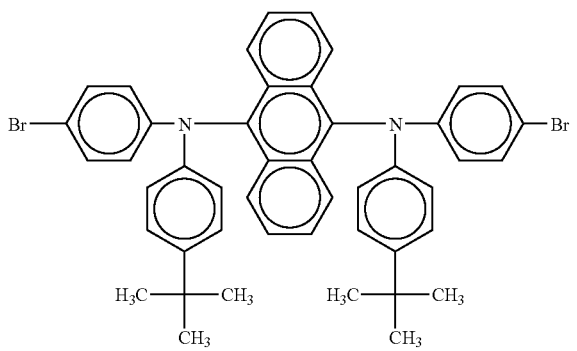

a compound 5 (2.06 g, 3.76 mmol) of the following formula:

compound 5

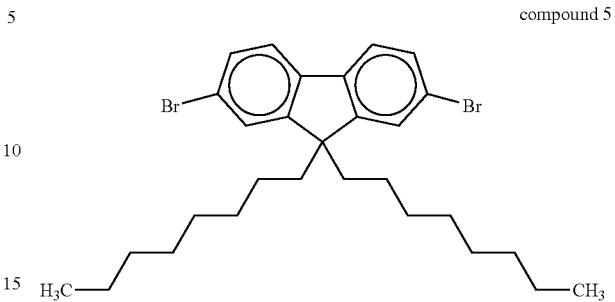

a compound 6 (2.10 g, 3.96 mmol) of the following formula:

compound 6 palladium acetate (2.7 mg), tris(2-methoxyphenyl)phosphine (29.6 mg), trioctylmethylammonium chloride (trade name: Aliquat 336 (manufactured by Aldrich), 0.52 g) and toluene (40 ml) were mixed, and heated at 105° C. Into this reaction solution, a 2 M Na$_2$CO$_3$ aqueous solution (10.9 ml) was dropped and the mixture was refluxed for 2 hours. After the reaction, phenylboronic acid (50 mg) was added and the mixture was further refluxed for 2 hours. Then, a sodium diethyldithiacarbamate aqueous solution was added and the mixture was stirred at 80° C. for 2 hours. After cooling, the mixture was washed with water (52 ml) twice, 3% acetic acid aqueous solution (52 ml) twice and water (52 ml) twice, and the resultant solution was dropped into methanol (620 mL), and filtrated to obtain a precipitate. The precipitate was dissolved in toluene (124 mL) and purified by passing through an alumina column and silica gel column. The resultant toluene solution was dropped into methanol (620 ml) and the mixture was stirred, then, the resultant precipitate was filtrated and dried. The yield of the resultant polymer compound 1 was 2.54 g.

The polymer compound 1 had a polystyrene-equivalent number average molecular weight of $1.1 \times 10^5$ and a polystyrene-equivalent weight average molecular weight of $2.5 \times 10^5$.

The polymer compound 1 is a random copolymer constituted of a constitutional unit of the following formula:

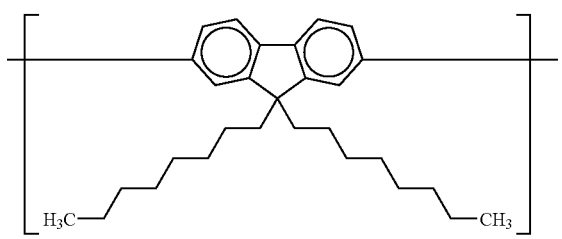

and a constitutional unit of the following formula:

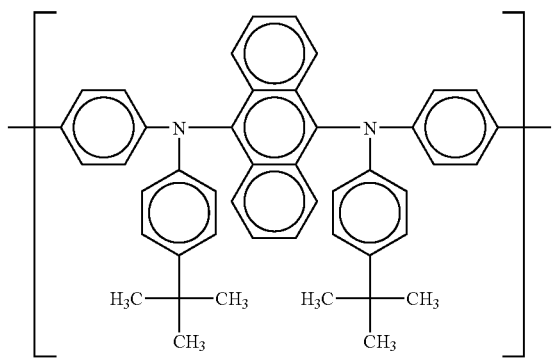

at a molar ratio of 97:3, according to the theoretical values calculated from charged raw materials.

Example 1

Synthesis of Polymer Compound 2

Under an inert atmosphere, a compound 4 (0.157 g, 0.17 mmol) of the following formula:

compound 4

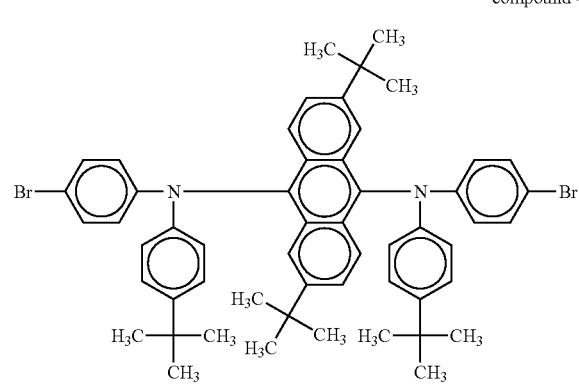

a compound 5 (1.50 g, 2.74 mmol) of the following formula:

compound 5

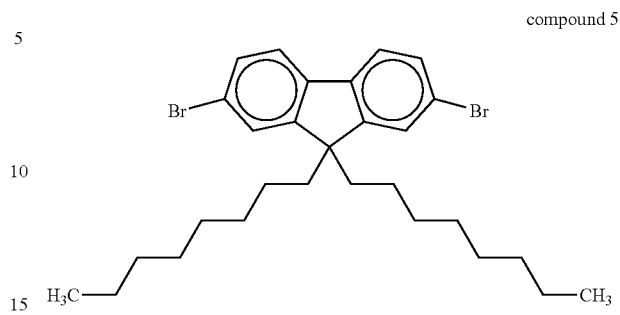

a compound 6 (1.55 g, 2.92 mmol) of the following formula:

compound 6

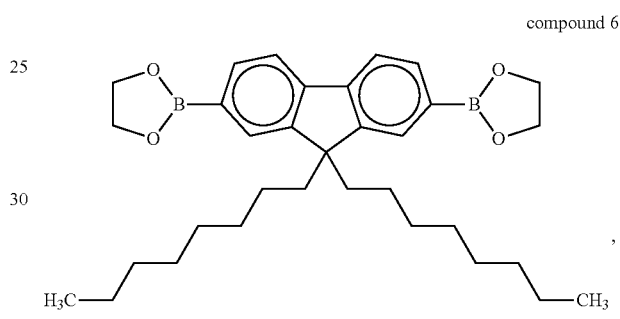

palladium acetate (2.0 mg), tris(2-methoxyphenyl)phosphine (21.6 mg), trioctylmethylammonium chloride (trade name: Aliquat 336 (manufactured by Aldrich), 0.38 g) and toluene (29 ml) were mixed, and heated at 105° C. Into this reaction solution, a 2 M $Na_2CO_3$ aqueous solution (7.9 ml) was dropped and the mixture was refluxed for 4.5 hours. After the reaction, phenylboronic acid (36 mg) was added and the mixture was further refluxed for 2 hours. Then, a sodium diethyldithiacarbamate aqueous solution was added and the mixture was stirred at 80° C. for 2 hours. After cooling, the mixture was washed with water (38 ml) twice, 3% acetic acid aqueous solution (38 ml) twice and water (38 ml) twice, and the resultant solution was dropped into methanol (450 mL), and filtrated to obtain a precipitate. The precipitate was dissolved in toluene (90 mL) and purified by passing through an alumina column and silica gel column. The resultant toluene solution was dropped into methanol (450 ml) and the mixture was stirred, then, the resultant precipitate was filtrated and dried. The yield of the resultant polymer compound 2 was 1.75 g.

The polymer compound 2 had a polystyrene-equivalent number average molecular weight of $8.3 \times 10^4$ and a polystyrene-equivalent weight average molecular weight of $1.9 \times 10^5$.

The polymer compound 2 is a random copolymer constituted of a constitutional unit of the following formula:

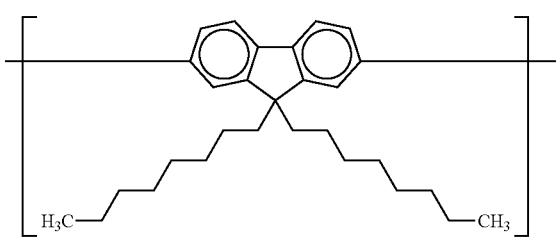

and a constitutional unit of the following formula:

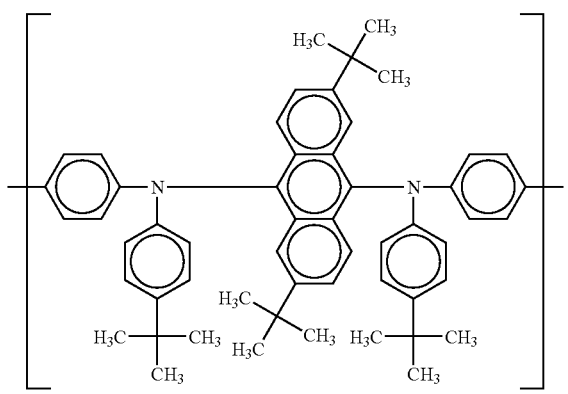

at a molar ratio of 97:3, according to the theoretical values calculated from charged raw materials.

Comparative Example 2

A 1.2 wt % xylene solution of the polymer compound 1 was prepared. On a glass substrate carrying thereon an ITO film with a thickness of 150 nm formed by a sputtering method, a solution of poly(3,4-ethylenedioxythiophene)/polystyrene-sulfonic acid (manufactured by Bayer, Baytron P) was spin-coated to form a film with a thickness of 50 nm which was then dried on a hot plate at 200° C. for 10 minutes. Next, the xylene solution prepared above was spin-coated at a revolution of 1300 rpm to form a film. The film thickness was about 100 nm. This was dried at 130° C. for 1 hour under a nitrogen gas atmosphere, then, as a cathode, barium was vapor-deposited with a thickness of about 5 nm, then, aluminum was vapor-deposited with a thickness of about 80 nm, to fabricate an EL device. After the degree of vacuum reached $1 \times 10^{-4}$ Pa or lower, metal vapor deposition was initiated. Voltage was applied to the resultant device to obtain green EL light emission. The maximum luminance was as high as about 6000 cd/m$^2$ or more. The chromaticity coordinate C.I.E 1931 at a luminance of 100 cd/m$^2$ was (x,y)=(0.33, 0.61).

Example 2

A 1.2 wt % xylene solution was prepared using the polymer compound 2 instead of the polymer compound 1 described in Comparative Example 2, and this was used to fabricate an organic electroluminescence device in the same manner as in Comparative Example 2. A light emitting layer was formed by spin coat at a revolution of 900 rpm. Voltage was applied to the resultant device to obtain green EL light emission. The maximum luminance was as high as about 6000 cd/m$^2$ or more. The chromaticity coordinate C.I.E 1931 at a luminance of 100 cd/m$^2$ was (x,y)=(0.30, 0.62).

While the distance A showing the deviance from the value of chromaticity coordinate C.I.E 1931 of EL light emission from the device in Comparative Example 2 and the targeted chromaticity coordinate (0.20, 0.70) was 0.158, the distance A for EL light emission from the device in Example 2 was 0.128.

The distance A in Example 2 decreased by 19% as compared with the distance A in Comparative Example 2.

Since the green purity is higher when the chromaticity coordinate is nearer to (0.20, 0.70) according to the NTSC standard, it was found that EL light emission from the device in Example 2 using a polymer compound of the present invention shows higher color purity as compared with EL light emission from the device in Comparative Example 2 using a polymer compound not included in the range of the present invention.

Experimental Results

TABLE 1

| | Polymer compound | Value of chromaticity coordinate C.I.E. 1931 of EL light emission: (x, y) | Difference from (0.20, 0.70) of EL light emission | | Distance A |
|---|---|---|---|---|---|
| | | | x | y | |
| Comparative Example 2 | 1 | (0.33, 0.61) | 0.13 | 0.09 | 0.158 |
| Example 2 | 2 | (0.30, 0.62) | 0.10 | 0.08 | 0.128 |

Distance A = $\{(x - 0.20)^2 + (y - 0.70)^2\}^{0.5}$ formula (RT)

Synthesis Example 7

Synthesis of Compound 7

Under an argon gas atmosphere, into a solution composed of 4-t-butylaniline (218.9 g, 1.467 mol), 1,4-diazabicyclo[2,2,2]octane (491.2 g) and chlorobenzene (3.65 L), a solution composed of titanium tetrachloride (207.7 g) and chlorobenzene (1.83 L) was dropped at 70° C. over a period of 20 minutes. Then, at 85° C., 2-methylanthraquinone (162.2 g, 0.73 mol) and chlorobenzene (900 mL) were added and the mixture was stirred at 120° C. for 1.5 hours. After cooling down to room temperature, chloroform (3.7 L) was added and the mixture was stirred for 1 hour and filtrated, and the resultant filtrate was concentrated to dryness, to obtain a solid. Then, to the solid was added acetone (5 L) and the mixture was stirred, the resultant crystal was filtrated, and dried under reduced pressure to obtain 255.5 g of the targeted compound 7 (yield: 72.2%).

LC-MS (APCI-MS (posi)): 485 [M+H]$^+$

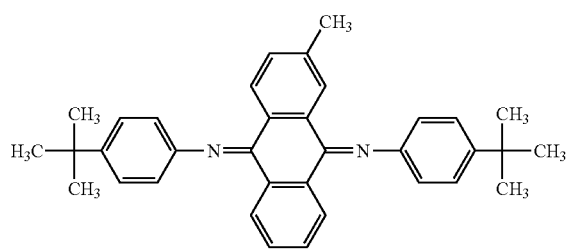

compound 7

Synthesis Example 8

Synthesis of Compound 8

Under an argon gas atmosphere, to a solution composed of the compound 7 synthesized in Synthesis Example 7 (255 g, 0.526 mol) and N,N-dimethylformamide (10 L) was added sodium hydrosulfite (3218 g) and water (1560 mL) at 90° C., and the mixture was stirred at 100° C. for 2 hours. After cooling down to room temperature, water (8 L) was added and the mixture was stirred for 2 hours, and the deposited solid was filtrated. To the resultant solid was added water (10 L) and the mixture was stirred to cause suspension of solid, and the solid was filtrated. Then, to the solid was added methanol (10 L), stirring was performed at a temperature of reflux of methanol, the solution was cooled down to room temperature, then, the deposited solid was filtrated, and dried under reduced pressure to obtain 211 g of the targeted compound 8 (yield: 82.4%).

$^1$H-NMR (299.4 MHz, CDCl$_3$): 1.27 (s, 18H), 2.48 (s, 3H), 5.96 (br, 2H), 6.56 (d, 4H), 7.16 (d, 2H), 7.29(m, 1H), 7.40 (m, 2H), 8.01 (s, 1H), 8.16 (d, 1H), 8.22 (m, 2H) LC-MS (ESI-MS (posi)): 485 [M−H]$^+$, 525 [M+K]$^+$

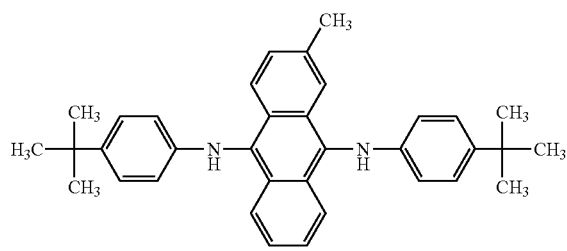

compound 8

Synthesis Example 9

Synthesis of Compound 9

Under an argon gas atmosphere, the compound 8 synthesized in Synthesis Example 8 (200 g, 0.41 mol), [tris(dibenzylideneacetone)]dipalladium (14.48 g), 1,1'-bis(diphenylphosphino)ferrocene (13.28 g), bromobenzene (142 g, 0.90 mol), sodium t-butoxide (118.4 g, 1.23 mol) and toluene (9 L) were stirred for 80 minutes at a temperature of reflux of toluene. Then, the solution was filtrated at 80° C. through a filtration apparatus with celite and silica gel laid thereon, and the resultant filtrate was passed through a column filled with silica gel and concentrated to dryness. Then, methanol (2 L) was added and the mixture was stirred, and the resultant solid was filtrated. Then, the solid was dissolved in toluene, methanol was added to this, and the resultant solid was filtrated and dried under reduced pressure to obtain 142.5 g of the targeted compound 9 (yield: 54.3%).

$^1$H-NMR (299.4 MHz, CDCl$_3$): 1.27 (s, 18H), 2.35 (s, 3H), 6.86 (m, 2H), 7.08 (m, 8H), 7.19 (m, 9H), 7.32 (m, 2H), 7.94 (s, 1H), 8.09 (d, 1H), 8.16 (m, 2H)

LC-MS (APCI-MS (posi)): 639 [M+H]$^+$

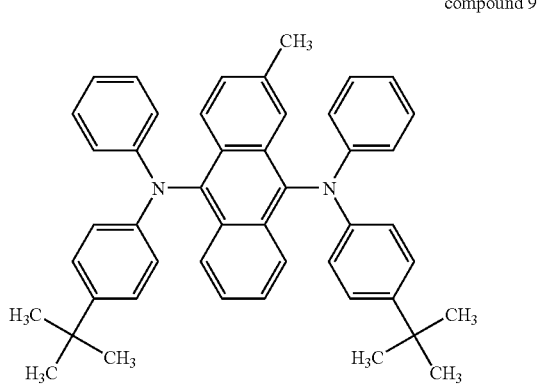 [SMILES: Cc1ccc2c(N(c3ccccc3)c3ccc(C(C)(C)C)cc3)c3ccccc3c(N(c3ccccc3)c3ccc(C(C)(C)C)cc3)c2c1]

compound 9

Synthesis Example 10

Synthesis of Compound 10

To a solution composed of the compound 9 synthesized in Synthesis Example 9 (8.96 g, 14.0 mmol) and chloroform (400 mL) was added at room temperature N-bromosuccinimide (4.99 g, 28.0 mmol), and the mixture was stirred at the same temperature for 3 hours. Then, water was added and the mixture was stirred, and an organic layer and an aqueous layer were separated. To the resultant organic layer was added anhydrous sodium sulfate and the mixture was stirred, then, filtration was performed. The resultant filtrate was concentrated until its volume reached 100 mL, methanol (200 mL) was dropped and the deposited crystal was filtrated, and dried under reduced pressure to obtain a solid. The solid was re-crystallized using chloroform and methanol, to obtain 9.78 g of the targeted compound 10 (yield: 87.5%).

$^1$H-NMR (299.4 MHz, CDCl$_3$): 1.27 (s, 18H), 2.37 (s, 3H), 6.89 (m, 4H), 7.06 (m, 4H), 7.28 (m, 11H), 7.88 (s, 1H), 8.03 (d, 1H), 8.11 (m, 1H)

LC-MS (APCI-MS (posi)): 795 [M+H]$^+$ compound 10

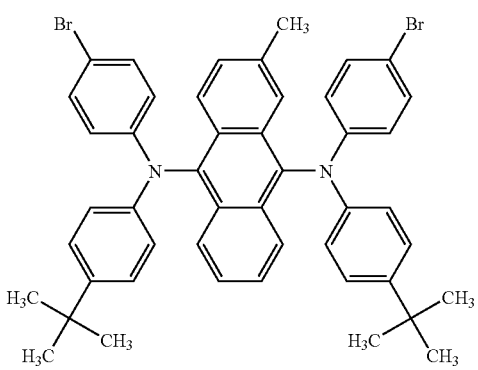

Synthesis Example 11

Synthesis of Polymer Compound 3

Under an inert atmosphere, the above-described compound 6 (5.20 g), a compound 11 of the following formula (5.42 g):

compound 11

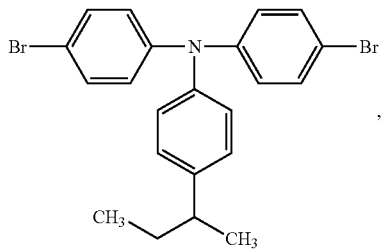

, palladium acetate (2.2 mg), tris(2-methylphenyl)phosphine (15.1 mg), Aliquat 336 (0.91 g) and toluene (70 ml) were mixed and heated at 105° C. Into this reaction solution, a 2 M sodium carbonate aqueous solution (19 ml) was dropped and the solution was refluxed for 4 hours. After the reaction, phenylboronic acid (121 mg) was added, and the solution was further refluxed for 3 hours. Then, a sodium diethyldithiacarbamate aqueous solution was added and the mixture was stirred at 80° C. for 2 hours. After cooling, the resultant reaction liquid was washed with water (60 ml) three times, 3 wt % acetic acid aqueous solution (60 ml) four times and water (60 ml) three times, and the resultant toluene solution was purified by passing through an alumina column and a silica gel column. The resultant toluene solution was dropped into methanol (3 L) and the mixture was stirred, then, the resultant precipitate was filtrated, and dried. The yield of this precipitate (hereinafter, referred to as "polymer compound 3") was 5.25 g.

The polymer compound 3 had a polystyrene-equivalent number average molecular weight of $1.2 \times 10^5$ and a polystyrene-equivalent weight average molecular weight of $2.6 \times 10^5$.

The polymer compound 3 is an alternating copolymer constituted of a repeating unit of the following formula:

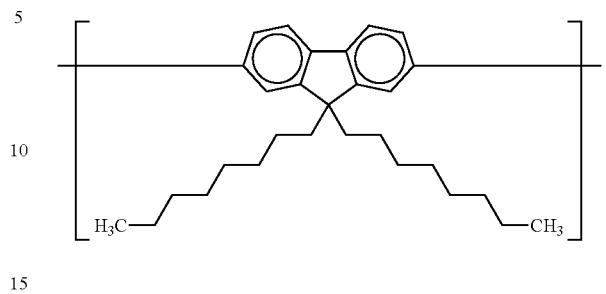

and a repeating unit of the following formula:

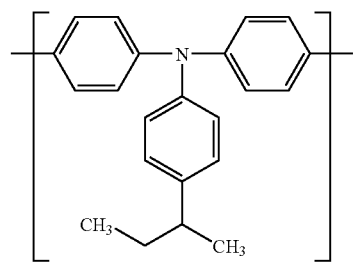

at a molar ratio of 50:50 according to theoretical values calculated from charged raw materials.

Comparative Example 3

Synthesis of Polymer Compound 4

Under an inert atmosphere, a compound 2 (0.12 g, 0.15 mmol) of the following formula:

compound 2

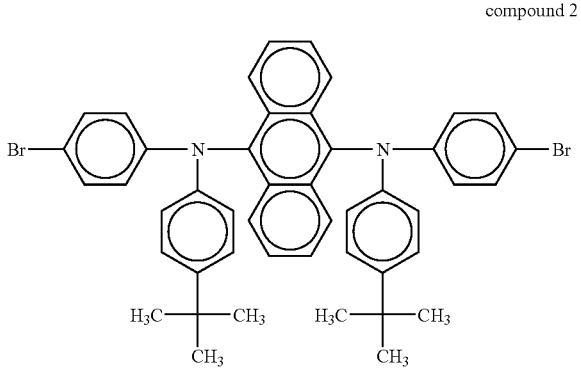

a compound 5 (1.15 g, 2.10 mmol) of the following formula:

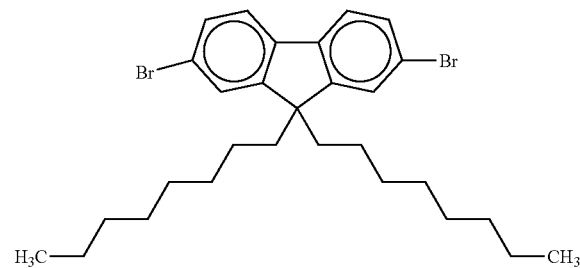

compound 5 a compound 12 (0.12 g, 0.25 mmol) of the following formula:

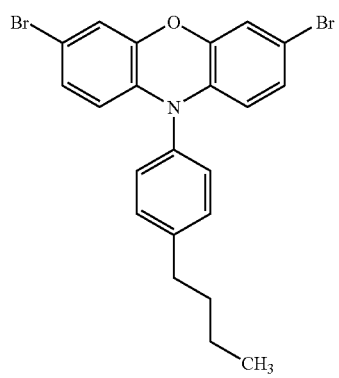

compound 12 a compound 6 (1.32 g, 2.49 mmol) of the following formula:

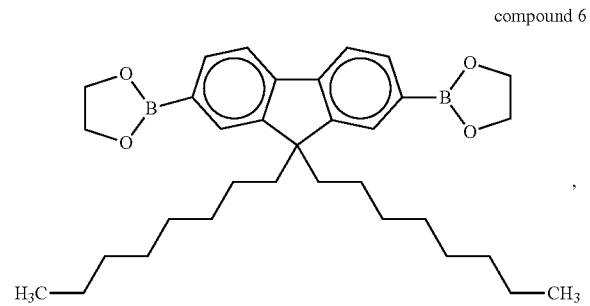

compound 6 palladium acetate (1.7 mg), tris(2-methoxyphenyl)phosphine (18.5 mg), trioctylmethylammonium chloride (trade name: Aliquat 336 (manufactured by Aldrich), 0.32 g) and toluene (38 ml) were mixed and heated at 105° C. Into this reaction solution, a 2 M $Na_2CO_3$ aqueous solution (6.8 ml) was dropped, and the mixture was refluxed for 50 minutes. After the reaction, phenylboronic acid (31 mg) was added and the mixture was further refluxed for 2 hours. Then, a sodium diethyldithiacarbamate aqueous solution was added and the mixture was stirred at 80° C. for 2 hours. After cooling, the reaction liquid was washed with water (33 ml) twice, 3 wt % acetic acid aqueous solution (33 ml) twice and water (33 ml) twice, and the resultant solution was dropped into methanol (388 mL) and filtrated, to obtain a precipitate. The precipitate was dissolved in toluene (78 mL), and purified by passing through an alumina column and a silica gel column. The resultant toluene solution was dropped into methanol (388 ml) and the mixture was stirred, then, the resultant precipitate was filtrated and dried. The yield of the resultant polymer compound 4 was 1.51 g. The polymer compound 4 had a polystyrene-equivalent number average molecular weight of $1.2 \times 10^5$ and a polystyrene-equivalent weight average molecular weight of $2.8 \times 10^5$.

The polymer compound 4 is a random copolymer constituted of a constitutional unit of the following formula:

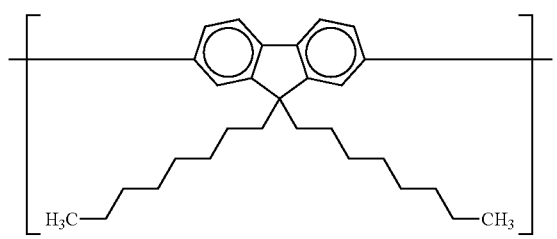

a constitutional unit of the following formula:

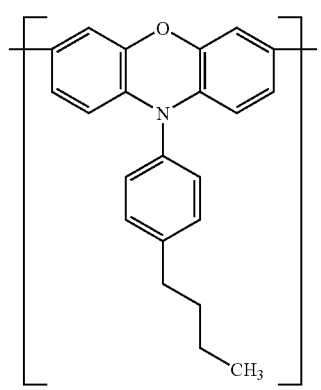

and a constitutional unit of the following formula:

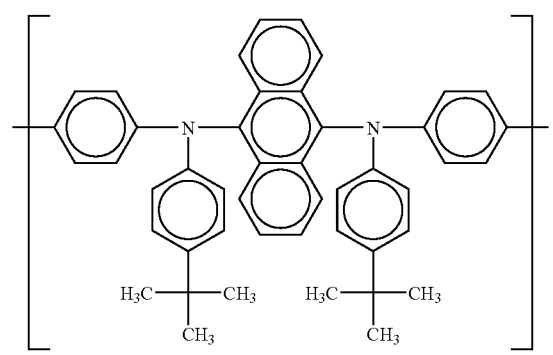

at a molar ratio of 92:5:3 according to theoretical values calculated from charged raw materials.

Example 3

Synthesis of Polymer Compound 5

Under an inert atmosphere, a compound 10 (0.12 g, 0.15 mmol) of the following formula:

compound 10

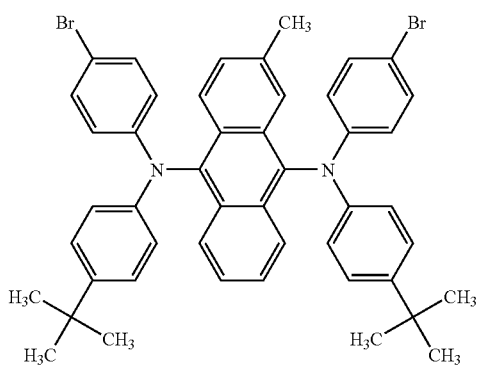

a compound 5 (1.15 g, 2.10 mmol) of the following formula:

compound 5

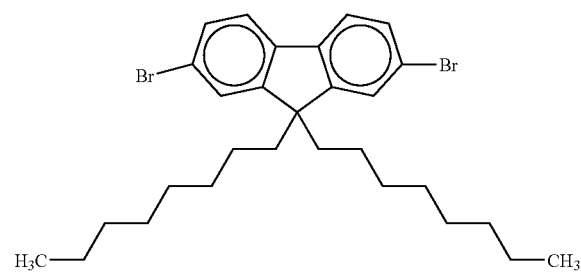

a compound 12 (0.12 g, 0.25 mmol) of the following formula:

compound 12

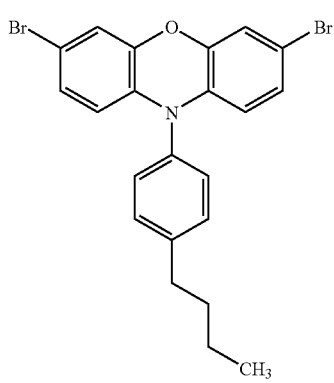

a compound 6 (1.32 g, 2.49 mmol) of the following formula:

compound 6

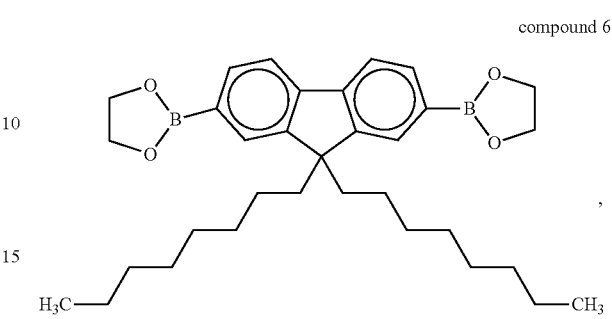

palladium acetate (1.7 mg), tris(2-methoxyphenyl)phosphine (18.5 mg), trioctylmethylammonium chloride (trade name: Aliquat 336 (manufactured by Aldrich), 0.32 g) and toluene (38 ml) were mixed and heated at 105° C. Into this reaction solution, a 2 M $Na_2CO_3$ aqueous solution (6.8 ml) was dropped, and the mixture was refluxed for 70 minutes. After the reaction, phenylboronic acid (31 mg) was added and the mixture was further refluxed for 2 hours. Then, a sodium diethyldithiacarbamate aqueous solution was added and the mixture was stirred at 80° C. for 2 hours. After cooling, the reaction liquid was washed with water (33 ml) twice, 3 wt % acetic acid aqueous solution (33 ml) twice and water (33 ml) twice, and the resultant solution was dropped into methanol (388 mL) and filtrated, to obtain a precipitate. The precipitate was dissolved in toluene (78 mL), and purified by passing through an alumina column and a silica gel column. The resultant toluene solution was dropped into methanol (388 ml) and the mixture was stirred, then, the resultant precipitate was filtrated and dried. The yield of the resultant polymer compound 5 was 1.64 g. The polymer compound 5 had a polystyrene-equivalent number average molecular weight of $1.2 \times 10^5$ and a polystyrene-equivalent weight average molecular weight of $3.0 \times 10^5$.

The polymer compound 5 is a random copolymer constituted of a constitutional unit of the following formula:

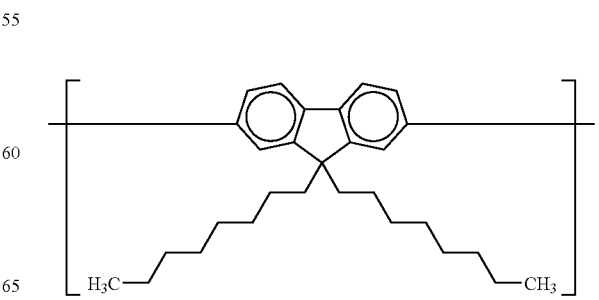

a constitutional unit of the following formula:

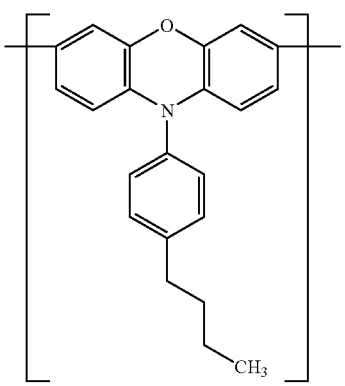

and a constitutional unit of the following formula:

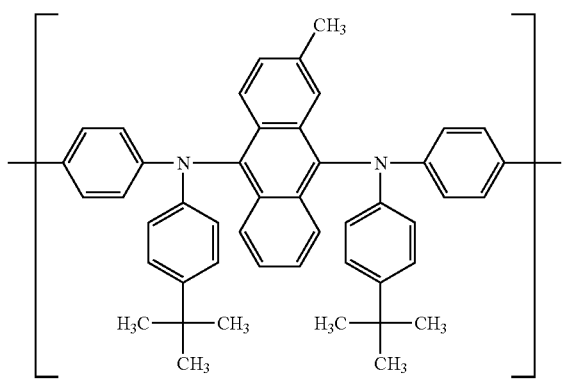

at a molar ratio of 92:5:3 according to theoretical values calculated from charged raw material.

Comparative Example 4

A 0.8 wt % xylene solution of the polymer compound 3 was prepared. Then, a 1.3 wt % xylene solution of the polymer compound 4 was prepared. On a glass substrate carrying thereon an ITO film with a thickness of 150 nm formed by a sputtering method, a solution of poly(3,4-ethylenedioxythiophene)/polystyrenesulfonic acid (manufactured by Bayer, Baytron P) was spin-coated to form a film with a thickness of 65 nm which was then dried on a hot plate at 200° C. for 10 minutes. Next, the xylene solution of the polymer compound 3 prepared above was spin-coated at a revolution of 3000 rpm to form a film, and this was dried on a hot plate at 180° C. for 60 minutes under a nitrogen gas atmosphere. The thickness was about 20 nm. Then, the xylene solution of the polymer compound 4 prepared above was spin-coated at a revolution of 1300 rpm to form a film. The thickness was about 100 nm. This was dried on a hot plate at 130° C. for 10 minutes under a nitrogen gas atmosphere, then, as a cathode, barium was vapor-deposited with a thickness of about 4 nm, then, aluminum was vapor-deposited with a thickness of about 80 nm, to fabricate an EL device. After the degree of vacuum reached $1\times10^{-4}$ Pa or lower, metal vapor deposition was initiated. Voltage was applied to the resultant device to obtain green EL light emission. The maximum luminance was as high as about 20000 cd/m$^2$ or more. The chromaticity coordinate C.I.E 1931 at a luminance of 10000 cd/m$^2$ was (x,y)=(0.32, 0.62).

Example 4

A 1.3 wt % xylene solution was prepared using the polymer compound 5 instead of the polymer compound 4 described in Comparative Example 4, and this was used to fabricate an organic electroluminescence device in the same manner as in Comparative Example 4. A light emitting layer was formed by spin coat at a revolution of 1300 rpm. Voltage was applied to the resultant device to obtain green EL light emission. The maximum luminance was as high as about 20000 cd/m$^2$ or more. The chromaticity coordinate C.I.E 1931 at a luminance of 10000 cd/m$^2$ was (x,y)=(0.30, 0.62).

While the distance A showing the deviance from the value of chromaticity coordinate C.I.E 1931 of EL light emission from the device in Comparative Example 4 and the targeted chromaticity coordinate (0.20, 0.70) was 0.144, the distance A for EL light emission from the device in Example 4 was 0.128.

The distance A in Example 4 decreased by 7% as compared with the distance A in Comparative Example 4.

Since the green purity is higher when the chromaticity coordinate is nearer to (0.20, 0.70) according to the NTSC standard, it was found that EL light emission from the device in Example 4 using a polymer compound of the present invention shows higher color purity as compared with EL light emission from the device in Comparative Example 4 using a polymer compound not included in the range of the present invention.

<Experimental Results>

TABLE 2

| | Polymer compound | Value of chromaticity coordinate C.I.E. 1931 of EL light emission: (x, y) | Difference from (0.20, 0.70) of EL light emission | | Distance A |
|---|---|---|---|---|---|
| | | | x | y | |
| Comparative Example 4 | 4 | (0.32, 0.62) | 0.12 | 0.08 | 0.144 |
| Example 4 | 5 | (0.30, 0.62) | 0.10 | 0.08 | 0.128 |

Distance A = $\{(x - 0.20)^2 + (y - 0.70)^2\}^{0.5}$ formula (RT)

Industrial Applicability

The polymer compound of the present invention shows excellent color purity of green light emission of a light emitting device obtained when used for fabrication of a light emitting device, and is useful, for example, as an electronic part material such as light emitting materials, charge transporting materials and the like. Therefore, the polymer compound and light emitting device of the present invention are useful for back light of liquid crystal displays, light sources in the form of curved surface and flat surface for illumination, segment type displays, dot matrix type flat panel displays, and the like.

The invention claimed is:

1. A polymer compound comprising a constitutional unit of the following formula (1):

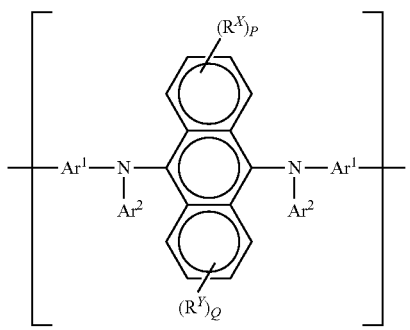

(1)

wherein, P represents an integer of 1 to 4, Q represents an integer of 0 to 4; $R^X$ and $R^Y$ represent each independently an alkyl group, alkoxy group, alkylthio group, aryloxy group, arylthio group, arylalkyl group, arylalkoxy group or arylalkylthio group, when there exist a plurality of $R^X$'s, these may be the same or different, and when there exist a plurality of $R^Y$'s, these may be the same or different; $Ar^1$ represents an unsubstituted or substituted arylene group or an unsubstituted or substituted divalent heterocyclic group, and $Ar^2$ represents an unsubstituted or substituted aryl group or an unsubstituted or substituted mono-valent heterocyclic group; and a plurality of $Ar^1$'s and $Ar^2$'s may each be the same or different.

2. The polymer compound according to claim claim 1, further comprising at least one selected from the group consisting of a constitutional unit of the following formula (2), a constitutional unit of the following formula (3) and a constitutional unit of the following formula (4):

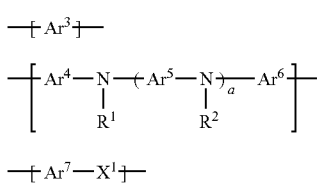

wherein, $Ar^3$ and $Ar^7$ represent each independently an unsubstituted or substituted arylene group, an unsubstituted or substituted divalent heterocyclic group or a divalent group having a metal complex structure; $Ar^4$, $Ar^5$ and $Ar^6$ represent each independently an unsubstituted or substituted arylene group, an unsubstituted or substituted di-valent aromatic heterocyclic group or an unsubstituted or substituted divalent group having two aromatic rings connected via a single bond; $R^1$ and $R^2$ represent each independently a hydrogen atom, alkyl group, aryl group, monovalent heterocyclic group or arylalkyl group; $X^1$ represents —$CR^3$=$CR^4$— or —C≡C—; here $R^3$ and $R^4$ represent each independently a hydrogen atom, alkyl group, aryl group, monovalent heterocyclic group, carboxyl group, substituted carboxyl group or cyano group; and a represents 0 or 1.

3. The polymer compound according to claim 2, wherein $Ar^3$ and $Ar^7$ represent each independently an unsubstituted or substituted phenylene group, an unsubstituted or substituted naphthalenediyl group, an unsubstituted or substituted anthracenediyl group, an unsubstituted or substituted phenanthrenediyl group, an unsubstituted or substituted naphthacenediyl group, an unsubstituted or substituted fluorenediyl group, an unsubstituted or substituted pyrenediyl group, an unsubstituted or substituted perylenediyl group, an unsubstituted or substituted pyridinediyl group, an unsubstituted or substituted thiophenediyl group, an unsubstituted or substituted furanediyl group, an unsubstituted or substituted quinolinediyl group, an unsubstituted or substituted isoquinolinediyl group, an unsubstituted or substituted quinoxalinediyl group, an unsubstituted or substituted benzo[1,2,5]thiadiazolediyl group, an unsubstituted or substituted benzothiazolediyl group, an unsubstituted or substituted carbazolediyl group, an unsubstituted or substituted phenoxazinediyl group, an unsubstituted or substituted phenothiazinediyl group or an unsubstituted or substituted dibenzosilolediyl group.

4. The polymer compound according to claim 3, wherein $Ar^3$ and $Ar^7$ represent each independently an unsubstituted or substituted phenylene group, an unsubstituted or substituted fluorenediyl group, an unsubstituted or substituted benzo[1,2,5]thiadiazolediyl group, an unsubstituted or substituted phenoxazinediyl group or an unsubstituted or substituted phenothiazinediyl group.

5. The polymer compound according to claim claim 4, wherein $Ar^3$ and $Ar^7$ represent each independently a divalent group of the following formula (6), (7), (8), (9) or (10):

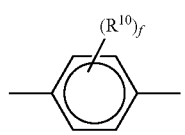

(6)

wherein, $R^{10}$ represents an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group or cyano group; f represents an integer of 0 to 4; when there exist a plurality of $R^{10}$'s, these may be mutually the same or different;

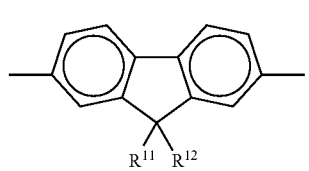

(7)

wherein, $R^{11}$ and $R^{12}$ represent each independently a hydrogen atom, alkyl group, aryl group, arylalkyl group or monovalent heterocyclic group;

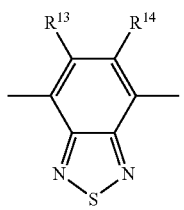

(8)

wherein, $R^{13}$ and $R^{14}$ represent each independently a hydrogen atom, alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group, nitro group or cyano group;

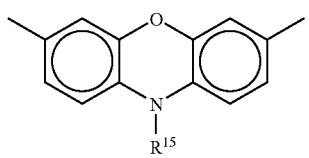

(9)

wherein, $R^{15}$ represents a hydrogen atom, alkyl group, aryl group, mono-valent heterocyclic group or arylalkyl group; and

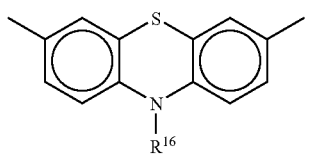

(10)

wherein, $R^{16}$ represents a hydrogen atom, alkyl group, aryl group, monovalent heterocyclic group or arylalkyl group.

6. The polymer compound according to claim 2, wherein a total mole number of said constitutional unit of the formula (1), said constitutional unit of the formula (2), said constitutional unit of the formula (3) and said constitutional unit of the formula (4) with respect to a total mole number of all constitutional units is 90 to 100%.

7. The polymer compound according to claim 2, wherein a total mole number of said constitutional unit of the formula (1), said constitutional unit of the formula (2) and said constitutional unit of the formula (3) with respect to a total mole number of all constitutional units is 90 to 100%.

8. The polymer compound according to claim 2, wherein a total mole number of said constitutional unit of the formula (1), said constitutional unit of the formula (2) and said constitutional unit of the formula (3) with respect to a total mole number of all constitutional units is 95 to 100%.

9. The polymer compound according to claim 1, wherein at least one of $Ar^1$'s is an unsubstituted or substituted arylene group.

10. The polymer compound according to claim claim 9, wherein the unsubstituted or substituted arylene group represented by $Ar^1$ is an unsubstituted or substituted phenylene group.

11. The polymer compound according to claim 1, wherein at least one of $Ar^2$'s is an unsubstituted or substituted aryl group.

12. The polymer compound according to claim 11, wherein the unsubstituted or substituted aryl group represented by $Ar^2$ is an unsubstituted or substituted phenyl group.

13. The polymer compound according to claim 1, wherein P is 1.

14. The polymer compound according to claim 1, wherein Q is 0 or 1.

15. The polymer compound according to claim 14, wherein said constitutional unit of the formula (1) is a constitutional unit of the following formula (1A):

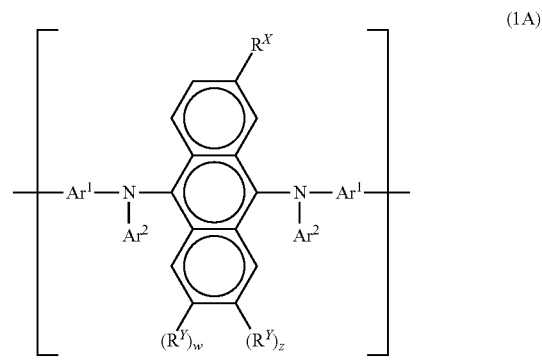

(1A)

wherein, $Ar^1$, $Ar^2$, $R^X$ and $R^Y$ represent the same meanings as described above; w represents 0 or 1, z represents 0 or 1, and w+z is 0 or 1; and a plurality of $Ar^1$'s and $Ar^2$'s may each be the same or different.

16. The polymer compound according to claim 15, wherein said constitutional unit of the formula (1A) is a constitutional unit of the following formula (1B):

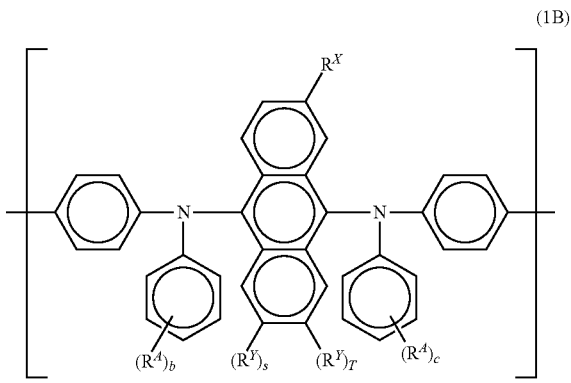

(1B)

wherein, $R^X$ and $R^Y$ are as described above; $R^A$ represents an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group, nitro group or cyano group; S represents 0 or 1, T represents 0 or 1, and S+T is 0 or 1; b and c represent each independently an integer of 0 to 5; and when there exist a plurality of $R^A$'s, these may be mutually the same or different.

17. The polymer compound according to claim 16, wherein S is 1.

18. The polymer compound according to claim 16, wherein S is 0 and T is 0.

19. The polymer compound according to claim 16, wherein said constitutional unit of the formula (1B) is a constitutional unit of the following formula (1C):

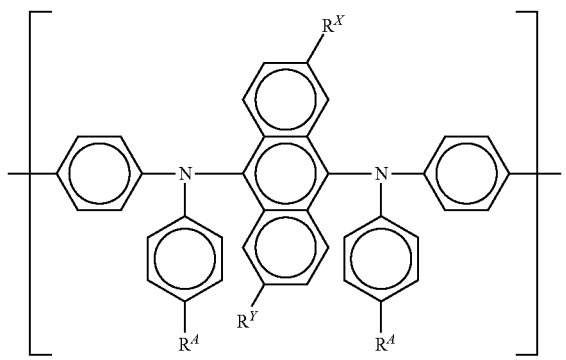

(1C)

wherein, $R^X$, $R^Y$ and $R^A$ represent the same meanings as described above; two $R^A$'s may be the same or different.

20. The polymer compound according to claim 15, wherein w is 1.

21. The polymer compound according to claim claim 1, wherein $R^X$ is an alkyl group.

22. The polymer compound according to claim claim 1, wherein $R^Y$ is an alkyl group.

23. The polymer compound according to claim 2, wherein $Ar^4$ and $Ar^6$ represent each independently an unsubstituted or substituted arylene group.

24. The polymer compound according to claim 2, wherein $Ar^5$ represents an unsubstituted or substituted 1,3-phenylene group, an unsubstituted or substituted 1,4-phenylene group, an unsubstituted or substituted 1,4-naphthalenediyl group, an unsubstituted or substituted 2,7-fluorenediyl group, an unsubstituted or substituted 2,5-pyridinediyl group, an unsubstituted or substituted 1,4-isoquinolinediyl group, an unsubstituted or substituted 4,7-benzo[1,2,5]thiadiazolediyl group, an unsubstituted or substituted 3,7-phenoxazinediyl group, an unsubstituted or substituted group of the following formula (3A-1):

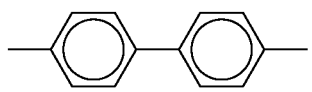

(3A-1)

or an unsubstituted or substituted group of the following formula (3A-4):

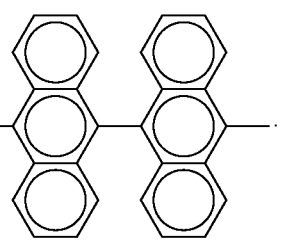

(3A-4)

25. A composition comprising the polymer compound as described in claim 1 and at least one material selected from the group consisting of hole transporting materials, electron transporting materials and light emitting materials.

26. A solution comprising the polymer compound as described in claim 1, and a solvent.

27. A thin film comprising the polymer compound as described in claim 1.

28. A light emitting device having electrodes composed of an anode and a cathode, and an organic layer disposed between the electrodes and containing the polymer compound as described in claim 1.

* * * * *